(12) United States Patent
Islam

(10) Patent No.: US 9,077,146 B2
(45) Date of Patent: *Jul. 7, 2015

(54) BROADBAND OR MID-INFRARED FIBER LIGHT SOURCES

(71) Applicant: OMNI MEDSCI, INC., Ann Arbor, MI (US)

(72) Inventor: Mohammed N. Islam, Ann Arbor, MI (US)

(73) Assignee: Omni Medsci, Inc., Ann Arbor, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 14/186,171

(22) Filed: Feb. 21, 2014

(65) Prior Publication Data

US 2015/0008344 A1  Jan. 8, 2015

Related U.S. Application Data

(63) Continuation of application No. 14/186,171, filed on Feb. 21, 2014, which is a continuation of application No. 14/071,983, filed on Nov. 5, 2013, now Pat. No. 8,971,681, which is a continuation of application No. 13/750,556, filed on Jan. 25, 2013, now Pat. No. 8,670,642, which is a continuation of application No. 13/241,900, filed on Sep. 23, 2011, now Pat. No. 8,391,660, which is a continuation of application No. 12/366,323, filed on Feb. 5, 2009, now Pat. No. 8,055,108, which is a continuation of application No. 11/599,950, filed on Nov. 15, 2006, now Pat. No. 7,519,253.

(60) Provisional application No. 60/738,389, filed on Nov. 18, 2005.

(51) Int. Cl.

| | | |
|---|---|---|
| *G02B 6/00* | (2006.01) | |
| *H01S 5/10* | (2006.01) | |
| *H01S 3/30* | (2006.01) | |
| *G01J 3/10* | (2006.01) | |
| *G01B 9/02* | (2006.01) | |
| *G01J 3/02* | (2006.01) | |
| *H01S 5/00* | (2006.01) | |
| *H01S 5/14* | (2006.01) | |
| *G02F 1/35* | (2006.01) | |
| *H01S 3/067* | (2006.01) | |
| *H01S 3/094* | (2006.01) | |
| *H01S 3/102* | (2006.01) | |

(52) U.S. Cl.

CPC ....... *H01S 5/1092* (2013.01); *G02F 2001/3528* (2013.01); *H01S 3/06725* (2013.01); *H01S 3/06754* (2013.01); *H01S 3/094069* (2013.01); *H01S 3/094076* (2013.01); *H01S 3/1024* (2013.01); *H01S 3/302* (2013.01); *H01S 2301/085* (2013.01); *G01J 3/108* (2013.01); *G01B 9/02091* (2013.01); *G01J 3/0218* (2013.01); *H01S 5/0085* (2013.01); *H01S 5/146* (2013.01)

(58) Field of Classification Search
None
See application file for complete search history.

(56) References Cited

U.S. PATENT DOCUMENTS

| | | |
|---|---|---|
| 4,063,106 A | 12/1977 | Ashkin et al. |
| 4,158,750 A | 6/1979 | Sakoe et al. |
| 4,221,997 A | 9/1980 | Flemming |
| 4,275,266 A | 6/1981 | Lasar |
| 4,374,618 A | 2/1983 | Howard |
| 4,403,605 A | 9/1983 | Tanikawa |
| 4,462,080 A | 7/1984 | Johnstone et al. |
| 4,516,207 A | 5/1985 | Moriyama et al. |
| 4,523,884 A | 6/1985 | Clement et al. |
| 4,605,080 A | 8/1986 | Lemelson |
| 4,641,292 A | 2/1987 | Tunnell et al. |
| 4,704,696 A | 11/1987 | Reimer et al. |
| 4,728,974 A | 3/1988 | Nio et al. |
| 4,762,455 A | 8/1988 | Coughlan et al. |

(Continued)

FOREIGN PATENT DOCUMENTS

| | | |
|---|---|---|
| EP | 1148662 A2 | 10/2001 |
| EP | 1378789 A2 | 1/2004 |

(Continued)

OTHER PUBLICATIONS

Sun, Y., C.F. Booker, S. Kumari, R.N. Day, M. Davidson, A. Periasamy, "Characterization of an orange acceptor fluorescent protein for sensitized spectral fluorescence resonant energy transfer microscopy using a white-light laser," Journal of Biomedical Optics, vol. 14, No. 5, paper 054009 (2009).

Borlinghaus, R., "Colours Count: how the challenge of fluorescence was solved in confocal microscopy," in Modern Research and Educational Topics in Microscopy, A. Mendez-Vilas and J. Diaz, eds, pp. 890-899, Formatex (2007).

(Continued)

*Primary Examiner* — Sung Pak
(74) *Attorney, Agent, or Firm* — Brooks Kushman P.C.

(57) ABSTRACT

An optical system for use in material processing includes a plurality of semiconductor diodes coupled to a beam combiner to generate a multiplexed optical beam. A cladding pumped fiber amplifier or laser receives the multiplexed optical beam and forms an intermediate beam having at least a first wavelength. An optical element receives the intermediate beam and forms an output beam with an output beam wavelength, wherein the output beam wavelength is at least in part longer than the first wavelength. A subsystem includes lenses or mirrors to deliver a delivered portion of the output beam to a sample. The delivered output beam has a temporal duration greater than about 30 picoseconds, a repetition rate between continuous wave and Megahertz or higher, and a time averaged intensity of less than approximately 50 MW/cm$^2$. The output beam has a time averaged output power of 20 mW or more.

20 Claims, 14 Drawing Sheets

(56) References Cited

U.S. PATENT DOCUMENTS

| | | |
|---|---|---|
| 4,776,016 A | 10/1988 | Hansen |
| 4,958,910 A | 9/1990 | Taylor et al. |
| 4,989,253 A | 1/1991 | Liang et al. |
| 5,078,140 A | 1/1992 | Kwoh |
| 5,084,880 A | 1/1992 | Esterowitz et al. |
| 5,086,401 A | 2/1992 | Glassman et al. |
| 5,104,392 A | 4/1992 | Kittrell et al. |
| 5,134,620 A | 7/1992 | Huber |
| 5,142,930 A | 9/1992 | Allen et al. |
| 5,180,378 A | 1/1993 | Kung et al. |
| 5,191,628 A | 3/1993 | Byron |
| 5,218,655 A | 6/1993 | Mizrahi |
| 5,230,023 A | 7/1993 | Nakano |
| 5,267,256 A | 11/1993 | Saruwatari et al. |
| 5,267,323 A | 11/1993 | Kimura |
| 5,300,097 A | 4/1994 | Lerner et al. |
| 5,303,148 A | 4/1994 | Mattson et al. |
| 5,305,427 A | 4/1994 | Nagata |
| 5,313,306 A | 5/1994 | Kuban et al. |
| 5,323,404 A | 6/1994 | Grubb |
| 5,345,538 A | 9/1994 | Narayannan et al. |
| 5,400,165 A | 3/1995 | Gnauck et al. |
| 5,408,409 A | 4/1995 | Glassman et al. |
| 5,409,482 A | 4/1995 | Diamantopoulos |
| 5,433,739 A | 7/1995 | Sluijter et al. |
| 5,544,654 A | 8/1996 | Murphy et al. |
| 5,571,147 A | 11/1996 | Sluijter et al. |
| 5,572,999 A | 11/1996 | Funda et al. |
| 5,631,758 A | 5/1997 | Knox et al. |
| 5,695,493 A | 12/1997 | Nakajima et al. |
| 5,696,778 A | 12/1997 | MacPherson |
| 5,747,806 A | 5/1998 | Khalil |
| 5,792,204 A | 8/1998 | Snell |
| 5,812,978 A | 9/1998 | Nolan |
| 5,820,626 A | 10/1998 | Baumgardner |
| 5,867,305 A | 2/1999 | Waarts et al. |
| 5,912,749 A | 6/1999 | Harstead et al. |
| 5,950,629 A | 9/1999 | Taylor et al. |
| 5,951,543 A | 9/1999 | Brauer |
| 5,970,457 A | 10/1999 | Brant et al. |
| 5,976,123 A | 11/1999 | Baumgardner |
| 6,014,249 A | 1/2000 | Fermann et al. |
| 6,043,927 A | 3/2000 | Islam |
| 6,095,982 A | 8/2000 | Richards-Korturn et al. |
| 6,115,673 A | 9/2000 | Malin |
| 6,185,535 B1 | 2/2001 | Hedin et al. |
| 6,200,309 B1 | 3/2001 | Rice et al. |
| 6,224,542 B1 | 5/2001 | Chang et al. |
| 6,246,707 B1 | 6/2001 | Yin et al. |
| 6,273,858 B1 | 8/2001 | Fox et al. |
| 6,278,975 B1 | 8/2001 | Brant et al. |
| 6,301,273 B1 | 10/2001 | Sanders et al. |
| 6,333,803 B1 | 12/2001 | Kurotori et al. |
| 6,337,462 B1 | 1/2002 | Smart |
| 6,340,806 B1 | 1/2002 | Smart et al. |
| 6,350,261 B1 | 2/2002 | Domankevitz et al. |
| 6,374,006 B1 | 4/2002 | Islam et al. |
| 6,381,391 B1 | 4/2002 | Islam et al. |
| 6,398,777 B1 | 6/2002 | Navarro et al. |
| 6,407,853 B1 | 6/2002 | Samson et al. |
| 6,413,253 B1 | 7/2002 | Koop et al. |
| 6,436,107 B1 | 8/2002 | Wang et al. |
| 6,442,430 B1 | 8/2002 | Ferek-Petric |
| 6,450,172 B1 | 9/2002 | Hartlaub et al. |
| 6,451,007 B1 | 9/2002 | Koop et al. |
| 6,453,201 B1 | 9/2002 | Daum et al. |
| 6,458,120 B1 | 10/2002 | Shen et al. |
| 6,462,500 B1 | 10/2002 | L'Hegarat et al. |
| 6,463,361 B1 | 10/2002 | Wang et al. |
| 6,470,205 B2 | 10/2002 | Bosselmann et al. |
| 6,480,656 B1 | 11/2002 | Islam et al. |
| 6,512,936 B1 | 1/2003 | Monfre |
| 6,543,012 B1 | 4/2003 | Viswanathan |
| 6,549,702 B2 | 4/2003 | Islam et al. |
| 6,567,431 B2 | 5/2003 | Tabirian et al. |
| 6,587,702 B1 | 7/2003 | Ruchti |
| 6,603,910 B2 | 8/2003 | Islam et al. |
| 6,605,080 B1 | 8/2003 | Altshuler et al. |
| 6,611,643 B2 | 8/2003 | Birk |
| 6,625,180 B2 | 9/2003 | Bufetov et al. |
| 6,631,025 B2 | 10/2003 | Islam et al. |
| 6,640,117 B2 | 10/2003 | Makarewicz |
| 6,658,189 B2 | 12/2003 | Ajima |
| 6,659,999 B1 | 12/2003 | Anderson et al. |
| 6,710,918 B2 | 3/2004 | Birk |
| 6,738,652 B2 | 5/2004 | Mattu |
| 6,760,148 B2 | 7/2004 | Islam |
| 6,773,922 B2 | 8/2004 | Jeng |
| 6,775,447 B2 | 8/2004 | Nicholson |
| 6,788,965 B2 | 9/2004 | Ruchti |
| 6,796,699 B2 | 9/2004 | Birk |
| 6,813,423 B2 | 11/2004 | Goto |
| 6,816,241 B2 | 11/2004 | Grubisic |
| 6,864,978 B1 | 3/2005 | Hazen |
| 6,885,498 B2 | 4/2005 | Islam |
| 6,885,683 B2 | 4/2005 | Fermann et al. |
| 6,898,367 B2 | 5/2005 | Birk |
| 6,943,936 B2 | 9/2005 | Islam et al. |
| 6,958,858 B2 | 10/2005 | Engelhardt |
| 6,978,174 B2 | 12/2005 | Gelfand et al. |
| 6,986,764 B2 | 1/2006 | Davenport et al. |
| 6,990,364 B2 | 1/2006 | Ruchti |
| 6,991,927 B2 | 1/2006 | Mross et al. |
| 6,997,923 B2 | 2/2006 | Anderson et al. |
| 7,010,336 B2 | 3/2006 | Lorenz |
| 7,027,467 B2 | 4/2006 | Baev et al. |
| 7,060,061 B2 | 6/2006 | Altshuler et al. |
| 7,098,992 B2 | 8/2006 | Ohtsuki et al. |
| 7,110,645 B2 | 9/2006 | Birk |
| 7,122,029 B2 | 10/2006 | Koop et al. |
| 7,130,512 B2 | 10/2006 | Kuksenkov |
| 7,133,590 B2 | 11/2006 | Shaw |
| 7,133,710 B2 | 11/2006 | Acosta |
| 7,162,303 B2 | 1/2007 | Levin et al. |
| 7,167,300 B2 | 1/2007 | Fermann et al. |
| 7,209,657 B1 | 4/2007 | Islam |
| 7,217,265 B2 | 5/2007 | Hennings et al. |
| 7,233,816 B2 | 6/2007 | Blank |
| 7,259,906 B1 | 8/2007 | Islam |
| 7,263,288 B1 | 8/2007 | Islam |
| 7,299,080 B2 | 11/2007 | Acosta |
| 7,317,938 B2 | 1/2008 | Lorenz |
| 7,355,789 B2 | 4/2008 | Gugel |
| 7,395,158 B2 | 7/2008 | Monfre |
| 7,433,116 B1 | 10/2008 | Islam |
| 7,466,885 B2 | 12/2008 | Gugel |
| 7,519,253 B2 | 4/2009 | Islam |
| 7,519,406 B2 | 4/2009 | Blank |
| 7,617,005 B2 | 11/2009 | Demarais et al. |
| 7,620,451 B2 | 11/2009 | Demarais et al. |
| 7,620,674 B2 | 11/2009 | Ruchti |
| 7,633,673 B1 | 12/2009 | Islam |
| 7,647,115 B2 | 1/2010 | Demarais et al. |
| 7,653,438 B2 | 1/2010 | Deem et al. |
| 7,697,966 B2 | 4/2010 | Monfre |
| 7,717,948 B2 | 5/2010 | Demarais et al. |
| 7,756,583 B2 | 7/2010 | Demarais et al. |
| 7,787,503 B2 | 8/2010 | Wadsworth |
| 7,787,924 B2 | 8/2010 | Acosta |
| 7,800,818 B2 | 9/2010 | Mattsson |
| 7,807,718 B2 | 10/2010 | Hashim |
| 7,853,333 B2 | 12/2010 | Demarais |
| 7,873,417 B2 | 1/2011 | Demarais et al. |
| 7,937,143 B2 | 5/2011 | Demarais et al. |
| 8,000,574 B2 | 8/2011 | Buchter |
| 8,055,108 B2 | 11/2011 | Islam |
| 8,145,286 B2 | 3/2012 | Arai |
| 8,253,937 B2 | 8/2012 | Krishnamachari |
| 8,259,383 B2 | 9/2012 | Seyfried |
| 8,670,642 B2 * | 3/2014 | Islam .................. 385/122 |
| 2002/0032468 A1 | 3/2002 | Hill et al. |
| 2002/0082612 A1 | 6/2002 | Moll et al. |
| 2002/0128846 A1 | 9/2002 | Miller |
| 2002/0178003 A1 | 11/2002 | Gehrke et al. |

(56) References Cited

U.S. PATENT DOCUMENTS

| | | |
|---|---|---|
| 2003/0022126 A1 | 1/2003 | Buchalla |
| 2004/0174914 A1 | 9/2004 | Fukatsu |
| 2004/0240037 A1 | 12/2004 | Harter |
| 2005/0111500 A1 | 5/2005 | Harter et al. |
| 2005/0238070 A1 | 10/2005 | Imeshev et al. |
| 2006/0000988 A1 | 1/2006 | Stuart et al. |
| 2006/0002437 A1 | 1/2006 | Braun |
| 2006/0013270 A1 | 1/2006 | Yumoto et al. |
| 2006/0153254 A1 | 7/2006 | Franjic |
| 2006/0165359 A1 | 7/2006 | Mollmann |
| 2006/0223032 A1 | 10/2006 | Fried |
| 2006/0245461 A1 | 11/2006 | Islam |
| 2007/0020181 A1 | 1/2007 | Workman et al. |
| 2007/0078348 A1 | 4/2007 | Holman |
| 2007/0293849 A1 | 12/2007 | Hennings et al. |
| 2009/0062873 A1 | 3/2009 | Wu et al. |
| 2009/0076409 A1 | 3/2009 | Wu et al. |
| 2009/0204110 A1 | 8/2009 | Islam |
| 2009/0296743 A1 | 12/2009 | Islam |
| 2010/0069723 A1 | 3/2010 | Islam |
| 2010/0168731 A1 | 7/2010 | Wu et al. |
| 2010/0168739 A1 | 7/2010 | Wu et al. |
| 2010/0322490 A1 | 12/2010 | Pan |
| 2010/0331637 A1 | 12/2010 | Ting |
| 2011/0060324 A1 | 3/2011 | Wu et al. |
| 2011/0143364 A1 | 6/2011 | Kim |
| 2012/0013722 A1 | 1/2012 | Wong |

FOREIGN PATENT DOCUMENTS

| | | |
|---|---|---|
| WO | 9715240 A1 | 5/1997 |
| WO | 9749340 A1 | 12/1997 |
| WO | 0150959 A1 | 7/2001 |
| WO | 2004004569 A1 | 1/2004 |

OTHER PUBLICATIONS

Borlinghaus, R., "The White Confocal: Continuous Spectral Tuning in Excitation and Emission," in Optical Fluorescence Microscopy, A. Diaspro (Ed), Chapter 2, pp. 37-54, ISBN 978-3-642-15174-3, Springer-Verlag, Berlin (2011).

Borlinghaus, R.T., L. Kuschel, "White Light Laser: The Ultimate Source for Confocal Microscopy," http://www.leica-microsystems.com/science-lab/white-light-laser (Jun. 27, 2012).

Ziegler, U., A.G. Bittermann, M. Hoechli, "Introduction to Confocal Laser Scanning Microscopy (LEICA)," www.zmb.unizh.ch, May 29, 2013.

European Supplemental Search Report dated Oct. 9, 2013, for corresponding EP Application 06837744.9 filed Nov. 16, 2006.

Hamilton, James D., et al., "High Frequency Optoacoustic Arrays Using Etalon Detection", IEEE Transactions on Ultrasonics, Ferroelectrics, and Frequency Control, Jan. 2000, vol. 47, No. 1, pp. 160-169.

Ranka, Jinendra K., et al., "Visible continuum generation in air-silica microstructure optical fibers with anomalous dispersion at 800 nm", Optics Letters, Jan. 1, 2000, vol. 25, No. 1, pp. 25-27.

Boult, Maggi, et al., "Systematic Review of Percutaneous Endoscopic Laser Discectomy: Update and Re-appraisal", Australian Safety and Efficacy Register of New Interventional Procedures—Surgical Report No. 5, 49 pages, Feb. 2000.

Boult, Maggi, et al., Percutaneous Endoscopic Laser Discectomy, Systematic Review, Aust. N.Z.J. Surg., Apr. 7, 2000, vol. 70, pp. 475-479.

Camacho, Nancy P., et al., "FT/R Microscopic Imaging of Collagen and Proteoglycan in Bovine Cartilage," Biopolymers (Biospectroscopy), 2001, vol. 62, pp. 1-8.

Choi, Joon Y., et al., "Thermal, Mechanical Optical, and Morphologic Changes in Bovine Nucleus Pulposus Induced by Nd:YAG (A=1.32 pro) Laser Irradiation", Lasers in Surgery and Medicine, 2001, vol. 28, pp. 248-254.

Hafez, M. I., et al., "The Effect of Irrigation on Peak Temperatures in Nerve Root, Dura, and Intervertebral Disc During Laser-Assisted Foraminoplasty", Lasers in Surgery and Medicine, 2001, vol. 29, pp. 33-37.

Jackson, Stuart D., et al., "Theory and numerical simulation of nth-order cascaded Raman fiber lasers", J. Opt. Soc. Am. B, Sep. 2001, vol. 18, No. 9, pp. 1297-1306.

Werle, Peter, et al., "Near- and mid-infrared laser-optical sensors for gas analysis", Optics and Lasers in Engineering 37, 2002, pp. 101-114.

Beck, Mattias, et al., "Continuous Wave Operation ore Mid-Infrared Semiconductor Laser at Room Temperature," Science, Jan. 11, 2002, vol. 295, www.sciencemag.org, pp. 301-305.

Harbold, J. M., "Highly nonlinear As-S-Se glasses for all-optical switching", Optics Letters, Jan. 15, 2002, vol. 27, No. 2, pp. 119-121.

Coen, Stephane, et al., "Supercontinuum generation by stimulated Raman scattering and parametric four-wave mixing in photonic crystal fibers", J. Opt. Soc. Am. B, Apr. 2002, vol. 19, No. 4, pp. 753-764.

Dudley, John M., et al., "Supercontinuum generation in air-silica microstructured fibers with nanosecond and femtosecond pulse pumping", J. Opt. Soc. Am. B, Apr. 2002, vol. 19, No. 4, pp. 765-771.

Harbold, Jeffrey M., et al., "Highly Nonlinear Ge-As-Se and Ge-As-S-Se Glasses for All Optical Switching", IEEE Photonics Technology Letters, Jun. 2002, vol. 14, No. 6, pp. 822-824.

Husakou, Anton V., et al., "Supercontinuum generation, four-wave mixing, and fission of higher-order solitons in photonic-crystal fibers", J. Opt. Soc. Am. B, Sep. 2002, vol. 19, No. 9, pp. 2171-2182.

Wadsworth, William J., et al., "Supercontinuum generation in photonic crystal fibers and optical fiber tapers: a novel light source", J. Opt. Soc. Am. B, Sep. 2002, vol. 19, No. 9, pp. 2148-2155.

Kumar, V.V. Ravi Kanth, et al., "Extruded soft glass photonic crystal fiber for ultrabroad supercontinuum generation", Optics Express, Dec. 16, 2002, vol. 10, No. 25, pp. 1520-1525.

Edwards, Glenn S., et al., "Advantage of the Mark-III FEL for biophysical research and biomedical applications", J. Synchrotron Rad., 2003, vol. 10, pp. 354-357.

Nicholson, J. W., et al., "Pulsed and continuous-wave supercontinuum generation in highly nonlinear, dispersion-shifted fibers", Applied Physics B 77, 2003, pp. 211-218.

Sobol, Emil, et al., "Time-resolved, light scattering measurements of cartilage and cornea denaturation due to free electron laser radiation", Journal of Biomedical Optics, Apr. 2003, vol. 8, No. 2, pp. 216-222.

Nicholson, J.W., et al., "All-fiber, octave-spanning supercontinuum", Optics Letters, Apr. 15, 2003, vol. 28, No. 8, pp. 643-645.

Faralli, S., et al., "Impact of Double Rayleigh Scattering Noise in Distributed Higher Order Raman Pumping Schemes", IEEE Photonics Technology Letters, Jun. 2003, vol. 15, No. 6, pp. 804-806.

New and Emerging Techniques—Surgical, Rapid Review, Laser Discectomy, Australian Safety and Efficacy Register of New Interventional Procedures—Surgical, Jun. 2003, 12 pages.

Edwards, G. S., et al., Review Article, "Free-electron-laser-based biophysical and biomedical instrumentation", Review of Scientific Instruments, Jul. 2003, vol. 74, No. 7, pp. 3207-3245.

Avdokhin, A. V., et al., "Continuous-wave, high-power, Raman continuum generation in holey fibers", Optics Letters, Aug. 1, 2003, vol. 28, No. 15, pp. 1353-1355.

Thielen, P. A., et al., "Small-core As-Se fiber for Raman amplification", Optics Letters, Aug. 15, 2003, vol. 28, No. 16, pp. 1406-1408.

Mussot, Arnaud, et al., "Generation of a broadband single-mode supercontinuum in a conventional dispersion-shifted fiber by use of a subnanosecond microchip laser", Optics Letters, Oct. 1, 2003, vol. 28, No. 19, pp. 1820-1822.

Slusher, Richard, et al., "Highly nonlinear composite chalcogenide/polymer fibers", OSA 2004, 1 page.

Thongtrangan, Issada, et al., "Minimally invasive spinal surgery: a historical perspective", Neurosurg. Focus, Jan. 2004, vol. 16, Article 13, pp. 1-10.

Hori, Takashi, et al., Flatly broadened, wideband and low noise supercontinuum generation in highly nonlinear hybrid fibef, Optics Express, Jan. 26, 2004, vol. 12, No. 2, pp. 317-324.

Wadsworth, W. J., et al., "Supercontinuum and four-wave mixing with Q-switched pulses in endlessly single-mode photonic crystal fibres", Optics Express, Jan. 26, 2004, vol. 12, No. 2, pp. 299-309.

Hilligsoe, Karen Marie, et al., "Supercontinuum generation in a photonic crystal fiber with two zero dispersion wavelengths", Optics Express, Mar. 22, 2004, vol. 12, No. 6, pp. 1045-1054.

(56) References Cited

OTHER PUBLICATIONS

Venugopalan, V., "Optical Society of America B/OMED Topical Meeting Tutorial on Tissue Optics", Apr. 27, 2004, pp. 1-32.

Slusher, Richart E., et al., "Large Raman gain and nonlinear phase shifts in high-purity As2Se3 chalcogenide fibers", J. Opt. Soc. Am. B, Jun. 2004, vol. 21, No. 6, pp. 1146-1155.

Leon-Saval, S. G., et al., "Supercontinuum generation in submicron fibre waveguides", Optics Express, Jun. 28, 2004, vol. 12, No. 13, pp. 2864-2869.

Nicholson, J. W., et al., "High power, single mode, all-fiber source of femtosecond pulses at 1550 nm and its use in supercontinuum generation", Optics Express, Jun. 28, 2004, vol. 12, No. 13, pp. 3025-3034.

Genty, G., et al., "Enhanced bandwidth of supercontinuurn generated in microstructured fibers", Optics Express, Jul. 26, 2004, vol. 12, No. 15, pp. 3471-3480.

Champert, Pierre-Alain, et al., "White-fight supercontinuum generation in normally dispersive optical fiber using original multi-wavelength pumping system", Optics Express, Sep. 20, 2004, vol. 12, No. 19, pp. 4366-4371.

Nicholson, J. W., "Supercontinuum generation in ultraviolet-irradiated fibers", Optics Letters, Oct. 15, 2004, vol. 29, No. 20, pp. 2363-2365.

Hori, Takashi, et al., "Experimental and numerical analysis of widely broadened supercontinuum generation in highly nonlinear dispersion-shifted fiber with a femtosecond pulse", J. Opt. Soc. Am. B, Nov. 2004, vol. 21, No. 11, pp. 1969-1980.

Demircan, Ayhan, et al., "Supercontinuum generation by the modulation instability", Optics Communications 244, 2005, pp. 181-185.

Papernyi, S. B., et al., "Sixth-Order Cascaded Raman Amplification", OFC/NFOEC, 2005, 3 pages.

Tanaka, Keiji, "Optical nonlinearity in photonic glasses", Journal of Materials Science: Materials in Electronics 16, 2005, pp. 633-643.

Westbrook, Paul S., "Improved Supercontinuum Generation Through UV Processing of Highly Nonlinear Fibers", Journal of Lightwave Technology, Jan. 2005, vol. 23, No. 1, pp. 13-18.

Abeeluck, Akheelesh K., et al., "Continuous-wave pumping in the anomalous- and normal dispersion regimes of nonlinear fibers for supercontinuum generation", Optics Letters, Jan. 1, 2005, vol. 30, No. 1, pp. 61-63.

Kutz, J. Nathan, et al., Enhanced Supercontinuum Generation through Dispersion-Management, Optics Express, May 30, 2005, vol. 13, No. 11, pp. 3989-3998.

Lee, Ju Han, et al., "Experimental performance comparison for various continuous-wave supercontinuum schemes: ring cavity and single pass structures", Optics Express, Jun. 27, 2005, vol. 13, No. 13, pp. 4848-4853.

Saliminia, A., et al., "Ultra-broad and coherent white light generation in silica glass by focused femtosecond pulses at 1.5pm", Optics Express, Jul. 25, 2005, vol. 13, No. 15, pp. 5731-5738.

Takushima, Yuichi, High average power, depolarized super-continuum generation using a 1.55 urn ASE noise source, Optics Express, Jul. 25, 2005, vol. 13, No. 15, pp. 5871-5877.

Travers, J. C., et al., "Extended continuous-wave supercontinuum generation in a low water-loss holey fiber", Optics Letters, Aug. 1, 2005, vol. 30, No. 15, pp. 1938-1940.

"Myelin." Wikipedia, the Free Encyclopedia. Web. Oct. 4, 2010. http://en.wikipedia.org/wiki/Myelin; Oct. 4, 2010.

"Renal Artery" Wikipedia, the free encyclopedia. http://en.wikipedia.org/wiki/Renal_artery; Jan. 21, 2011.

Tittel et al. "Mied-Infrared Laser Applications in Spectroscopy" pp. 445-463; Jul. 10, 2003.

Harrington, James A., "Infrared Fiber Optics", OSA Handbook, vol. III, McGraw Hill; Oct. 22, 2009.

Computer Motion, Inc., "501(k) Summary—ZEUS® MicroWristTM Surgical System and Accessories," 6 pages; Mar. 28, 2002.

Computer Motion, Inc. "HERMESTM O.R. Control Center—510(k) Summary of Safety and Effectiveness," 5 pages; Feb. 21, 2003.

K.M. Joos, et al. "Optic Nerve Sheath Fenestration with a Novel Wavelength Produced by the Free Electron Laser (FEL)," Lasers in Surgery and Medicine, 27:191-205; Sep. 21, 2000.

J. Sanghera, I. Aggarwal, "IR Fiber Optics at NRL," 10 pages; Sep. 2002.

J. Sanghera, L.B. Shaw, I.D. Aggarwal, "Applications of chalcogenide glass optical fibers," Academic of Science, pp. 1-11; Dec. 2002.

B. Rigas, P.T.T. Wong, "Human Colon Adenocarcinoma Cell Lines Display Infrared Spectroscopic Features," Cancer Research, pp. 84-88; Jan. 1992.

G. Edwards, et al., "Comparison of OPA and Mark-III FEL for Tissue Ablationat 6.45 Microns," Department of Physics and Free Electron Laser Laboratory, Duke University, 7 pages; Jan. 18, 2002.

Glenn Edwards, "Biomedical and potential clinical applications for pulsed lasers operating near 6.45 pm," Society of Photo-Optical Instrumentation Engineers, 2 pages; Nov. 23, 2005.

Passat, "Solid-State Lasers and Optical Components," 5 pages; Copyright 1995.

R.Rox Anderson, et aL, "Selective Photothermolysis: Precise Microsurgery by Selective Absorption of Pulsed Radiation," Department of Dermatology, Harvard Medical School, Science, vol. 220, 4 pages; Apr. 29, 1983.

Kobtsev, Serguei M., et al., "Modelling of high-power supercontinuum generation in highly nonlinear, dispersion shifted fibers at CW pump", Optics Express, Sep. 5, 2005, vol. 13, No. 18, pp. 6912-6918.

Falk, Peter, et al., "Supercontinuum generation in a photonic crystal fiber with two zero dispersion wavelengths tapered to normal dispersion at all wavelengths", Optics Express, Sep. 19, 2005, vol. 13, No. 19, pp. 7535-7540.

Tombelaine, Vincent, et al., "Ultra wide band supercontinuum generation in air-silica holey fibers by SHG-induced modulation instabilities", Optics Express, Sep. 19, 2005, vol. 13, No. 19, pp. 7399-7404.

Lee, Ju Han, et al., Continuous-wave supercontinuum laser based on an erbium-doped fiber ring cavity incorporating a highly nonlinear optical fiber, Optics Letters, Oct. 1, 2005, vol. 30, No. 19, pp. 2599-2601.

Genty, G., et al., "Supercontinuum generation in large mode-area microstructured fibers", Optics Express, Oct. 17, 2005, vol. 13, No. 21, pp. 8625-8633.

Schreiber, T., et al., "Supercontinuum generation by femtosecond single and dual wavelength pumping in photonic crystal fibers with two zero dispersion wavelengths", Optics Express, Nov. 14, 2005, vol. 13, No. 23, pp. 9556-9569.

Travers, J. C., "Extended blue supercontinuum generation in cascaded holey fibers", Optics Letters, Dec. 1, 2005, vol. 30, No. 23, pp. 3132-3134.

Hagen, C. L., et al., "Generationof a Continuum Extending to the Midinfrared by Pumping ZBLAN Fiber With an Ultrafast 1550-nm Source," IEEE Photonics Technology Letters, Jan. 1, 2006, vol. 18, No. 1, pp. 91-93.

Moon, Sucbei, et al., Generation of octave-spanning supercontinuum with 1550-nm amplified diode-laser pulses and a dispersion-shifted fiber, Optics Express, Jan. 9, 2006, vol. 14, No. 1, pp. 270-278.

Fedotova, O., et al., "Supercontinuum generation in planar rib waveguides enabled by anomalous dispersion", Optics Express, Feb. 20, 2006, vol. 14, No. 4, pp. 1512-1517.

Harrington, James A., "Infrared Fiber Optics", OSA Handbook, vol. III, to be published by McGraw Hill.

Aaviksoo, J., et al., "Observation of optical precursors at pulse propagation in GaAs", Physical Review A, Nov. 1, 1991, vol. 44, No. 9, pp. R5353-R5356.

Boppart, Stephen A., et al., "Imaging developing neural morphology using optical coherence tomography", Journal of Neuroscience Methods 70, 1996, pp. 65-72.

Boppart, Stephen A., et al., Noninvasive assessment of the developing *Xenopus* cardiovascular system using optical coherence tomography, Proc. Natl. Acad. Sci. USA, Apr. 1997, vol. 94, pp. 4256-4261.

(56) References Cited

OTHER PUBLICATIONS

Tearney, Guillermo J., et al., "In vivo Endoscopic Optical Biopsy with Optical Coherence Tomography", Science, New Series, Jun. 27, 1997, vol. 276, pp. 2037-2039.
de Boer, Johannes F., et al., "Imaging thermally damaged tissue by polarization sensitive optical coherence tomography", Optics Express 212, Sep. 14, 1998, vol. 3, No. 6, pp. 212-218.
Roggan, Andre, et al., "Optical Properties of Circulating Human Blood in the Wavelength Range 400-2500 NM", Journal of Biomedical Optics, Jan. 1999, vol. 4, No. 1, pp. 36-46.
de Boer, Johannes F., et al., Determination of the depth-resolved Stokes parameters of light backscattered from turbid media by use of polarization-sensitive optical coherence tomography, Optics Letters, Mar. 1, 1999, vol. 24, No. 5, pp. 300-302.
Rollins, Andrew M., et al., "Real-time in vivo imaging of human gastrointestinal ultrastructure by use of endoscopic optical coherence tomography with a novel efficient interferometerdesign", Optics Letters, vol. 24, No. 19, Oct. 1, 1999, pp. 1358-1360.
D'Amico, Anthony V., et al., "Optical Coherence Tomography As a Method for Identifying Benign and Malignant Microscopic Structures in the Prostate Gland", Basic Science, Urology 55 (5), 2000, pp. 783-787.
Li, Xingde, et al., "Imaging needle for optical coherence tomography", Optics Letters, Oct. 15, 2000, vol. 25, No. 20, pp. 1520-1522.
Oughstun, Kurt E., "Influence of precursor fields on ultrashort pulse autocorrelation measurements and pulse width evolution", Optics Express, Apr. 9, 2001, vol. 8, No. 8, pp. 481-491.
Kowalevicz, Andrew M., "Ultrahigh resolution optical coherence tomography using a superluminescent light source", Optics Express 349, Apr. 8, 2002, vol. 10, No. 7, pp. 349-353.
Povazay, B., et al., "Submicrometer axial resolution optical coherence tomography", Optics Letters, Oct. 15, 2002, vol. 27, No. 20, pp. 1800-1802.
Xie, T.-Q., et al., "Detection of tumorigenesis in urinary bladder with optical coherence tomography: optical characterization of morphological changes", Optics Express, Dec. 2, 2003, vol. 10, No. 24, pp. 1431-1443.
Seefeldt, Michael, et al., "Compact white-light source with an average output power of 2.4 W and 900 nm spectral bandwidth", Optics Communications 216, 2003, pp. 199-202.
Wang, Yimin, et al., "Ultrahigh-resolution optical coherence tomography by broadband continuum generation from a photonic crystal tibet", Optics Letters, vol. 28, No. 3, Feb. 1, 2003, pp. 182-184.
Bizheva, K., et al., Compact, broad-bandwidth fiber laser for sub-2-pm axial resolution optical coherence tomography in the 1300-nm wavelength region, Optics Letters, vol. 28, No. 9, May 1, 2003, pp. 707-709.
Pan, Yingtian, et al., "Hand-held arthroscopic optical coherence tomography for in vivo high-resolution imaging of articular cartilage", Journal of Biomedical Optics 8(4), Oct. 2003, pp. 648-654.
Xie, Tuqiang, et al., "Endoscopic optical coherence tomography with a modified microelectromechanical systems mirror for detection of bladder cancers", Applied Optics, vol. 42, No. 31, Nov. 1, 2003, pp. 6422-6426.
Dubois, A., Three-dimensional cellular-level imaging using full-field optical coherence tomography, Physics in Medicine and Biology, Phys. Med. Biol. 49, 2004, pp. 1227-1234.
Park, Jesung, et al., Analysis of birefringent image in the retinal nerve fiber layer by polarization sensitive optical coherence tomography, Ophthalmic Technologies XIV, Proceedings of SPIE, vol. 5314, 2004, pp. 188-194.
Unterhuber, A., et al., "Advances in broad bandwidth light sources for ultrahigh resolution optical coherence tomography", Physics in Medicine and Biology, Phys. Meal. Biol. 49, 2004, pp. 1235-1246.
Drexler, Wolfgang, "Ultrahigh-resolution optical coherence tomography", Journal of Biomedical Optics, Jan./Feb. 2004, vol. 9, No. 1, pp. 47-74.

Schmitt, Joseph, et al., "Intravascu/ar Optical Coherence Tomography Opens a Window Onto Coronary Artery Disease", Optics & Photonics News, Feb. 2004, pp. 20-25.
Nassif, N.A., et al., "In vivo high-resolution video-rate spectral-domain optical coherence tomography of the human retina and optic nerve", Optics Express, vol. 12, No. 3, Feb. 9, 2004, pp. 367-376.
Choi, Seung-Ho, et al., Observation of Optical Precursors in Water; Physical Review, May 14, 2004, Letters, vol. 92, No. 19, pp. 193903-1-193903-.3.
Pierce, Mark C., Advances in Optical Coherence Tomography Imaging for Dermatology, Optical Coherence Tomography Advances, The Journal of Investigative Dermatology, Sep. 3, 2004, pp. 458-463.
"State-Specific Trends in Chronic Kidney Failure—United States, 1990-2001"; Morbidity and Mortality Weekly Report, Department of Health and Human Services Centers for Disease Control and Prevention, Oct. 8, 2004, vol. 53, No. 39, pp. 918-920.
Mohammed N. Islam, U.S. Appl. No. 10/812,608, entitled "System and Method for Voice Control of Medical Devices", filed Mar. 30, 2004.
Shaw, et al., IR Supercontinuum Generation in As-So Photonic Crystal Fiber, Optical Society of America, 3 pages, © 2005.
PCT/US06/44451, Notification of Transmittal of the International Search Report and the Written Opinion of the International Searching Authority, or the Declaration, mailed Nov. 29, 2007, 12 pages.
Patent Application entitled, "System and Method for Generating Supercontinuum Light"; 34 pages specification, claims and abstract, 15 pages of drawings, inventor Mohammed N. Islam, filed Jan. 20, 2006.
Patent Application entitled, "Method and System for Generating Mid-Infrared Light", 43 pages specification, claims and abstract, 6 pages of drawings, inventor Mohammed N. Islam, filed Jan. 20, 2006.
Computer Motion, Inc., "501(k) Summary—ZEUS® MicroWristTM Surgical System and Accessories," 6 pages.
Computer Motion, Inc. "HERMESTM O.R. Control Center—510(k) Summary of Safety and Effectiveness," 5 pages.
K.M. Joos, et al. "Optic Nerve Sheath Fenestration with a Novel Wavelength Produced by the Free Electron Laser (FEL)," Lasers in Surgery and Medicine, 27:191-205.
J. Sanghera, I. Aggarwal, "IR Fiber Optics at NRL," 10 pages.
J. Sanghera, L.B. Shaw, I.D. Aggarwal, "Applications of chalcogenide glass optical fibers," Academic of Science, pp. 1-11.
B. Rigas, P.T.T. Wong, "Human Colon Adenocarcinoma Cell Lines Display Infrared Spectroscopic Features," Cancer Research, pp. 84-88.
Hazen, K.H., M.A. Arnold, G.W. Small, "Measurement of glucose and other analytes in undiluted human serum with near-infrared transmission spectroscopy," Analytica Chimica Acta, vol. 371, pp. 255-267 (1998).
Malin, S.F., T.L. Ruchti, T.B. Blank, S.N. Thennadil, S.L. Monfre, "Noninvasive prediction of glucose by near-infrared diffuse reflectance spectroscopy," Clinical Chemistry, vol. 45, No. 9, pp. 1651-1658 (1999).
Thennadil, S.N., J.L. Rennert, B.J. Wenzel, K.H. Hazen, T.L. Ruchti, M.B. Block, "Comparison of glucose concentration in interstitial fluid, and capillary and venous blood during rapid changes in blood glucose levels," Diabetes Technology & Therapeutics, vol. 3, No. 3, pp. 357-365 (2001).
Troy, T.L., S.N. Thennadil, "Optical properties of human skin in the near infrared wavelength range of 1000 to 2200nm," Journal of Biomedical Optics, vol. 6, No. 2, pp. 167-176, (2001).
Blank, T.B., T.L. Ruchti, A.D. Lorenz, S.L. Monfre, M.R. Makarewicz, M. Mattu, K.H. Hazen, "Clinical results from a non-invasive blood glucose monitor," Optical Diagnostics and Sensing of Biological Fluids and Glucose and Cholesterol Monitoring II, A.V. Priezzhev and G.L. Cote, Editors, Proceedings of SPIE, vol. 4624, pp. 1019 (2002).
Yeh, S-J, C.F. Hanna, O.S. Khalil, "Monitoring blood glucose changes in cutaneous tissue by temperature-modulated localized reflectance measurements," Clinical Chemistry, vol. 49, No. 6, pp. 924-934 (2003).

(56) References Cited

OTHER PUBLICATIONS

Marbach, R., T. Koschinsky, F.A. Gries, H.M. Heise, "Noninvasive blood glucose assay by near-infrared diffuse reflectance spectroscopy of the human inner lip," Applied Spectroscopy, vol. 47, No. 7, pp. 875-881 (1993).

Enejder, A.M.K., T.G. Scecina, J. Oh, M. Hunter, W.C. Shih, S. Sasic, G.L. Horowitz, M.S. Feld, "Raman spectroscopy for noninvasive glucose measurements," Journal of Biomedical Optics, vol. 10, No. 3, 031114 (2005).

Olesberg, J.T., L. Liu, V.V. Zee, M.A. Arnold, "In vivo near-infrared spectroscopy of rat skin tissue with varying blood glucose levels," Analytic Chemistry, vol. 78, No. 1, pp. 215-223 (2006).

Olesberg, J.T., M.A. Arnold, C. Mermelstein, J. Schmitz, J. Wagner, "Tunable laser diode system for noninvasive blood glucose measurements," Applied Spectroscopy, vol. 59, No. 12, pp. 1480-1484 (2005).

Harman-Boehm, I. A. Gal, A.M. Raykhman, J.D. Zahn, E. Naidis, Y. Mayzel, "Noninvasive glucose monitoring: a novel approach," Journal of Diabetes Science and Technology, vol. 3, No. 2 pp. 253-260 (2009).

Kim-K.D., G.S. Son, S.S. Lim, S.S. Lee, "Measurement of glucose level exploiting a relative optical absorption at discrete probe wavelengths," Japanese Journal of Applied Physics, vol. 48, 077001 (2009).

Smith, J.L., "The Pursuit of Noninvasive Glucose: Hunting the Deceitful Turkey," 2nd Edition, pp. 1-141 (2011).

Pezzaniti, J.L., T.W. Jeng, L. McDowell, G.M. Oosta, "Preliminary investigation of near-infrared spectroscopic measurements of urea, creatinine, glucose, protein and ketone in urine," Clinical Biochemistry, vol. 34, pp. 239-246 (2001).

Lussi, A., R. Hibst, R. Paulus, "Diagnodent: An optical method for caries detection," Journal of Dental Research, vol. 83, special issue C, pp. C80-C83 (2004).

Reese, E.L, E.E. Fisher, D.A. Horowitz, "Photoelectric densitometry of the circulation of the human dental pulp," The Journal of the Baltimore College of Dental Surgery, vol. 26, No. 1, pp. 6-18 (1971).

Zakian, C., I. Pretty, R. Ellwood, "Near-infrared hyperspectral imaging of teeth for dental caries detection," Journal of Biomedical Optics, vol. 16, No. 6, 064047 (2009).

Belikov, A.V., A.V. Skripnik, K.V. Shatilova, "Study of the dynamics of the absorption spectra of human tooth enamel and dentine under heating and ablation by submillisecond pulse radiation of an erbium laser with a generation wavelength of 2.79 um," Optics and Spectroscopy, vol. 109, No. 2, pp. 211-216 (2010).

Karlsson, L. "Caries detection methods based on changes in optical properties between healthy and carious tissue," International Journal of Dentistry, vol. 2010, Article ID 270729, 9 pages (2010).

Fried, D. M. Staninec, C.L. Darling, "Near-infrared imaging of dental decay at 1310nm," Journal of Laser Dentistry, vol. 18, No. 1, pp. 8-16 (2010).

Burmen, M. P. Usenik, A. Fidler, F. Pernus, B. Likar, "A construction of standardized near infrared hyper-spectral teeth database—a first step in the development of reliable diagnostic tool for quantification and early detection of caries," Lasers in Dentistry XVII, edited by P. Rechmann, D. Fried, Proceedings of SPIE, vol. 7884, Paper 78840E (2011).

Maia, A., L. Karlsson, W. Margulis, A. Gomes, "Evaluation of two imaging techniques: near-infrared transillumination and dental radiographs for the detection of early approximal enamel caries," Dentomaxillofacial Radiology, vol. 40, pp. 429-433 (2011).

Chung, S., D. Fried, M. Staninec, C.L. Darling, "Multispectral near-IR reflectance and transillumination imaging of teeth," Biomedical Optics Express, vol. 2, No. 10, pp. 2804-2814 (2011).

Chung, S., D. Fried, M. Staninec, C.L. Darling, "Near infrared imaging of teeth at wavelengths between 1200 and 1600nm," Proceedings of the Society of Photo Optical Instrument Engineering, paper 7884 (2011).

Staninec, M., S.M. Douglas, C.L. Darling, K. Chan, H. Kang, R. C. Lee, D. Fried, "Nondestructive clinical assessment of occlusal caries lesions using near-IR imaging methods," Lasers in Surgery and Medicine, vol. 43, No. 10, pp. 951-959 (2011).

Nishizawa, N., "Generation and application of high-quality supercontinuum sources," Optical Fiber Technology, vol. 18, pp. 394-402 (2012).

Urbas et al. 2008. "Near-infrared spectrometry in cardiovascular disease" Chapter 34, pp. 657-670, Handbook of Near-Infrared Analysis.

Andreson et al. 2006. "Selective photothermolysis of lipid-rich tissues: a free electron laser study," Lasers Surg. Med. 38: 913-919.

Wanner et al., 2009, "Effects of non-invasive, 1.210nm laser exposure on adipose tissue: results of a human pilot study" Lasers Surg. Med, 41: 401-407.

Nazarian, S., et al. 2005, "Direct visualization of coronary sinus ostium and branches with a flexible steerable fiberoptic infrared endoscope," Heart Rhythm 2: 844-848.

Islam, M.N. "Raman amplifiers for telecommunications 1: Physical principles" Springer-Verlag New York Inc. 2003. pp. 298.

Islam, M.N. "Raman amplifiers for telecommunications 2: Sub-systems" Springer-Verlag New York Inc. 2004.

White et al. 1997. Chapter 7: "Optical fiber components and devices, in Optical Fiber Telecommunications IIIB" Academic Press, Chestnut Hill, MA.

Xia et al. 2006. "Mid-infrared supercontinuum generation to 4.5 um in ZBLAN fluoride fibers by nanosecond diode pumping" Opt. Letts. 31; 2552-5.

Xia et al. 2007. "Power scalable mid-infrared supercontinuum generation to ZBLAN fluoride fibers with up to 1.3 watts time-averaged power" Opt. Exp. 15: 865-71.

Xia et al. 2007. "Supercontinuum generation in silica fibers by amplified nanosecond laser diode pulses" IEEE J. sel. top. Quant. Electr. 13: 89-97.

Kumar et al. 2008. "Power adjustable visible supercontinuum generation using amplified nanosecond gain-switched laser dioide" Opt. exp. 16: 6194-6201.

Xia et al. 2009. "10.5 W time-averaged power mid-IR supercontinuum generation extending beyond 4 um with direct pulse pattern modulation" IEEE J. Sel. Top. Quant. Electr. 15: 422-34.

Yoshida et al., "Novel 1.8-um-band light sources composed of thulium-doped fiber for in vivo imaging" Proc. of SPIE vol. 6852 685201-1 (2000).

"Myelin." Wikipedia, the Free Encyclopedia. Web. Oct. 4, 2010. <http://en.wikipedia.org/wiki/Myelin>.

"Renal Artery" Wikipedia, the free encyclopedia. <http://en.wikipedia.org/wiki/Renal_artery>.

Agger et al. "Emission and absorption cross section of thulium doped silica fibers." Jan. 9, 2006, vol. 14, No. 1, Optics express.

Agger et al. "Single-frequency thulium-doped distributed feedback fiber laser" Jul. 1, 2004, vol. 29, 13 Optics Letters.

Agger et al."Single frequency thulium doped silica DBF fiber laser at 1735 nm," Proc of SPIE (2004) vol. 5335.

Bogle "Fractionated Mid-Infrared Resurfacing" Semin Cutan Med Surg 27 (2008) pp. 252-258.

Nilsson et al. "Near infrared diffuse reflection and laswer-induced fluorescence spectroscopy for mycardial tissue characterisation." Spectrochimica Acta Part A 53 (1997) 1901-1912.

Caplan et al. "Near-Infrared Spectroscopy for the detection of Vulnerable coronary Artery Plaques." JACC vol. 47, No. 8 Suppl C Apr. 18, 2006: C92-6.

Tittel et al. "Mied-Infrared Laser Applications in Spectroscopy" pp. 445-463.

Krum et al. "Catheter-based renal sympathetic denerbation for resistant hypertensions: a multicentre safety and proof-of-principle cohort study" Lancet 2009; 373: 1275-81.

Leertouwer et al. "In-vitro validation, with histology, of intravascular ultrasound in renal arteries" Journal of Hyperttension 1999, 17:271-277.

Kampanowska-Jezierska et al. "Early effects of renal denervation in the anaesthetised rat: natriuresis and increased cortical blood flow" Journal of Physiology 2001, 531.2:527-534.

Kux, E. The Endoscopic approach to the vegetative nervous system and its therapeutic possibilities: especially in duodenal ulcer, angina pectoris, hypertension and diabetes Dis Chest 1951, 20: 139-147.

(56) References Cited

OTHER PUBLICATIONS

International Search Report dated Nov. 15, 2007 for PCT/US2006/044451 filed Nov. 16, 2006.
Islam, M. N., "Broad bandwidths from frequency-shifting solitons in fibers", Optics Letters, Apr. 1, 1989, vol. 14, No. 7, pp. 370-372.
Islam, M. N., "Femtosecond distributed soliton spectrum in fibers", J. Opt. Soc. Am. B, vol. 6, Jun. 1989, No. 6, pp. 1149-1158.
Busse, Lynda E., et al., "Design Parameters for Fluoride Multimode Fibers", Journal of Lightwave Technology, Jul. 1991, vol. 9, No. 7, pp. 828-831.
Wuthrich, Stefan, et al., "Optical damage thresholds at 2.94 um in fluoride glass fibers", Applied Optics, Vet. 31, Sep. 20, 1992, No. 27, pp. 5833-5837.
Inoue, H., et al., "Computer simulation of the vibrational spectra and properties of fluoride glasses based on $ZrF_4$", Journal of Non-Crystalline Solids, 1993, vol. 161, pp. 118-122.
Mizunami, Toru, et al., "Gain saturation characteristics of Raman amplification in silica and fluoride glass optical fibers", Optics Communications 97, 1993, pp. 74-78.
Desthieux, B., et al., "111 kW (O.5 mJ) pulse amplification at 1.5 um using a gated cascade of three erbium-doped fiber amplifiers," Appl. Phys. Lett. vol. 63, Aug. 2, 1993, pp. 586-588.
Edwards, Glenn, et al., Tissue ablation by a free-electron laser tuned to the amide II band, Nature, Sep. 29, 1994, vol. 371, pp. 416-419.
Borrelli, N. F., et al., "Resonant and non-resonant effects in photonic glasses", Journal of Non-Crystalline Solids 185, 1995, pp. 109-122.
Asobe, Masaki, et al., "Third-order nonlinear spectroscopy in $AszS$~ chalcogenide glass fibers", J. Appl. Phys. 77 (11), Jun. 1, 1995, pp. 5518-5523.
Jarman, Richard H., Wove/optical fiber lasers, Current Opinion in Solid State and Materials Science 1996, pp. 199-203.
Iatridis, James C., et al., "Is the Nucleus Pulposus a Solid or a Fluid? Mechanical Behaviors of the Nucleus Pulposus of the Human Intervertebral Disc", Spine, May 15, 1996, vol. 21(10), pp. 1174-1184.
Asobe, Masaki, "Nonlinear Optical Properties of Chalcogenide Glass Fibers and Their Application to All-Optical Switching", Optical Fiber Technology, 1997, vol. 3, Article No. OF970214, pp. 142-148.
Smektala, F., et al., "Chalcogenide glasses with large non-linear refractive indices", Journal of Non-Crystalline Solids 239, 1998, pp. 139-142.
Hamilton, James D., et al., "High Frequency Ultrasound Imaging with Optical Arrays", IEEE Transactions on Ultrasonics, Ferroelectrics, and Frequency Control, Jan. 1998, vol. 45, No. 1, pp. 216-235.
Hamilton, James D., et al., "High Frequency Ultrasound Imaging Using an Active Optical Detector", IEEE Transactions on Ultrasonics, Ferroelectrics, and Frequency Control, May 1998, vol. 45, No. 3, pp. 719-727.
Nowak, G. A., et al., "Low-power high-efficiency wavelength conversion based on modulational instability in high-nonlinearity fiber," Optics Letters, Jun. 15, 1998, vol. 23, No. 12, pp. 936-938.
Cardinal, T., et al., "Non-linear optical properties of chalcogenide glasses in the system As-S-Se", Journal of Non-Crystalline Solids 256 & 257, 1999, pp. 353-360.
Lucas, Jacques, "Infrared glasses", Current Opinion in Solid State & Materials Science 4, 1999, pp. 181-187.
Sanghera, J. S., et al., "Active and passive chalcogenide glass optical fibers for IR applications: a review", Journal of Non-Crystalline Solids 256 & 257, 1999, pp. 6-16.
Nishida, Yoshiki, et al., "Reliability of Fluoride Fiber Module for Optical Amplifier Use", IEEE Photonics Technology Letters, Dec. 1999, vol. 11, No. 12, pp. 1596-1598.
Nowak, George A., et al., "Stable supercontinuum generation in short lengths of conventional dispersion-shifted fiber", Applied Optics, Dec. 20, 1999, vol. 38, No. 36, pp. 7364-7369.
Urban, J. P. G., et al., "The Nucleus of the/ntervertebra/Disc from Development to Degeneration", Amer. Zool., 2000, vol. 40, pp. 53-61.

\* cited by examiner

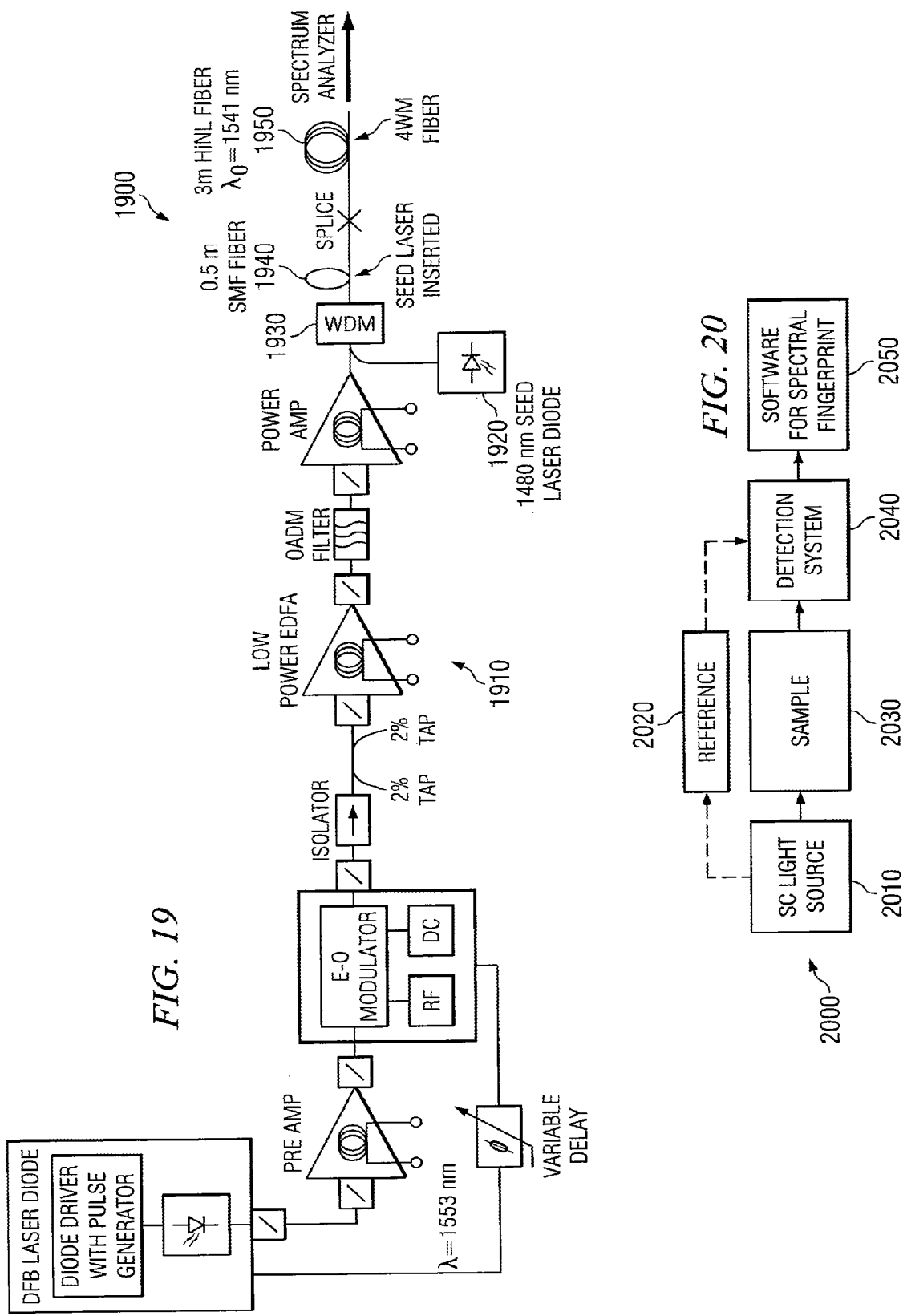

BROADBAND OR MID-INFRARED FIBER LIGHT SOURCES

CROSS-REFERENCE TO RELATED APPLICATIONS

This application is a continuation of U.S. application Ser. No. 14/186,171 filed Feb. 21, 2014, which is a continuation of U.S. application Ser. No. 14/071,983 filed Nov. 5, 2013 (now U.S. Pat. No. 8,971,681), which is a continuation of U.S. application Ser. No. 13/750,556 filed Jan. 25, 2013, which is a continuation of U.S. application Ser. No. 13/241,900 filed Sep. 23, 2011 (now U.S. Pat. No. 8,391,660), which is a Continuation of U.S. application Ser. No. 12/366,323 filed Feb. 5, 2009 (now U.S. Pat. No. 8,055,108), which is a Continuation of U.S. application Ser. No. 11/599,950 filed Nov. 15, 2006 (now U.S. Pat. No. 7,519,253), which claims priority to U.S. Provisional Patent Application Ser. No. 60/738,389, filed Nov. 18, 2005, the disclosures of which are hereby incorporated by reference in their entirety.

STATEMENT REGARDING FEDERALLY SPONSORED RESEARCH OR DEVELOPMENT

This invention was made with Government support under Contract No. W31P4Q-05-C-0159 awarded by the U.S. Army Aviation and Missile Command and Contract No. W911NF-04-C-0078 awarded by the U.S. Army Robert Morris ACQ CTR. The Government has certain rights in the invention.

TECHNICAL FIELD

This invention relates in general to broadband or mid-infrared light based systems, and more particularly to a system and method for generating wavelengths between approximately 0.4 to 5 microns or more based on fiber optic technologies or optical waveguides.

BACKGROUND AND SUMMARY

In one embodiment, an optical system for use in material processing having a plurality of semiconductor diodes, each of the diodes configured to generate an optical beam, a beam combiner configured to receive at least a portion of the optical beams from the plurality of semiconductor diodes and to generate a multiplexed optical beam, a cladding-pumped fiber amplifier or laser configured to receive at least a portion of the multiplexed optical beam and to form an intermediate beam having at least a first wavelength, and an optical element configured to receive at least a portion of the intermediate beam and to form an output beam with an output beam wavelength, wherein at least a portion of the output beam wavelength is longer than at least a portion of the first wavelength. A subsystem includes one or more lenses or mirrors configured to receive a received portion of the output beam and to deliver a delivered portion of the output beam to a sample. The delivered portion of the output beam has a temporal duration greater than approximately 30 picoseconds, a repetition rate from continuous wave to Megahertz or higher, and a time averaged intensity of less than approximately 50 MW/cm$^2$. The output beam has a time averaged output power of about 20 mW or more.

In another embodiment, an optical system for use in material processing includes one or more semiconductor diodes configured to generate an input beam, wherein at least a portion of the input beam comprises a wavelength shorter than about 2.5 microns, one or more optical amplifiers configured to receive at least the portion of the input beam and to communicate an intermediate beam to an output end of the one or more optical amplifiers, and one or more optical fibers configured to receive at least a portion of the intermediate beam and to propagate the at least a portion of the intermediate beam to form at a distal end of the one of more optical fibers a first optical beam having at least a first wavelength. A nonlinear element is configured to receive at least a portion of the first optical beam and to wavelength shift at least a portion of the first wavelength through a nonlinear effect in the nonlinear element to form an output beam with an output beam wavelength, wherein at least a portion of the output beam wavelength is longer than the at least a portion of the first wavelength. A subsystem includes one or more lenses or mirrors configured to receive a received portion of the output beam and to deliver a delivered portion of the output beam to a sample. The delivered portion of the output beam has a temporal duration greater than approximately 30 picoseconds, a repetition rate between continuous wave and Megahertz or higher, and a time averaged intensity of less than approximately 50 MW/cm$^2$. The output beam has a time averaged output power of about 20 mW or more.

Yet another embodiment includes an optical system for use in material processing having a plurality of semiconductor diodes, each of the diodes configured to generate an optical beam, a beam combiner configured to receive at least a portion of the optical beams from the plurality of semiconductor diodes and to generate a multiplexed optical beam, an optical fiber configured to receive at least a portion of the multiplexed optical beam and to communicate the at least a portion of the multiplexed optical beam to form an intermediate, and a light guide configured to receive at least a portion of the intermediate beam and to propagate the at least a portion of the intermediate beam to form an output beam having at least one wavelength. A subsystem includes one or more lenses or mirrors configured to receive a received portion of the output beam and to deliver a delivered portion of the output beam to a sample comprising one or more powdered substances. The delivered portion of the output beam has a temporal duration greater than approximately 30 picoseconds, a repetition rate from continuous wave to Megahertz or higher, and a time averaged intensity of less than approximately 50 MW/cm$^2$. The output beam has a time averaged output power of about 20 mW or more.

Broadband light sources, super-continuum sources, and Mid-Infrared Fiber Light (MIRFIL) sources are described that generate wavelength in the mid-infrared (mid-IR being wavelengths substantially between 2 to 5 microns) based on nonlinear processes in optical fibers. Examples of nonlinear processes in optical fibers include super-continuum (SC) generation, modulational instability (MI), cascaded Raman wavelength shifting (CRWS), and four-wave mixing (4WM). Examples of optical fibers include fused silica fibers, fluoride fibers, chalcogenide fibers, and tellurite fibers.

Current techniques of generating mid-IR light include the use of optical parametric oscillators (OPOs) or optical parametric amplifiers (OPAs). However, OPOs and OPAs are generally expensive, complicated, and involve moving parts that are prone to mis-alignment. Alternative techniques for generating mid-IR light involve the use of quantum cascade lasers (QCL). However, QCL's are generally difficult to operate at wavelengths shorter than about 4.4 microns, they put out low output powers, they have relatively low efficiency, and they often required pulsed operation or cryogenic cooling.

A simpler technique for generating mid-IR light is to use laser diodes to pump optical fibers. The MIRFIL can exemplary involve the generation of mid-IR light in optical fibers by pumping with a variety of lasers including laser diodes, solid state lasers, or cladding-pumped fiber lasers. In one embodiment, SC generation is achieved to simultaneously generate a wide band of wavelengths, which can advantageously be used to mimic the black body radiation of hot metal objects or to perform spectral fingerprinting to identify one or more chemical species. The fiber based MIRFIL can be lighter, more robust, more compact, simpler and less costly than the OPA or OPO alternatives. Moreover, the MIRFIL can produce a single spatial mode with minimal requirements for optical alignments. In a preferred embodiment, nanosecond pulses are used to generate mid-IR light. In addition, the MIRFIL approach leverages the enormous investment in telecommunications technologies and the mature fiber platform.

In one embodiment, an optical system for use in an imaging procedure includes one or more semiconductor diodes configured to generate an input beam, wherein at least a portion of the input beam comprises a wavelength shorter than about 2.5 microns, one or more optical amplifiers configured to receive at least the portion of the input beam and to communicate an intermediate beam to an output end of the one or more optical amplifiers, and one or more optical fibers configured to receive at least a portion of the intermediate beam and to communicate at least the portion of the intermediate beam to a distal end of the one or more optical fibers to form a first optical beam. A nonlinear element is configured to receive at least a portion of the first optical beam and to broaden a spectrum associated with the at least a portion of the first optical beam to at least about 50 nm through a nonlinear effect in the nonlinear element to form an output beam with an output beam broadened spectrum. A subsystem includes one or more lenses or mirrors configured to receive a received portion of the output beam and to deliver a delivered portion of the output beam to a sample to perform imaging for characterizing the sample. The subsystem includes an Optical Coherence Tomography (OCT) apparatus comprising a sample arm and a reference arm, wherein the delivered portion of the output beam has a temporal duration greater than approximately 30 picoseconds, a repetition rate between continuous wave and Megahertz or higher, and a time averaged intensity of less than approximately 50 MW/cm$^2$. The output beam has a time averaged output power of about 20 mW or more.

In yet another embodiment, an optical system for use in an imaging procedure having a plurality of semiconductor diodes, each of the diodes configured to generate an optical beam, a beam combiner configured to receive at least a portion of the optical beams from the plurality of semiconductor diodes and to generate a multiplexed optical beam, an optical fiber configured to receive at least a portion of the multiplexed optical beam and to communicate the at least a portion of the multiplexed optical beam to form an intermediate beam having at least one wavelength, and a light guide configured to receive at least a portion of the intermediate beam and to propagate the at least a portion of the intermediate beam to form an output beam. A subsystem includes one or more lenses or mirrors configured to receive a received portion of the output beam and to deliver a delivered portion of the output beam to a sample to perform imaging for characterizing the sample, wherein the subsystem comprises an Optical Coherence Tomography (OCT) apparatus comprising a sample arm and a reference arm. The delivered portion of the output beam has a temporal duration greater than approximately 30 picoseconds, a repetition rate from continuous wave to Megahertz or higher, and a time averaged intensity of less than approximately 50 MW/cm$^2$. The output beam has a time averaged output power of about 20 mW or more.

Another embodiment includes an optical system for use in a spectroscopy procedure having one or more semiconductor diodes configured to generate an input beam, wherein at least a portion of the input beam comprises a wavelength shorter than about 2.5 microns, one or more optical amplifiers configured to receive at least the portion of the input beam and to communicate an intermediate beam to an output end of the one or more optical amplifiers, and one or more optical fibers configured to receive at least a portion of the intermediate beam and to communicate at least the portion of the intermediate beam to a distal end of the one or more optical fibers to form a first optical beam. A nonlinear element is configured to receive at least a portion of the first optical beam and to broaden a spectrum associated with the at least a portion of the first optical beam to at least about 50 nm through a nonlinear effect in the nonlinear element to form an output beam with an output beam broadened spectrum. A subsystem includes one or more lenses or mirrors configured to receive a received portion of the output beam and to deliver a delivered portion of the output beam to a sample to perform spectroscopy for characterizing the sample based on chemical composition, wherein at least a part of the sample comprises skin or tissue. The delivered portion of the output beam has a temporal duration greater than approximately 30 picoseconds, a repetition rate between continuous wave and Megahertz or higher, and a time averaged intensity of less than approximately 50 MW/cm$^2$. The output beam has a time averaged output power of about 20 mW or more.

One embodiment includes an optical system for use in a spectroscopy procedure having a plurality of semiconductor diodes, each of the diodes configured to generate an optical beam, a beam combiner configured to receive at least a portion of the optical beams from the plurality of semiconductor diodes and to generate a multiplexed optical beam, an optical fiber configured to receive at least a portion of the multiplexed optical beam and to communicate the at least a portion of the multiplexed optical beam to form an intermediate beam having at least one wavelength, and a light guide configured to receive at least a portion of the intermediate beam and to propagate the at least a portion of the intermediate beam to form an output beam. A subsystem includes one or more lenses or mirrors configured to receive a received portion of the output beam and to deliver a delivered portion of the output beam to a sample to perform spectroscopy for characterizing the sample based on chemical composition, wherein at least a part of the sample comprises skin or tissue. The delivered portion of the output beam has a temporal duration greater than approximately 30 picoseconds, a repetition rate from continuous wave to Megahertz or higher, and a time averaged intensity of less than approximately 50 MW/cm$^2$. The output beam has a time averaged output power of about 20 mW or more.

One embodiment of a broadband light source comprises one or more laser diodes capable of generating a pump signal with a wavelength shorter than 2.5 microns and a pulse width of at least 100 picoseconds. The one or more laser diodes are coupled to one or more optical amplifiers, which are capable of amplifying the pump signal to a peak power of at least 500 W. A first fiber is further coupled to the one or more optical amplifiers, wherein the pump signal wavelength falls in an anomalous group-velocity dispersion regime of the first fiber, wherein the pump signal is modulated using a modulational instability mechanism in the first fiber, and wherein different intensities of the pump signal can cause relative motion between different parts of the modulated pump signal produced through modulational instability in the first fiber. A nonlinear element is coupled to the first fiber, and the nonlinear element is capable of broadening the pump optical spectral width to at least 100 nm through a nonlinear effect in the element.

In another embodiment, a mid-infrared light source comprises one or more laser diodes comprising a wavelength and a pulse width of at least 100 picoseconds. One or more optical amplifiers are coupled to the pump signal and are capable of amplifying the pump signal. Further, one or more fibers are coupled to the optical amplifiers. In the fibers, the pump signal wavelength falls in the anomalous group-velocity dispersion regime for at least a fraction of the one or more fibers, and the pump signal is modulated using a modulational instability mechanism. A nonlinear element is coupled to the one or more fibers and is capable of generating a super-continuum with a substantially continuous spectrum from at least the pump signal wavelength out to 2.6 microns or longer and wherein the nonlinear element introduces less than 10 decibels of power loss at 2.6 microns.

A further embodiment involves a method of generating broadband light by generating a pump signal, wherein the pump signal comprises a wavelength shorter than 2.5 microns and a pulse width of at least 100 picoseconds. The method further comprises the step of amplifying the pump signal to a peak power of at least 500 W, modulating at least a fraction of the pump signal using a modulational instability mechanism, and broadening the pump optical spectral width to at least 100 nm using a nonlinear effect.

In yet another embodiment, a MIRFIL can use technologies that have been developed for telecommunications. For example, the pump laser can be a laser diode followed by multiple stages of optical amplifiers. The pump can use continuous wave (CW) or quasi-CW light, which may comprise pulses broader than approximately 100 picoseconds. In a preferred embodiment, the mid-IR light generation may occur in an open loop of fiber, preferably a fiber that transmits light into the mid-IR. Advantageously, only a short length of fiber can be used, such as less than about 100 meters, preferably less than about 20 m, and even more preferably less than about 10 m. With this configuration, wavelengths can be generated in the fiber beyond approximately 1.8 microns, preferably beyond approximately 2.2 microns, and even more preferably beyond 2.5 microns.

In a particular embodiment, a MIRFIL can use a laser diode driven pump laser that outputs CW or quasi-CW pulses (greater than approximately 100 picoseconds) followed by a series of fibers, wherein the first length of fiber can be made from fused silica and can be used to break the CW or quasi-CW light into pulses based on the modulational instability (MI) or parametric amplification effect, and then another length of mid-IR fiber, such as ZBLAN, fluoride, tellurite, or a semiconductor waveguide can be used to broaden the spectrum, through the nonlinearity in the medium and a mechanism such as self-phase modulation. In a preferred embodiment, some curvature in the temporal domain can help to generate the super-continuum by causing relative motion between the MI generated pulses. Also, there can advantageously be exchange of energy between MI generated pulses through the Raman effect in the medium. The design of such a MIRFIL can be that the MI-induced pulse break-up may occur primarily in the first section, and the nonlinear spectrum generation may occur primarily in the second section. In a preferred embodiment, the length of the fused silica fiber can be under 10 meters, and the length of the mid-IR fiber can be less than 20 meters.

In another embodiment, super-continuum (SC) generation from the visible or near-IR wavelength range can be accomplished using nanosecond pulse pumping. The SC generation can exemplary be initiated using modulational instability (MI). In a preferred embodiment, the seed for MI may arise from the amplified spontaneous emission from the optical amplifiers or from a near-IR light source, such as a laser diode. In a particular embodiment using fused silica fiber, the SC can cover the wavelength range substantially between approximately 0.8 microns to approximately 2.8 microns. In another particular embodiment using ZBLAN fluoride fiber, the SC can cover the wavelength range substantially between approximately 0.8 microns to approximately 4.5 microns. With control of the fiber loss from the material or from bend induced loss, as well with tailoring the composition of the fluoride fiber, the long wavelength edge of the SC may be pushed out to 5.3 microns or longer. In a preferred embodiment, it may be valuable to add a wavelength conversion stage. In addition, it may be advantageous to have a pulse compression stage following the MI pulse break-up.

In yet another embodiment, wavelength conversion into the mid-IR wavelength range can be achieved based on four-wave mixing (4WM) in fibers. 4WM usually requires phase matching, and a new window for phase matching permits phase matching into the mid-IR. In a preferred embodiment, the phase matching wavelengths can be tuned by adjusting the fiber dispersion profile and tuning the seed wavelength in the near-IR. In a particular embodiment, a solid core or photonic crystal fiber can be used with a tailored dispersion profile, a seed wavelength from a laser diode or a tunable laser in the near-IR can be used to convert light from a near-IR pump to the mid-IR wavelength range.

In another embodiment, the power for the MIRFIL can be scaled up by using a higher power pump laser, such as a cladding pumped fiber amplifier, a cladding pumped fiber laser or a solid state diode-pumped light source. Based on the damage threshold of the particular fiber employed, the core size of the fiber can also be increased to increase the power throughput and output power.

The fiber based mid-IR light source may be an enabling technology for a number of applications. For example, the broadband mid-IR light source may be useful for infrared counter-measures for aircraft protection. Also, the SC light source could be used in chemical sensing, for non-contact or remote sensing of firearms, weapons, drugs. The SC source could also be used for industrial chemical sensing, such as in advanced semiconductor process control, combustion monitoring, or chemical plant process control. Other potential applications include bio-medical imaging and ablation. Moreover, the broadband SC light source could advantageously be used in an optical coherence tomography configuration for semiconductor wafer imaging or defect location. In addition, the broadband light source could be instrumental for applications in the last mile solution, such as fiber to the home, node, neighborhood, curb, premise, etc. More specifically, the broadband light source could enable wavelength division multiplexed or lambda passive optical networks.

Depending on the specific features implemented, particular embodiments of the present invention may exhibit some, none, or all of the following technical advantages. Various embodiments may be capable of covering other wavelength ranges or multiple wavelength ranges. For example, SC generation can cover the visible wavelength range from approximately 0.4 microns to 0.6 microns by using a dual pumping scheme. Some embodiments may be capable of generating bands of wavelengths rather a continuous range of wavelengths, and the bands of wavelengths may also be tunable or adjustable.

Other technical advantages will be readily apparent to one skilled in the art from the following figures, description and claims. Moreover, while specific advantages have been enumerated, various embodiments may include all, some or none of the enumerated advantages.

BRIEF DESCRIPTION OF THE DRAWINGS

To provide a more complete understanding of the present invention and certain features and advantages, thereof, reference is made to the following description taken in conjunction with the accompanying drawings in which:

FIG. 19 illustrates an exemplary experimental configuration for testing four-wave-mixing.

FIG. 20 illustrates an exemplary spectral fingerprinting system block diagram. Note that some, all, or none of the illustrated boxes may be involved in spectral fingerprinting. Further, other boxes can also be added within the scope of the disclosure.

DETAILED DESCRIPTION

Figure 1:
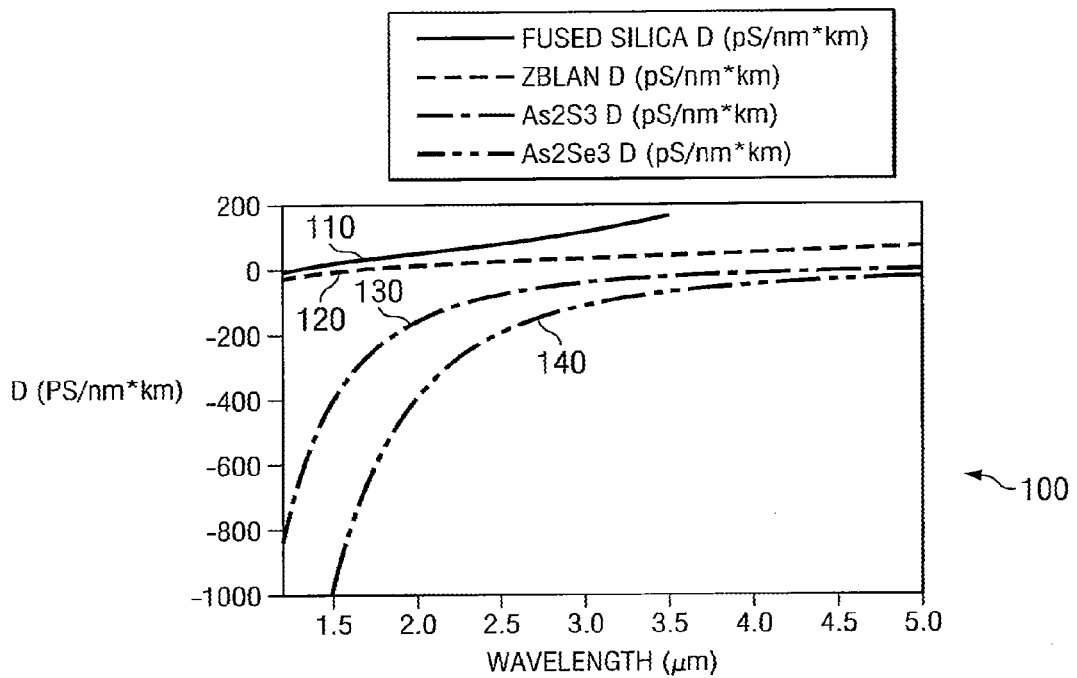
FIG. 1 illustrates a calculated group velocity dispersion for fused silica fiber (top), fluoride fiber (second from top), sulfide fiber (third from top) and selenide fiber (bottom).

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Mid-IR light can be generated based on super-continuum in fused silica fibers and mid-IR fibers. Nonlinear waveguides other than fibers can also be used to generate the super-continuum. In one embodiment, SC has been demonstrated experimentally from ~0.8 to ~4.5 microns in ZBLAN fluoride fibers and from ~0.9 to ~2.8 microns in high-nonlinearity (HiNL) fused silica fiber. The SC originates for laser diode pumping, and modulational instability (MI) initiated SC generation leads to a significant simplification by reducing or eliminating the need for expensive, complicated, mode-locked lasers. In another embodiment, three orders of cascaded Raman wavelength shifting (CRWS) can be observed in sulfide-based chalcogenide fibers below the damage threshold. In one particular embodiment, the pump source comprises a laser diode followed by several stages of erbium-doped fiber amplifiers, in some cases also including a mid-stage modulator. Since in this embodiment the SC or CRWS occurs in meters to 10's of meters of fiber, the entire mid-IR light source can be compact, lightweight, inexpensive and rugged. Although particular experimental conditions are described in the following, other configurations, materials and fiber types can be used within the scope of the invention.

Fiber Dispersion can Determine SC vs. Cascaded Raman Shifting

To organize and explain the experimental results in various types of fibers tested, a theoretical framework is first established. Various nonlinear processes are observed in fibers, included CRWS and MI. In turn, MI can give rise to the generation of broadband SC. Whether CRWS or SC occurs first in a fiber depends on the wavelength of the pump or the shifted pump with respect to the zero dispersion wavelength $\Lambda_0$. When the pump is at a wavelength shorter than the zero dispersion wavelength (so-called normal dispersion regime), then CRWS can be first observed. When the pump is at a wavelength longer than the zero dispersion wavelength (so-called anomalous dispersion regime), then MI and SC can be first observed. When the pump lies in the normal dispersion regime, it can experience CRWS, but when the cascaded Raman order shifts into the anomalous dispersion regime, then MI and SC can occur. Thus, to understand the nonlinear spectrum generated in fibers, the position of the zero dispersion wavelength can indicate the expected behavior.

In the Raman effect, a strong pump beam coupled into the fiber can shake the glass matrix, which emits vibrational mode (so-called optical phonons), and then can provide gain to longer wavelengths. The Raman effect can be self-phase matched, and hence the process does not generally require tuning and it can be more-or-less independent of wavelength (the gain coefficient does scale inversely with wavelength, however). One attribute of the Raman effect is that a number of optical phonons can be emitted, or the wavelength can be shifted down through a cascaded Raman process sequentially to longer and longer wavelengths. This emission of a plurality of phonons to shift more than one Raman order is the CRWS phenomena that can be observed in the normal dispersion regime.

Either pure continuous wave (CW) light or quasi-CW light, such as nanosecond or longer pulses, are generally unstable when launched in the anomalous dispersion regime. In particular, the interaction between the nonlinearity and anomalous dispersion can break the quasi-CW inputs into a train of solitons in a process called modulational instability. MI can be considered as a parametric four-wave-mixing process in which the non-linearity explicitly enters the phase matching condition. Note that MI for a single pump wavelength generally phase matches in the anomalous dispersion regime. When MI occurs the peak powers reached in the fiber can be much higher than the powers launched in the quasi-CW light, since the quasi-CW background is usually compressed into short pulses. Further, a curvature in the pulse in time or a range of intensities can lead to collision and energy exchange between the MI-generated pulses, which can be advantageous for SC generation.

For pumping in the anomalous dispersion regime, the combined effects of MI and stimulated Raman scattering can lead to SC generation. MI can cause the break-up of the CW light into short temporal pulses such that those nonlinear phenomena that normally occur for pulsed pumping conditions can also contribute to the SC generation. In contrast, for normal dispersion pumping, CRWS generally occurs first in the fiber, since MI does not generally phase match for a single pump wavelength. As the higher Stokes orders fall into the anomalous-dispersion regime, MI can occur and lead to SC generation.

Because of the relevance of the group velocity dispersion (GVD) for determining the nonlinear behavior observed, a brief review is provided of fiber dispersion. GVD arises because different frequencies of light travel at different speeds in an optical fiber. The total GVD in the fiber is generally the sum of the material dispersion and the waveguide dispersion $D_{total} \approx D_m + D_w$. The zero dispersion wavelength of a fiber $\Lambda_0$ corresponds to the wavelength where the total dispersion crosses through zero.

The waveguide dispersion arises because the mode distribution between the fiber's core and cladding changes with wavelength. In a solid core fiber, the waveguide dispersion is usually negative, and, therefore, can generally shift the zero dispersion wavelength to longer wavelengths. It should be noted that in microstructure fibers, the zero dispersion wavelength can be shifted to any desired wavelength. Therefore, microstructure fibers can be useful for matching the zero dispersion wavelength to the laser wavelength when the laser wavelength falls outside of the usual telecommunications window between ~1.3 and ~1.6 microns.

The material dispersion curves for different fibers tested in the exemplary experiments are illustrated in FIG. 1. In particular, the curves are calculated from published index-of-refraction for different glasses. The index is given analytically and the dispersion, which is proportional to the second derivative of the index, is calculated numerically. For fused silica fiber 110, the zero dispersion wavelength can be close to 1300 nm, corresponding to the material dispersion zero. Using dispersion shifted fibers, the zero dispersion wavelength can be shifted to longer wavelengths. For fluoride fibers 120, the zero dispersion wavelength can be calculated to be approximately 1620 nm. Note that the dispersion slope for the fluoride fiber appears to be much flatter than for fused silica fiber. The calculated dispersions for chalcogenide fibers, such as the sulfide fiber 130 and selenide fiber 140 show a zero dispersion wavelength beyond 5 microns.

Figure 2:
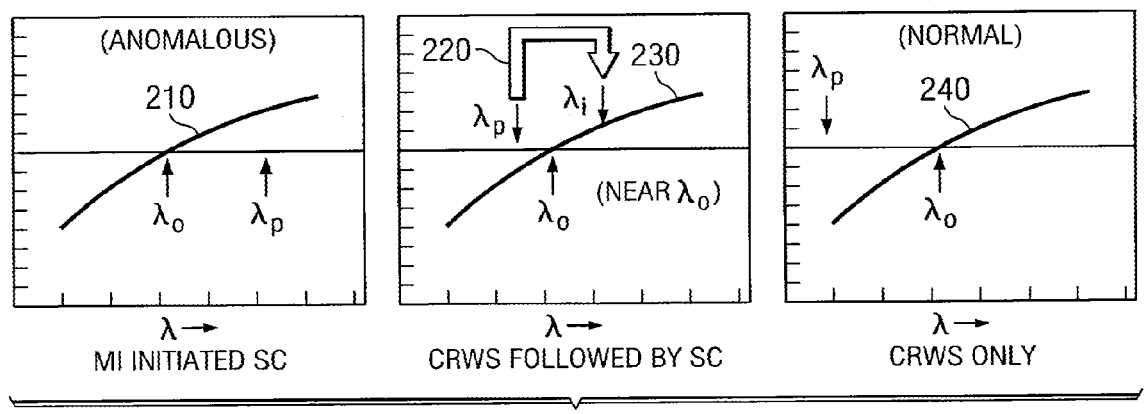
FIG. 2 illustrates different positions of the pump and zero dispersion wavelength for (a) fused silica fiber; (b) fluoride fiber; and (c) chalcogenide fiber.

Based on the theoretical discussion above and the exemplary use of a pump wavelength near 1553 nm, the behavior for different fiber types illustrated in FIG. 1 can be predicted. In fused silica fiber, MI-initiated SC generation is expected (FIG. 2A). For the fluoride fiber, at first cascaded Raman wavelength shifting is expected 220, but after one or two Stokes orders SC should be generated (FIG. 2B). Finally, for the chalcogenide fibers, CRWS is expected out to beyond 5 microns (FIG. 2C).

Figure 3:
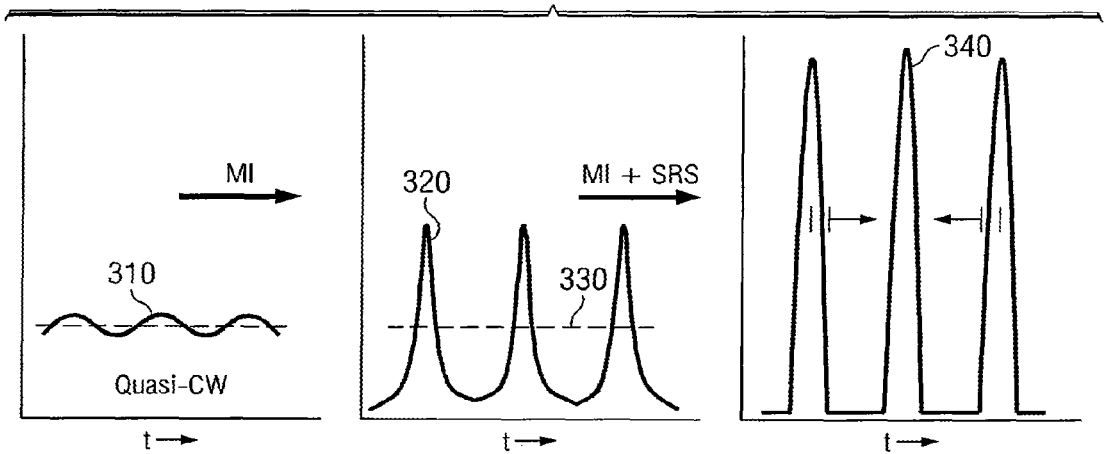
FIG. 3 illustrates modulational instability in the time domain.

Because of the relevance of modulational instability (MI), a brief review is also provided next. MI can be a parametric four-wave-mixing process in which the anomalous group velocity dispersion and nonlinearity generally work together to turn CW or quasi-CW light into short pulses. MI can lead to a significant system simplification in SC generation because the CW or quasi-CW light can evolve into narrow and high peak power soliton pulses, thus reducing or limiting the need for modelocked lasers for SC generation. As a simple illustration, FIG. 3 shows the time domain evolution of quasi-CW pulses in the anomalous dispersion regime. Noise perturbations (such as different longitudinal modes from the laser diode or the amplified spontaneous emission from the optical amplifiers) can cause temporal perturbations to grow 310, leading to the formation of a train of soliton pulses 320 through MI. As an alternative technique, a seed laser at a wavelength separated from the pump can be used to initiate MI. Then, the combined effect of MI and stimulated Raman scattering (SRS) can lead to the red-shifted pulses to move with respect to the blue-shifted pulses, causing a further increase in the peak intensity 340. If the intensity is nearly flat, then a train of solitons could be generated, but these pulses may not move with respect to each other. If the pulses have a non-uniform temporal profile or if an intensity modulation is introduced on the pump light, then the non-uniform pump intensity can lead to movement of the MI-generated pulses with respect to each other. Then, energy exchange can occur between the pulses through the Raman effect.

Figure 4:
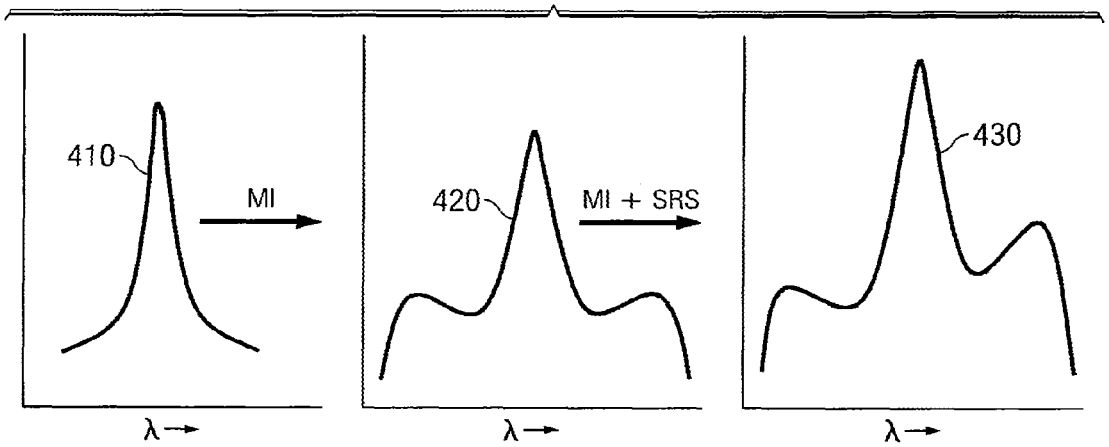
FIG. 4 illustrates modulational instability in the frequency or wavelength domain.

FIG. 4 illustrates the spectral domain evolution corresponding to the time-domain description of FIG. 3. The original laser frequency is given by 410. MI can lead to the generation of sidebands on the Stokes and anti-Stokes side of the original laser frequency 420. Although only one set of sidebands are illustrated, in general there can be several sideband frequencies generated approximately symmetrically around the original laser beam. Then, when MI and SRS interact, SRS leads to a transfer of energy from the short wavelength side to the long wavelength side 430.

Figure 5:
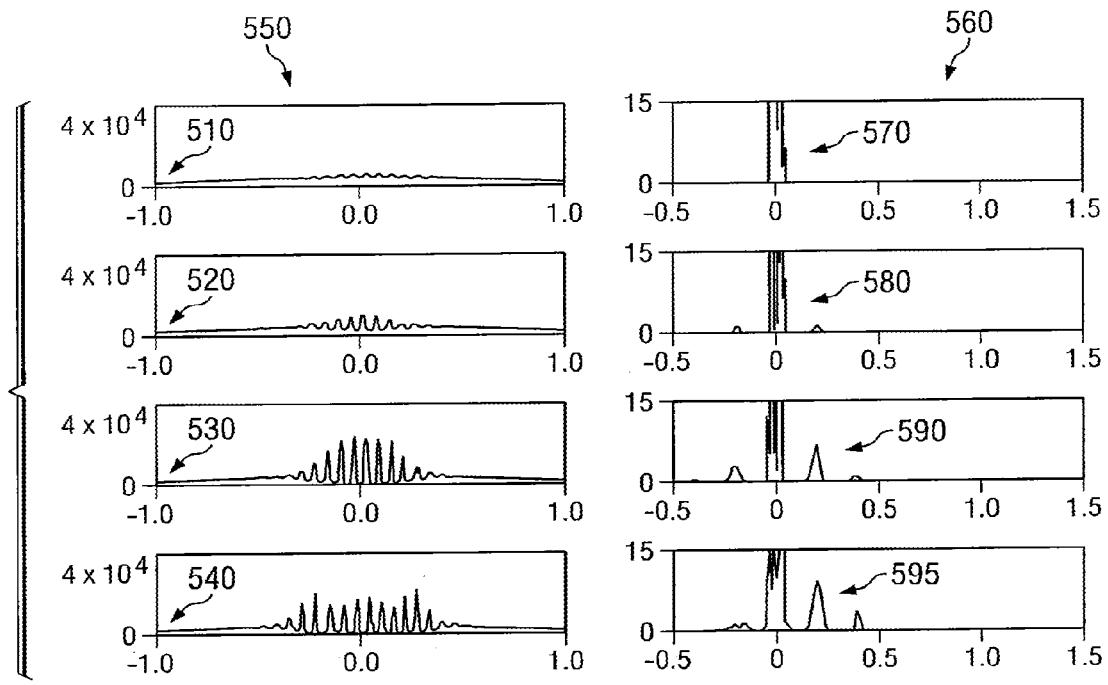
FIG. 5 illustrates simulations of pulse propagation in fiber.
Figure 6:
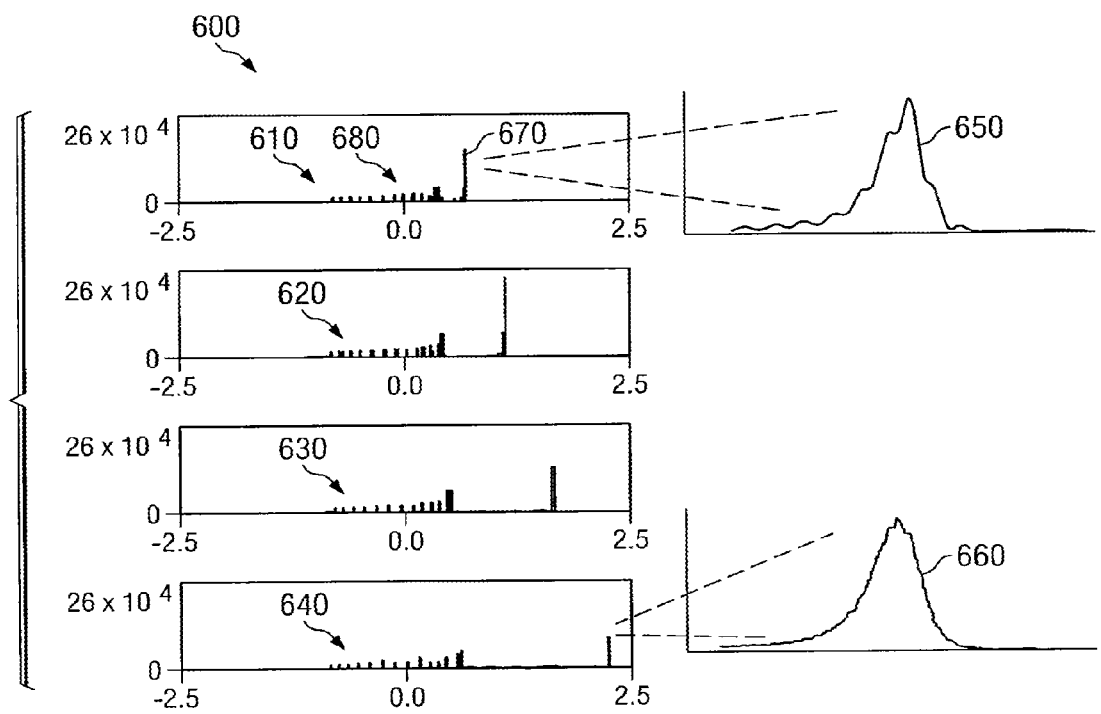
FIG. 6 illustrates simulations of pulse propagation in longer fiber lengths.

The dynamics of the collision of soliton pulses can be quite complicated, and it may be easier to illustrate through computer simulations. As an example, FIGS. 5 and 6 show simulations of the break-up of quasi-CW pulses and then the onset of SC generation. FIG. 5 shows the initial break-up of the quasi-CW pulse 510 into solitons 540, and then the shift in energy to the longer wavelength side through SRS (left side 550 is time domain, right side 560 is frequency domain). FIG. 6 shows the time-domain collision process further down the fiber, as the onset of continuum generation is seen on the computer. The red-shifted pulses 670 travel through the blue-shifted pulses 680 because of the anomalous GVD, and then the red-shifted pulses 670 can rob energy from the blue-shifted pulses 680 through SRS (also sometimes called the soliton self-frequency effect). As FIG. 6 illustrates, relative motion between pulses can lead to collision and the consequent exchange of energy between pulses. Thus, a non-uniform temporal profile or an intensity modulation of some sort may be required to cause high peak power pulses that lead to SC generation. This complicated collision process can give rise to narrow, high peak power pulses 670, 650, 660, which are responsible for the SC.

The simulations of FIG. 6 also show that asymmetric pulses 650, 660 can arise from the soliton collision process. The asymmetry in the resulting pulses can also lead to an asymmetric spectrum. For instance, it is known that self-steepening of pulses can lead to a larger frequency broadening on the blue-side of the spectrum (i.e., the short wavelength side of the spectrum). Moreover, asymmetric temporal profiles of pulses lead to asymmetric spectral broadening through self-phase modulation. It should also be noted that the four-photon process is in energy, rather than wavelength. Thus, two pump photons can lead to the generation of Stokes and anti-Stokes photons.

Whether CRSW or MI is first seen in the fiber generally depends on the threshold for the different nonlinearities. For instance, in fused silica fiber the MI threshold can be ~5× less than the Raman threshold. There are generally two components for the Kerr nonlinearity $n_2$: ~4/5 of $n_2$ is electronic in nature (instantaneous and arising from the UV resonances), while ~1/5 of $n_2$ is from Raman-active vibrations (imaginary part of this is the Raman gain coefficient). Whereas MI usually benefits from the full $n_2$, CRWS usually only benefits from the Raman-active vibrations. However, the Raman effect is generally self-phase matched, while MI usually requires phase matching. Moreover, MI phase matches for a single pump wavelength typically in the anomalous group velocity dispersion regime. Therefore, in the normal dispersion regime CRWS usually has a lower threshold and MI does not usually phase match for a single pump wavelength. On the other hand, in the anomalous dispersion regime MI can have a lower threshold, and it can initiate the pulse break-up that gives rise to SC generation through a combination of SRS, self-phase modulation and other nonlinearities.

Although particular examples of physical phenomena have been described for MI or CRWS and subsequent SC generation, other techniques are also possible for MI, CRWS and SC. As one particular example, the use of multiple pump wavelengths can lead to MI and SC even in the normal dispersion regime. As another example, the pulse break-up through MI may not need to be as thorough as shown in the simulations to lead to SC generation. Thus, many other combinations of physical phenomena can lead to MI, SC and CRWS.

Pump Laser for Testing Nonlinear Shifting in Various Fibers

As one particular embodiment, experiments have been conducted on nonlinear wavelength shifting in different fiber types, including fused silica (high-nonlinearity fiber—HiNL—as well as dispersion compensating fiber), chalcogenide fibers (arsenic-tri-sulfide), and fluoride (heavy metal fluoride ZBLAN—$ZrF_4$—$BaF_2$—$LaF_3$—$AlF_3$—NaF). For the experimental embodiment, the pump set-up uses a pulsed laser diode (~1.8 nsec pulses near 1553 nm) followed by several stages of erbium-doped fiber amplifiers. Peak powers up to ~3 kW can be generated by altering the duty cycle of the laser diode from a few hundred kHz down to 5 kHz.

Figure 7:
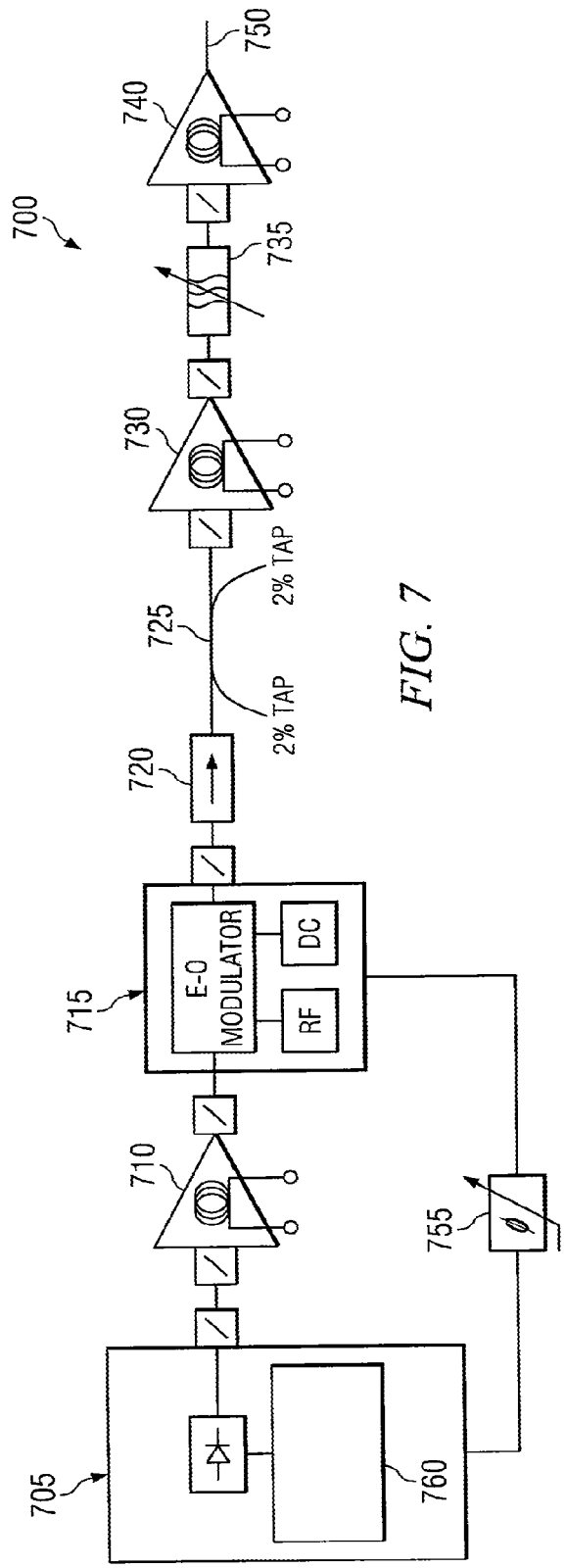
FIG. 7 illustrates the experimental set-up for a particular embodiment of the pump laser.

The experimental configuration for the pump laser used to test the different fibers is shown in FIG. 7. Light originates from a distributed feedback (DFB) laser diode 705 at 1553 nm. This light is amplified in a low-noise pre-amplifier 710, which comprises an erbium-doped fiber amplifier (EDFA). The light is boosted in a power amplifier 740 at the last stage. In between, filters 720, 735 and modulators 715 are used to control the amplified spontaneous emission (ASE).

The set-up 700 emulates a Q-switched laser system. Although the laser diode cannot easily be Q-switched, the EDFAs have a long upper state lifetime and store up energy between pulses. Thus, a low duty cycle during which the laser diode is turned on can lead to a larger energy per pulse. However, an ASE problem arises because when the laser diode is off, the optical amplifier continues to be pumped and ASE is emitted by the EDFAs. This ASE leads to inefficiency because it can deplete some of the energy from the power amplifier, which ideally would store up more energy before the next laser diode pulse passes.

To solve this problem, one solution that can be used is to block the ASE during the times that the laser diode is off. As a starting point, the experimental configuration of FIG. 7 can be used to reduce the ASE background. A fiber pigtailed modulator 715 can be placed between the pre-amplifier 710 and the power amplifier 730, 740. The modulator window can be synchronized to the laser diode drive 760, and the delay to the pre-amplifier EDFA can be compensated by using a variable electrical delay line 755. The modulator 715 is placed initially at the mid-stage point to optimize the noise figure of the overall amplifier. Also, a low-power EDFA 730 is added after the modulator 715 to compensate for the modulator insertion loss. A tunable spectral filter 735 is also used to limit the out-of-band ASE entering the power amplifier 740. Finally, the light is coupled to the high-power EDFA stage 740. As an alternative, the modulator can be eliminated by using narrow-band, fiber grating based filters to minimize the effect of the ASE. The temporal modulator is used in this particular embodiment. However, there are many other embodiments and methods of controlling the level of ASE from the amplifier. As another example, narrow band filters or add/drop multiplexers could be used to control the ASE contribution. In other embodiments, the length of gain fiber and the direction and number of pumps could be optimized to minimize the level of ASE.

A second problem that may arise in the last stage power amplifier is nonlinear fiber effects, which then can limit the useable power from the pump system. The last amplifier stage comprises as an example two WDM couplers (for coupling in and removing any residual 980 nm pump) surrounding a highly-doped, large core size, single spatial mode EDFA gain fiber. The gain fiber is selected in this instance to minimize the nonlinear limitations in the final amplifier stage. For example, the high doping level means that a short fiber length can be used, and the large core size means that the intensity is kept as low as consistent with a single spatial mode. In this particular embodiment, the power amplifier uses a ~1.2 m length of gain fiber, and a forward pump is used in addition to a backward pump. With this set-up, the peak power for 5 kHz repetition rate approaches ~2.5 kW without any significant nonlinear effect in the amplifier.

One aspect of using nanosecond pulses with peak powers up to ~2-3 kW is that the average power can be scaled up by increasing the repetition rate and using larger lasers, such as cladding pumped fiber amplifiers or lasers. For example, average powers in the range of 1 kW to 15 kW are available from commercially available cladding-pumped fiber lasers. Moreover, fiber lasers can be modulated or Q-switched or a modulator can be placed after the fiber laser to generate nanosecond pulses relatively easily. Cladding pumped fiber lasers can operate at a number of wavelengths. For instance, ytterbium-doped cladding pumped fiber lasers operate near 1 micron, erbium-doped cladding pumped fiber lasers operate near 1.55 microns, and thulium-doped cladding pumped fiber lasers operate near 2 microns. Alternatively, the laser could a solid state laser or a diode-pumped laser. Although a few examples of high power lasers are mentioned above, many other lasers can be used consistent with the scope of this disclosure.

In one particular embodiment, a high power pump can comprise a seed laser diode that may be modulated followed by several stages of amplifiers that are single-mode fibers or cladding pumped fiber amplifiers. For example, the first stage pre-amplifier can be a single-mode fiber, such as an erbium-doped fiber amplifier. Then, the power amplifier can comprise one or more stages of cladding-pumped fiber amplifiers. In a cladding pumped fiber amplifier, the pump propagates through a fiber cross-sectional area that is typically larger than a signal cross-sectional area. A cladding-pumped fiber amplifier may comprise a fiber with a core for a signal and the pump that zig-zags through the signal and provides gain. As one particular example, the cladding-pumped fiber amplifier may be a double clad fiber, with the signal propagating through the core and the pump propagating through the inner cladding. For high gain systems, the cladding-mode fiber amplifier may also be a large mode area fiber, which generally means that the core is large enough to support several modes. The cladding-pumped fiber amplifier can be doped with erbium or a combination of erbium and ytterbium. Spectral and/or temporal filters may be advantageously used between different amplifier stages to control the level of amplifier spontaneous emission. Also, particularly in the last few stages of amplification, it may be advantageous to counter-propagate the pump from the signal, thereby reducing the nonlinear effects in the amplifier.

Figure 8:
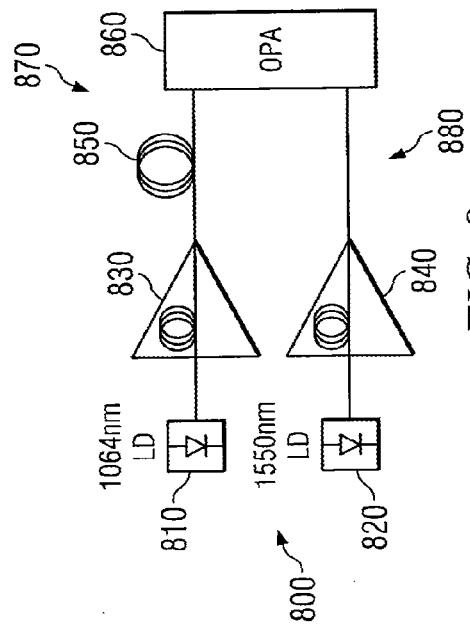
FIG. 8 illustrates a high power pump experimental configuration.

In one preferred embodiment, the pump laser 800 can be a modulated laser diode 820 followed by a parametric amplifier 860. For example, FIG. 8 illustrates a cladding pumped optical parametric amplifier system 800 that can generate peak powers in excess of 10 kW with nanosecond pulses. The configuration comprises laser diodes 810,820, cladding pumped ytterbium-doped fiber amplifiers 830, and an optical parametric amplifier 860. The top arm 870 of FIG. 8 corresponds to the pump, while the bottom arm 880 corresponds to the signal seed. In particular, a laser diode 810 (either Fabry-Perot or distributed Bragg reflector—DBR) launches the pump light at approximately 1064 nm. This is first passed through a pre-amplifier, which comprises a single-mode fiber doped with ytterbium. Then, the output of the pre-amplifier is sent to a power amplifier, which comprises a cladding-pumped, multi-mode ytterbium-doped fiber amplifier 850. The power amplifier is purposely made with a large core fiber so as to enable high power amplification (i.e., large gain volume) while minimizing nonlinear effects (i.e., large effective area).

The signal seed originates in the lower arm 880 from a 1550 nm laser diode 820, such as a DBR, DFB or Fabry-Perot laser diode. The light from the seed laser diode 820 is pre-amplified in a single-mode, EDFA 840 in this embodiment. Then, the about 1550 nm seed is boosted in a power amplifier, which in this preferred embodiment is an optical parametric amplifier 860 (OPA). The OPA 860 comprises a periodically-poled lithium niobate crystal in a preferred embodiment. The OPA crystal can be in length between several millimeters to several centimeters. The pump at 1064 nm 850 and the seed at 1550 nm 880 are made collinear through the OPA crystal 860, and the 1550 nm light is power amplified through the OPA process. Although one example of the OPA is discussed here, many other power boosting methods can be used within the scope of this disclosure.

Another aspect of the laser is that it is relatively simple to modulate the mid-IR light or the SC light. Rather than implementing a mid-IR modulator or a very broadband modulator, the modulation can be done on the pump laser. For example, the pump laser can be modulated directly (i.e., modulating the pump laser diodes or the power supply) or externally modulated (i.e., place a modulator after the pump laser). Then, in the SC generation process, the modulation is transferred to the entire broadband spectrum. In other words, all of the optical processing can be performed at the pump wavelength, and then the light can be shifted to other wavelengths in the last step. This approach is particularly attractive when the pump laser is at a telecommunications wavelength, since many modulator technologies are available for telecom wavelengths.

The pump laser described above is just one embodiment of the pump laser, but many other pump lasers can be used. For example, the pump laser can be a cladding-pumped fiber amplifier or laser, a diode-pumped solid state laser, or either of the lasers followed by a cascaded Raman wavelength shifter. The cascaded Raman wavelength shifter may be an open loop piece of fiber, or cascaded resonators formed by placing gratings on one or more ends of the fiber. Thus, many different configurations for the pump laser can be used consistent with the SC or wavelength conversion process.

To generate light in the mid-IR, one exemplary strategy is to test a number of different kinds of fibers. The starting point may be to use fused silica ($SiO_2$) fiber, since it is of the highest quality and because it is the best characterized fiber. For example, fused silica fiber is the basis of most fiber optics communications. In addition, fused silica fiber has among the highest damage threshold (~50 MW/cm$^2$), which means that it can extend to the highest output powers. Moreover, the physics of fused silica is well understood and the parameter values can be measured carefully, permitting detailed understanding of the mechanisms behind SC generation and wavelength conversion. Furthermore, the dispersion can be tailored in fused silica fiber, different types of fibers can be spliced together to create a particular dispersion profile, and more exotic fiber geometries, such as photonic crystal fibers or microstructure fibers, can be implemented in fused silica.

Although fused silica is the starting point, the transmission of fused silica is limited in the mid-IR. Therefore, with the understanding gained from fused silica, the next step in the strategy can be to use fibers that transmit in the mid-IR. One attractive candidate for mid-IR transmission is ZBLAN fluoride fibers. These fibers have been made single and multi-mode for over 25 years. They have been used extensively in telecommunications, for example as praseodymium-doped fiber amplifiers and erbium-doped fluoride fiber amplifiers. The fluoride fibers also have relatively low loss and relatively high damage threshold (depending on the impurity concentration, typically between ~10 to ~20 MW/cm$^2$). Furthermore, by adjusting the composition of the fluoride fibers, the low-loss transmission band can be extended out to between ~4.5 microns and ~5.5 microns.

Beyond ZBLAN fluoride fibers, other fibers or waveguides could also be candidates for mid-IR light generation. As one example, tellurite fibers ($TeO_2$) can be used as mid-IR fibers. Tellurite glass compositions show enhanced Raman scattering behavior. By optimizing these oxide glass compositions with heavy-metal-oxides, fiber can be made that have high nonlinearity with transparency in the mid-IR wavelength range. Moreover, the tellurite fibers have been measured to have a damage threshold of ~13 GW/cm$^2$. Other examples of mid-IR fibers include chalcogenide fibers (telluride, sulfide, selenide, as particular examples), sapphire fibers, AgBrCl fibers, etc.

As another example, silicon or other semiconductor waveguides could be used to generate mid-IR light. Silicon waveguides are expected to transmit light over the entire mid-IR wavelength band. Also, by making curves or S-type (i.e., waveguide going back and forth three times on a chip), relatively long lengths (i.e., several or tens of centimeters) of waveguide can be used. The use of silicon or other semiconductor waveguides is particularly effective if a pre-stage of fused silica fiber is first used to initiate the MI (discussed further below). In this case, the semiconductor waveguide serves primarily as the transparent, nonlinear element to lead to spectral broadening.

Although particular fiber types or waveguide structures have been described for advantageously generating super-continuum, other materials, compositions and guided wave structures can be used consistent with the disclosure.

SC Out to Mid-IR in Fused Silica Fiber

The exemplary experiments use different lengths of fused silica fiber, which are a series of high-nonlinearity (HiNL) fibers made by Corning. The fibers have a zero dispersion wavelength between ~1500 nm and ~1950 nm. Some of the fibers had extra drying steps to remove to the extent possible the OH content, using steps that are commercially done for SMF-e Corning fiber. Lengths ranging from 1 to 13 m provide the broadest width of super-continuum in these particular experiments. Although these particular lengths were used in the experiments, other lengths can be used within the scope of the disclosure.

Figure 9A:
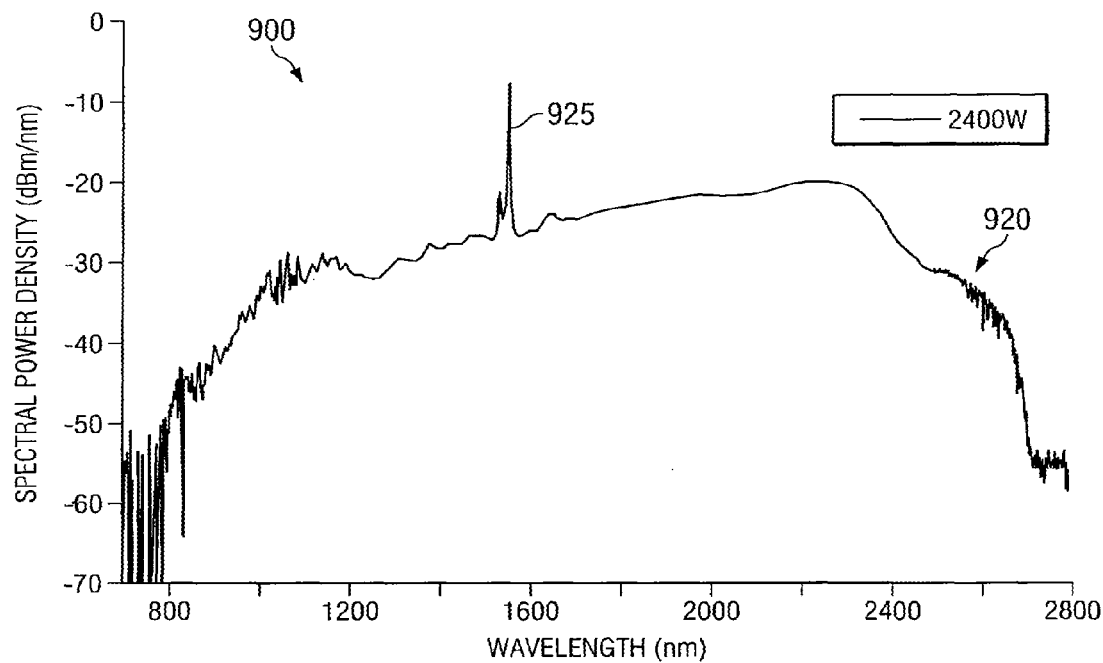
FIG. 9A illustrates the spectrum from high nonlinearity fiber with a zero dispersion wavelength of ~1544 nm. with 3 m length of non-dried fiber.

As an example of the SC spectrum from fused silica fiber, FIG. 9A shows the spectrum obtained 920 at ~2.4 kW peak power in a 3 meter length of HiNL fiber. For this particular fiber no additional drying steps were taken to reduce the OH content, so a large OH absorption line may be expected around 2.7 microns. At this pump power, the spectrum 920 is seen to stretch from ~0.85 nm to ~2600 nm (2.6 microns). The features 925 around 1553 nm are the residual pump from the laser diode, and the peaks near 1530 nm are due to the ASE from the EDFA's. A fairly smooth spectrum 920 is observed over the large spectral range. One reason for the edge of the spectrum around ~2600 nm might be that the edge of the water absorption line is responsible for the cut-off. Another reason might be that at these long wavelengths the modes are weakly guided, and, hence, they are much more susceptible to bend induced loss.

Figure 9B:
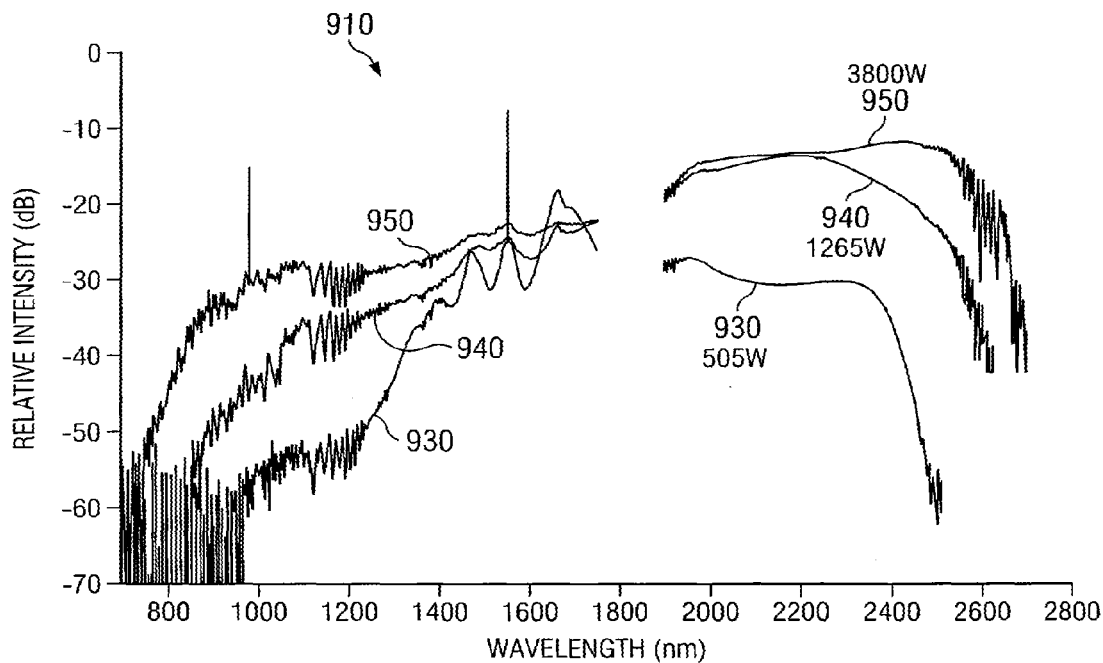
FIG. 9B illustrates the spectrum from high nonlinearity fiber with a zero dispersion wavelength of ~1544 nm. with 5 m length of extra-dried fiber.

To reduce the effects of bend-induced loss, the fiber can be laid out loosely. To reduce the effects of water absorption, the fibers can be dried using techniques used in commercial fibers, such as Corning's SMF-28e fiber or Lucent's (now OFS Fitel's) All-Wave fiber. To test this hypothesis, a new batch of HiNL fibers were made that were treated using the extra drying steps. As an example, FIG. 9B illustrates the SC spectrum from 5 meter length of extra-dried, HiNL fiber with zero dispersion wavelength around 1544 nm. The spectra 930, 940, 950 are shown as a function of different pump powers, and the spectrum is observed to reach out to ~2700 or ~2800 nm. Therefore, the extra drying steps to enable the expansion to the longer wavelength side by about 100 to 200 nm. The HiNL fibers used in these experiments have a nonlinearity about 9 times larger than standard SMF-28 fused silica fiber.

The edge of the SC spectrum could potentially be due to the vibrational absorption in the fused silica glass. If the edge of the spectrum is limited by the fiber loss, then it would be consistent that the spectrum might extend to longer wavelengths if the fiber length were to be reduced. However, sufficient fiber length is required to generate the full spectrum as well. In other words, there is a minimum length required to generate the spectrum, but then further propagation in the lossy fiber only reduces the long wavelength edge of the spectrum.

Figure 10A:
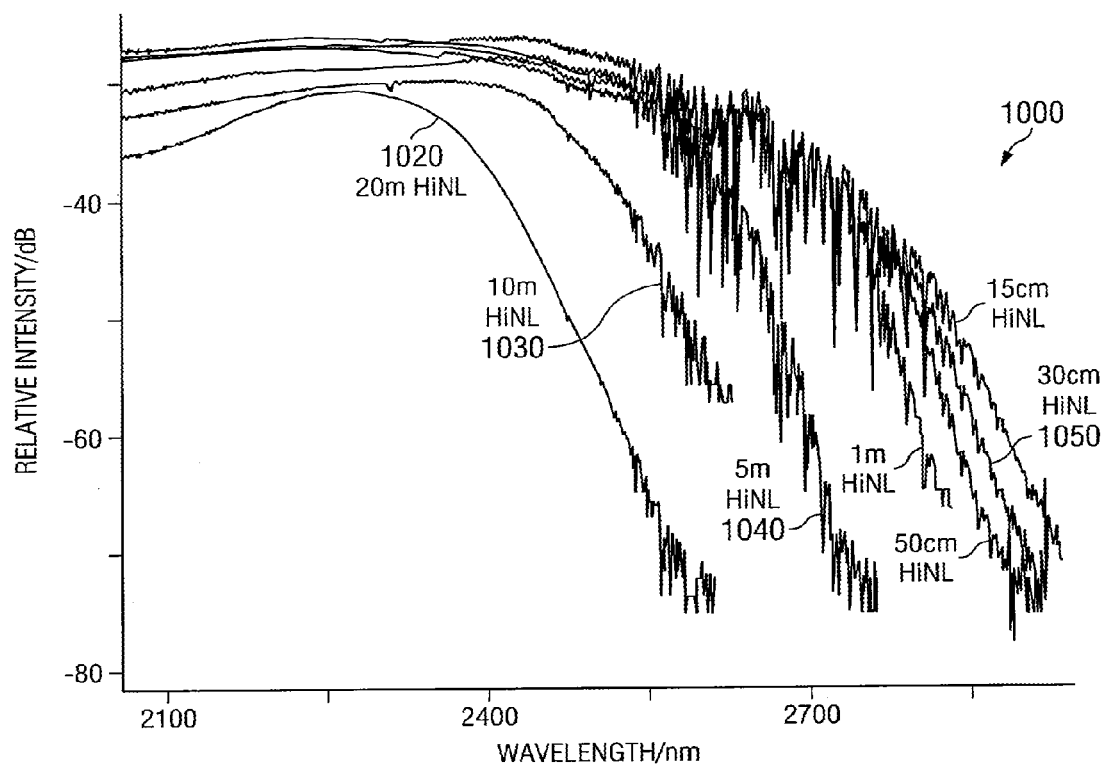
FIG. 10A illustrates the spectrum as a function of high nonlinearity fiber length following a ~2 m length of SMF fiber.

To understand this fiber loss limited spectrum further, a series of experiments were conducted at a pump peak power of ~3 kW. First, an ~2 m of standard single-mode fiber (SMF-28) is used to cause the nanosecond pulses to break up through MI. In fact, at these power levels SC can be already generated in the SMF fiber, with a reach out to ~2500 nm. Then, the output of the SMF fiber is coupled to different lengths of HiNL fiber with a zero dispersion wavelength near 1544 nm. The data 1000 is illustrated in FIG. 10A. The fiber length is varied from 20 m 1020 to 10 m 1030 to 5 m 1040 to 1 m and shorter 1050. As the fiber length is reduced, the long wavelength edge of the SC appears to push out to longer wavelengths. The levels of the SC are also plotted correctly relative to each other. In other words, as the fiber length is reduced, not only does the long wavelength edge appear to push out, but also the level of the SC can increase. The broadest spectrum is reached with about 15 cm of HiNL fiber, where the spectrum reaches beyond ~2800 nm. The total spectrum 1010 from the ~2 m of SMF plus 15 cm of HiNL is plotted in FIG. 10B.

Figure 10B:
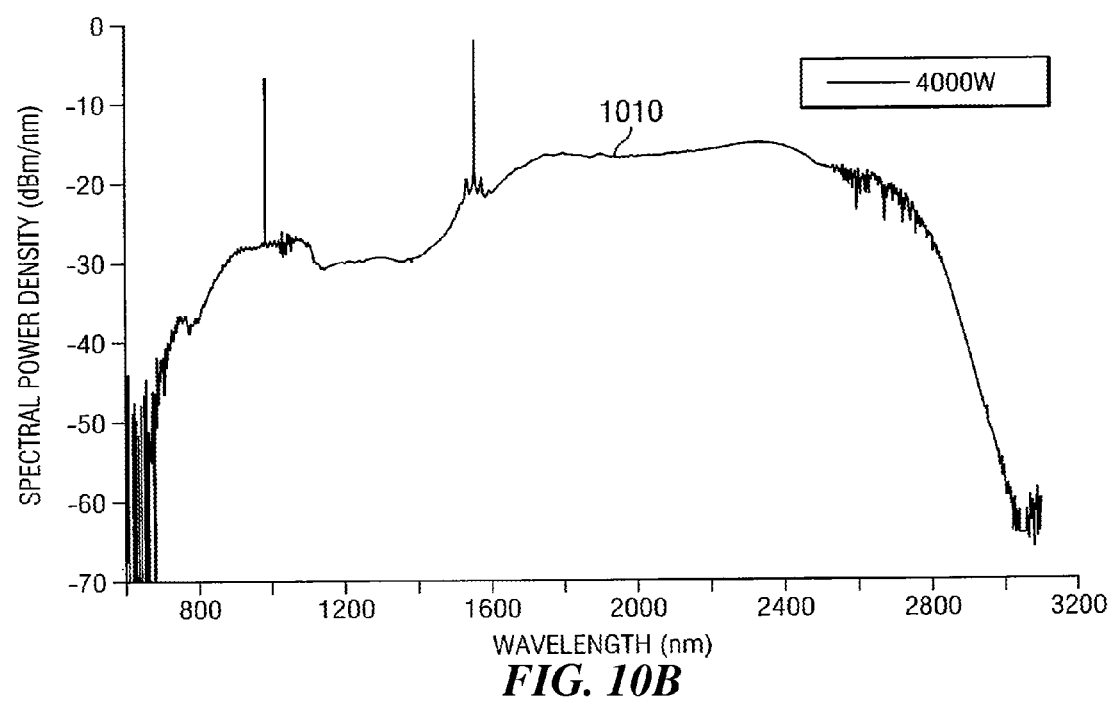
FIG. 10B illustrates the complete SC spectrum from ~2 m SMF plus 15 cm of high nonlinearity fiber.

The spectra of FIG. 10A and FIG. 10B illustrates why others performing SC experiments may not have reached out as far in wavelength as the experiments described. Since the generation appears to be loss limited at the long wavelength side, the fiber length should be long enough to generate the spectrum through nonlinear effects, but not longer than that. In other words, optimizing the length of the fiber can be a procedure that can help to generate spectra as far as possible on the long wavelength side.

Figure 11A:
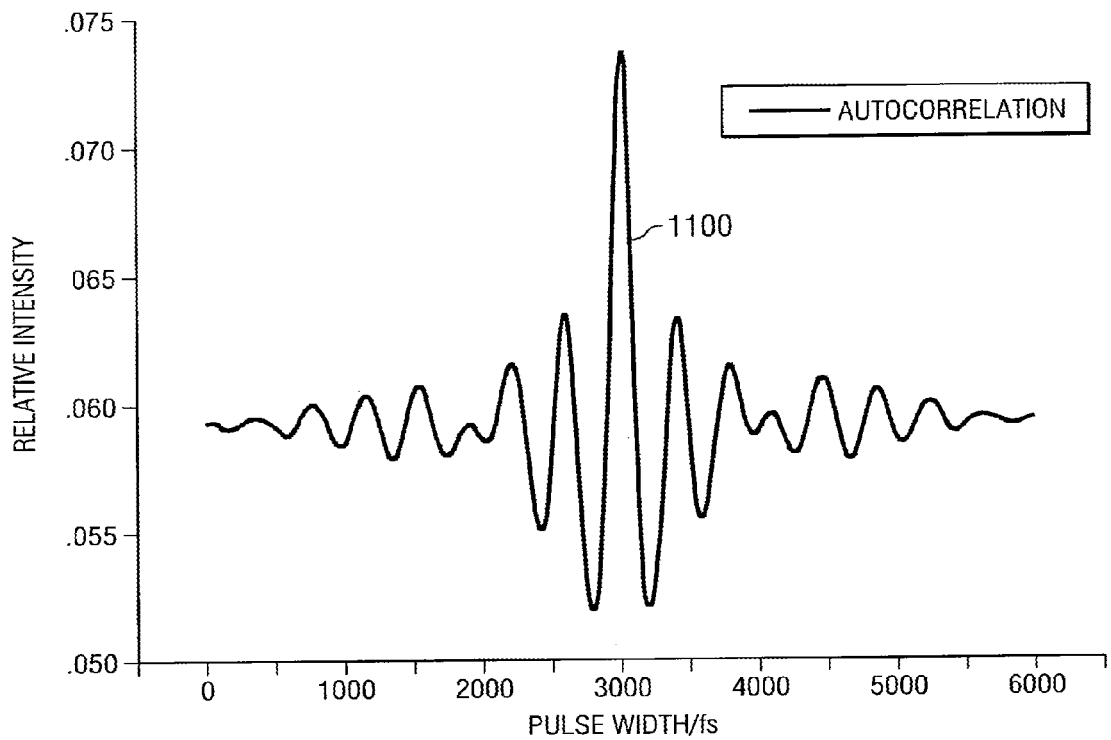
FIG. 11A illustrates autocorrelation showing the pulse break-up through modulational instability after 3 m of SMF at 1 kW peak power.
Figure 11B:
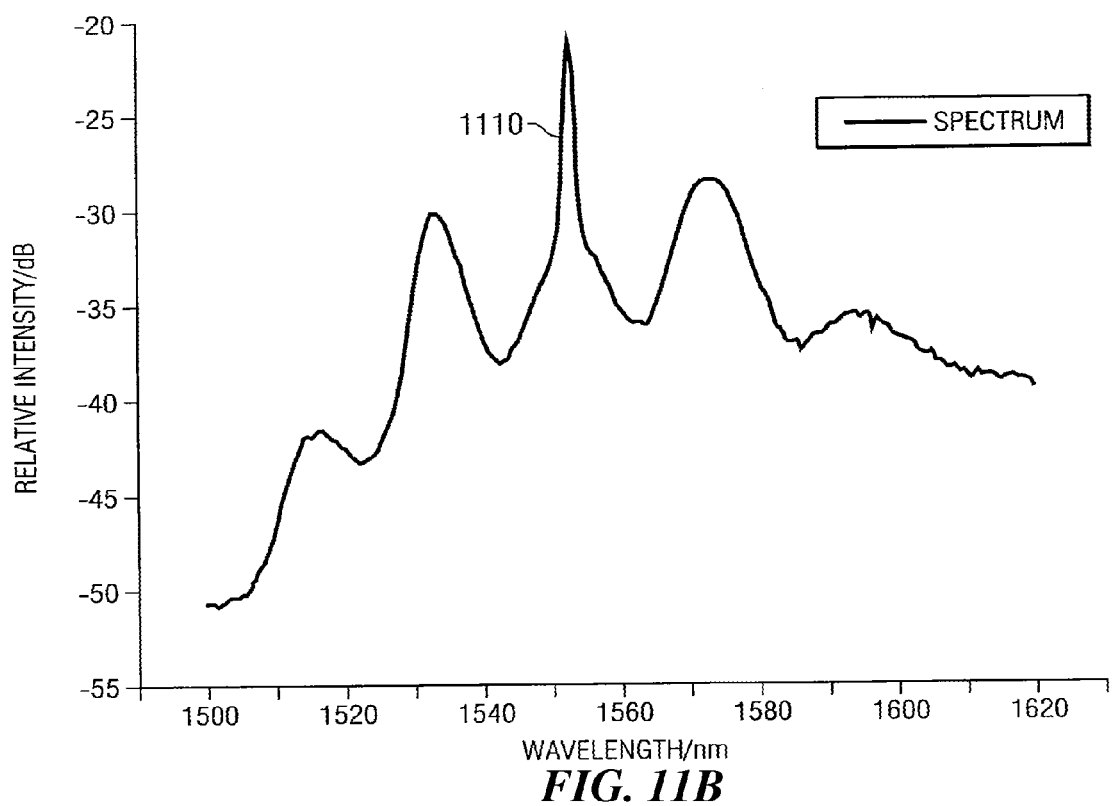
FIG. 11B illustrates the spectrum for the same case as FIG. 11A with 1 kW peak power.

The data of FIG. 10A and FIG. 10B also suggests a strategy or recipe for generating the SC. First, a pre-stage of standard single mode fiber (SMF) can be used to break-up the pulses through modulational instability. Although SMF is used in this example, the fiber can be any number of fibers that exhibit MI, such as fibers who fall into the anomalous dispersion regime at the pump wavelength. To illustrate the pulse break-up, FIG. 11A shows the autocorrelation 1100 of the pulse at the output of a 3 m length of SMF for 1 kW peak power, and FIG. 11B shows the spectrum 1110 at the output of the same fiber. As can be seen, wavelength sidebands are generated by MI, which causes the pulse to have undulations with pulse widths down into the sub-picosecond range. Different power levels can experience break-up in different fiber lengths. For instance, if the peak power is closer to ~3 kW, then the optimal length for pulse break-up is closer to ~1 m of SMF. Thus, in the pre-stage fiber it is desired to have a break-up of the CW or quasi-CW pulses into shorter pulses through MI, but not the complete generation of the SC spectrum. In other words, the pre-stage fiber and the MI phenomena serve to emulate the picosecond or femtosecond pulses that are normally used to generate SC, but the natural physics of the fiber can accomplish the pulses without the need for expensive and complicated modelocking schemes.

The second step of the strategy or recipe can be to use a nonlinear element with at least partial transparency over the wavelength range of interest to broaden out the spectrum and to smoothen the spectrum into a SC. As one example, the dominant mechanism in the second stage can be self-phase modulation, where the nonlinearity for the high peak power pulses leads to spectral broadening. In addition, the Raman effect can also be effective in transferring energy from the short wavelength side to the long wavelength side, or more generally from shorter wavelengths to longer wavelengths. In the case of fused silica fiber, the second stage can be a relatively short length of HiNL fiber, as shown in FIG. 10A and FIG. 10B. Alternately, the fiber can be a ZBLAN or fluoride fiber that can permit generation of light further out to closer to ~4.5 microns. Other examples of nonlinear elements that can be used in the second stage include chalcogenide fibers, silicon waveguides, tellurite fibers, and other semiconductor waveguides. Alternatively, hollow core fibers can be used, where a nonlinear material, such as $CS_2$ or nonlinear gasses, can be used to fill the hollow core.

Although a two stage strategy or recipe is given as an example, more steps can be used to optimize the SC generation. For example, the first stage can be a set of fibers spliced or coupled together to achieve a particular dispersion profile. In one preferred embodiment, the fibers can be coupled to achieve a dispersion decreasing or dispersion increasing profile. Moreover, a number of stages of the nonlinear element can be used. In one preferred embodiment, the transparency region can be expanded in subsequent stages. In another embodiment, single mode as well as multimode fibers can be used in combination to obtain a high output power from the SC generation.

Although these experiments suggest that fused silica can generate SC out to ~2.8 microns, the composition of fused silica can be altered to potentially achieve a wider wavelength range. As one particular example, fibers could be made from synthetic fused silica. For synthetic fused silica, there is a drop in transmission between ~2.6 to ~2.8 microns, which is probably due to the water absorption (OH absorption). The transmission through this wavelength range could be increased by using extra drying steps to minimize the OH content. Note, however, that there can be a transmission window between approximately 3 and 4 microns. Thus, with an appropriate fused silica composition, it may be possible to generate SC out to ~3.6 to ~4 microns. This is just one example of varying the composition, but other compositions of fused silica could also be advantageous for SC generation into the mid-IR.

SC Generation in Fluoride Fibers

For mid-IR generation, fibers that have lower loss than fused silica include chalcogenide fibers, tellurite fibers, and fluoride fibers. One of the more mature of the fluoride fibers is the heavy metal fluoride ZBLAN ($ZrF_4$—$BaF_2$—$LaF_3$—$AlF_3$—$NaF$). One advantage of the fluoride fiber is that the loss coefficient can be more than two orders-of-magnitude lower than chalcogenide fibers over the wavelength range between ~2-5 µm. The Raman gain coefficient can be about ~2-3× larger than in fused silica fiber. Moreover, the peak of the Raman gain falls at ~600 $cm^{-1}$, and fluoride fibers tend to be more mature technology with higher laser damage thresholds and no evidence of photo-darkening. For example, Alcatel and others made erbium-doped amplifiers and praesodynium doped amplifiers based on ZBLAN fiber in the 1980's and 1990's.

Three lengths of ZBLAN fluoride fiber were obtained for exemplary experiments of SC generation. The first fiber is 45 m long with a core diameter of ~5.7 microns and a cladding diameter of 125 microns and a cut-off wavelength of ~1.25 microns. The second fiber is a 85 m length of fiber with a core diameter of ~6.5 microns and a cut-off wavelength at ~1.75 microns. A third fiber is ~20 m long with a core diameter of ~7 microns, a cladding diameter of 125 microns, and a cut-off wavelength of ~2.75 microns (the longer cut-off is achieved by using a higher numerical aperture of ~0.3). For all these fibers the loss between 1.25 and 2.7 microns can be less than 10 dB/km (0.01 dB/m). There is a loss peak around 1 micron and another loss peak centered around 2.9 microns, and at these peaks the loss is between 30-50 dB/km. For the third fiber, the attenuation out to 4 microns is measured to be under 1 dB/m, and the attenuation beyond 4 microns is 1 dB/m at 4.3 microns, 2.25 dB/m at 4.5 microns, and 8 dB/m at 4.8 microns. Based on the experience from fused silica fiber, SC generation should advantageously have a long wavelength edge out to where the fiber has a loss of ~1 dB/m to ~2 dB/m. Therefore, the SC generation may be able to reach out to ~4.5 to ~4.6 microns in the ZBLAN fibers.

Figure 12A:
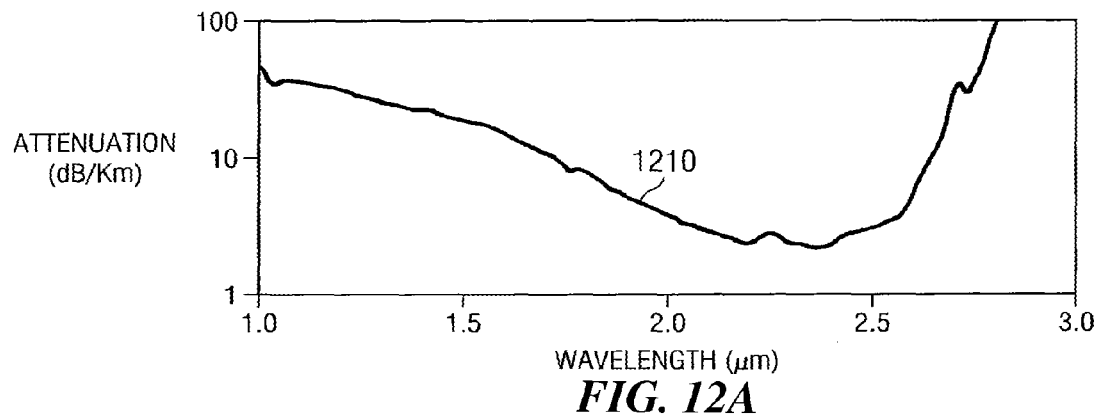
FIG. 12A illustrates the attenuation constant (dB/km) of a 1.25 micron cut-off wavelength ZBLAN fluoride fiber used in the experiments.
Figure 12B:
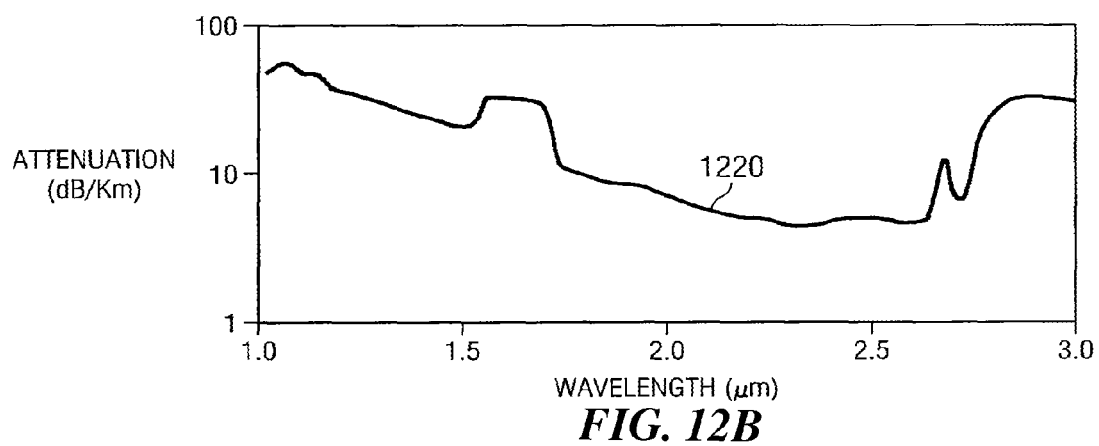
FIG. 12B illustrates the attenuation constant (dB/km) of a 1.75 micron cut-off wavelength ZBLAN fluoride fiber used in the experiments.
Figure 12C:
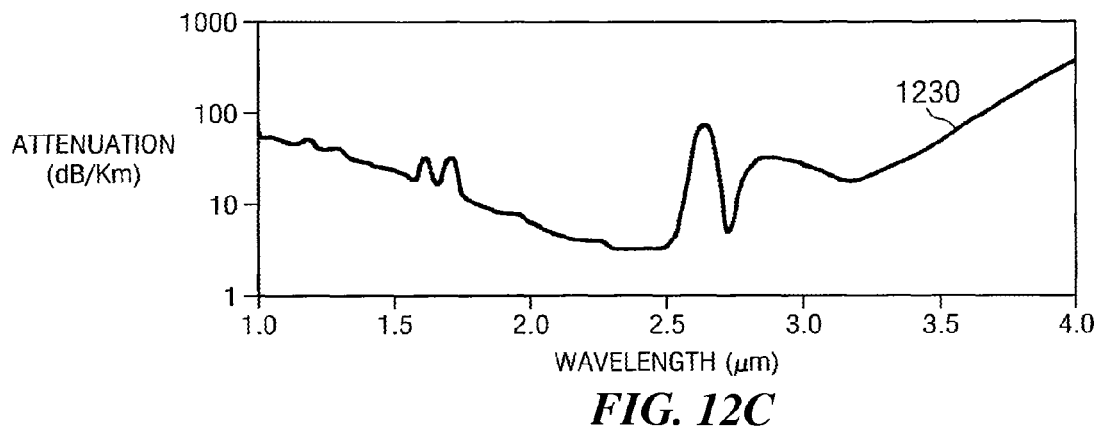
FIG. 12C illustrates the attenuation constant (dB/km) of a 2.75 micron cut-off wavelength ZBLAN fluoride fiber used in the experiments.

The loss spectra measured over a limited wavelength range is shown in FIGS. 12A-C for the three fibers measured to date. As the cut-off wavelength increases, the loss at the longer wavelengths appears to decrease. This may indicate that the loss at the longer wavelength arises at least in part from bend induced loss. The rule-of-thumb for bend induced loss is that the fiber can be well guided at least up to a wavelength that is ~1.5 times the cut-off wavelength. Based on this rule, the first fiber 1210 should have minimal bend induced loss up to at least 1.9 microns, the second fiber 1220 should have minimal bend induced loss up to at least 2.63 microns, and the third fiber 1230 should have minimal bend induced loss up to at least 4.2 microns.

As the pump power is increased in the fluoride fiber, Raman wavelength shifting is first observed experimentally. Then, SC generation occurs after the Raman order crosses to the long wavelength side of the zero dispersion wavelength. For the 85 m length of fluoride fiber of FIG. 12B, the SC spectrum with an input peak pump power of ~2.5 kW stretches from ~850 nm to ~3600 nm, and over the mid-IR region the spectral density ranges from −18 dBm/nm to −30 dBm/nm. As another example, in 40 m of the first fiber of FIG. 12A, the spectrum is found to reach only out to ~3050 nm. The peak power launched in this case was ~3.5 kW. The magnitude of the long wavelength edge of the spectrum does appear to be correlated with the shorter cut-off wavelength in this fiber. In other words, the longer the cut-off wavelength, the further that the long wavelength side of the SC spectrum extends out to.

One main difference between the fused silica SC and the fluoride SC is the wavelength range expected. Whereas the glass transmission in fused silica would appear to limit the SC range to below 3 microns, because of the low loss in the fluoride fibers out to approximately 5 microns, the SC can continue to wavelengths longer than 3 microns. Moreover, since the dispersion slope is less in the fluoride fibers compared to fused silica (FIG. 1), the MI bandwidth for phase matching can be much larger, giving rise possibly to broader bandwidth SC generation.

The hypothesis is that the sharp wavelength edge observed in the exemplary ZBLAN fluoride fiber SC experiments arise from fiber bend induced losses. i.e., As the wavelength increases, the mode diameter increases and more of the mode penetrates into the cladding and is weakly guided. Several data points support the hypothesis of the spectral edge arising from the bend induced loss in the fiber. First, when the fluoride fiber was wound on a ~8 inch spool, the edge of the spectrum reached to ~3400 nm. When the same fiber was loosely laid in a drum, the spectral edge shifted toward longer wavelengths out to ~3600 nm. Second, the bend induced loss is measured at 3.3 microns. For a bend diameter of 50, 100 and 200 mm, the percent loss at 3.3 microns is 85%, 3% and 1%, respectively. Therefore, the SC in the ZBLAN fluoride fiber should cover a wider range of the mid-IR when the bend induced is better controlled.

Using a Fused Silica Pre-Stage before the Fluoride Fiber

Figure 13A:
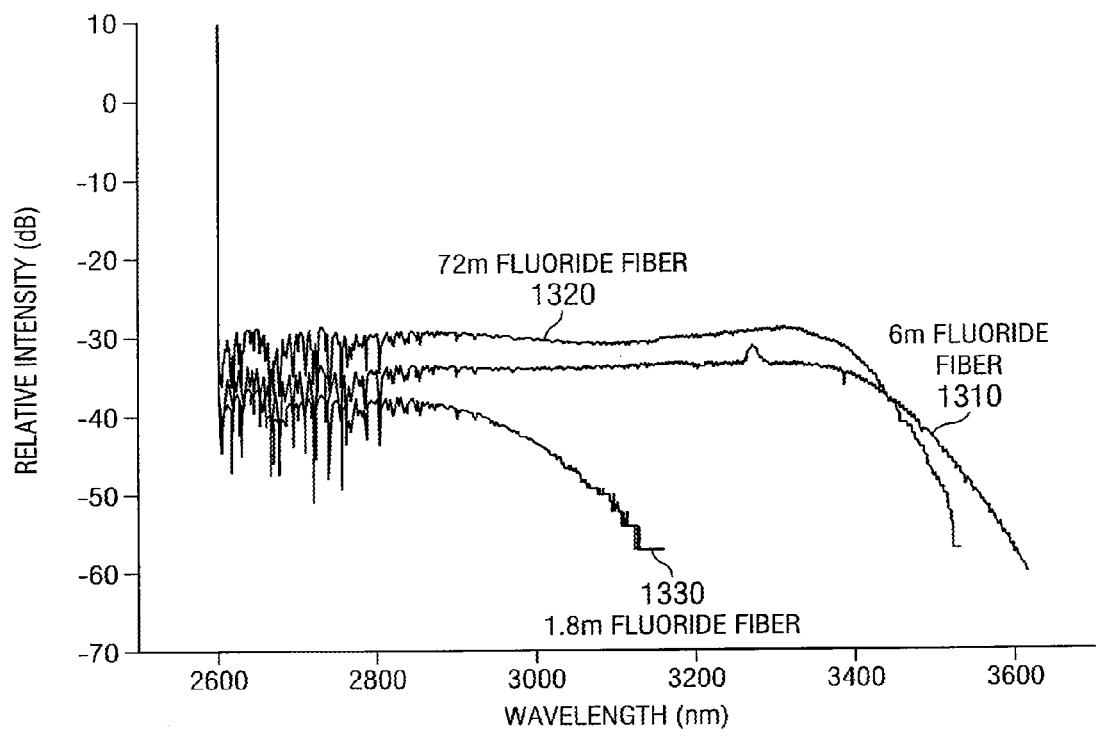
FIG. 13A illustrates comparison of fluoride super-continuum for different fiber lengths following a ~2 m length of SMF fused silica fiber.

By using an appropriate length of fused silica pre-stage before the fluoride fiber, the length of fluoride fiber can be reduced and the spectral extent can be optimized. As an example, consider the second fluoride fiber (specifications in FIG. 12B). In the above described experiment, an approximately 85 m length of fiber was used to generate a spectrum out to ~3500 nm. The same fiber is tested by first using an approximately 2 m length of standard single-mode fused silica fiber (SMF). The output from the ~2 m of SMF is then butt-coupled or mechanically spliced to the fluoride fiber of FIG. 12B. In FIG. 13A the long wavelength side of the spectrum is illustrated for different lengths of the fluoride fiber at approximately 3 kW of peak power. For a ~1.8 m length of fluoride fiber, the spectrum 1310 reaches out to approximately 3100 nm, meaning that this fiber length is too short for the full spectral extent generation. On the other hand, at a ~6 m length of fluoride fiber, the spectrum 1310 reaches beyond the spectral range reached in ~72 m of the same fiber 1320. Therefore, for the particular circumstances of this experiment, the optimum length of the fluoride fiber is probably greater than 6 m, but shorter than 72 m.

Figure 13B:
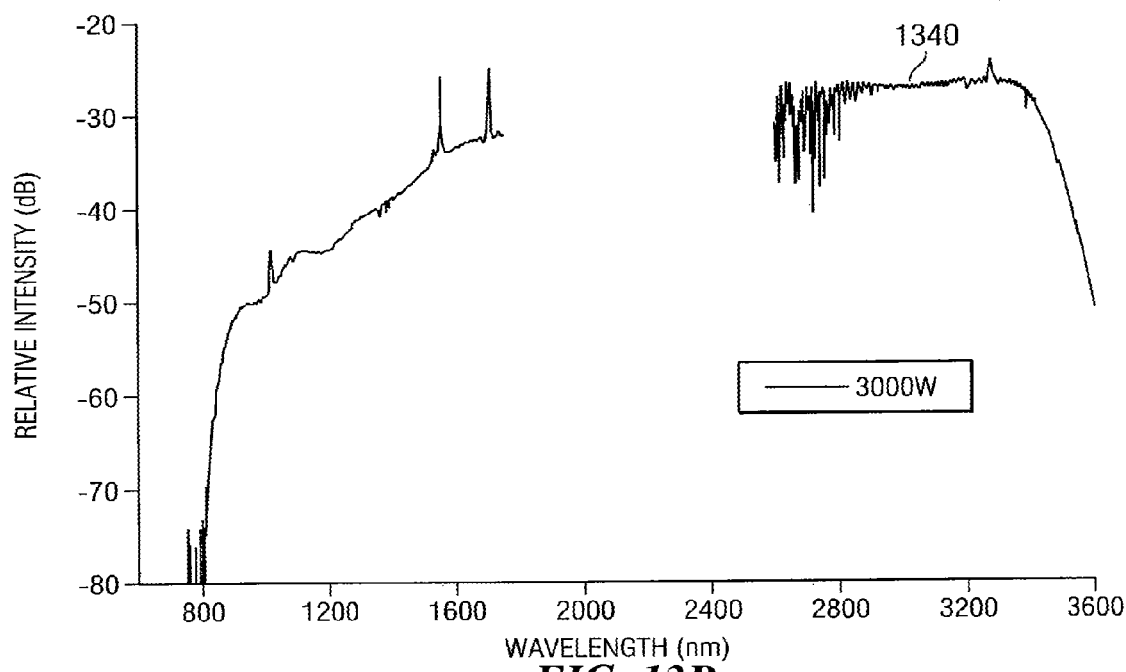
FIG. 13B illustrates spectrum from ~5 m length of the second fluoride fiber ((FIG. 12B) following ~2 m length of SMF fused silica fiber.

The spectrum 1340 corresponding to using 5 m of the fluoride fiber from FIG. 12B after ~2 m of SMF pre-stage fiber is illustrated in FIG. 13B. The peak pump power in this case is ~3 kW, and the spectrum 1340 is seen to cover the range from ~800 nm to ~3600 nm. The short wavelength side of the spectrum is collected using an optical spectrum analyzer, the long wavelength side is collected using a grating spectrometer. The gap in the middle is due to filters use to insure that only the first order light of the grating is collected, and the higher orders from shorter wavelengths is blocked. Thus, with the appropriate pre-stage used to break up the pulses through MI, the fiber length required can reduce from greater than 70 m down to less than 10 m.

The third fluoride fiber (characteristics in FIG. 12C) has a cut-off wavelength of ~2.75 microns, which would mean that the bend induced loss should be well controlled to beyond ~4.2 microns. To optimize the long wavelength edge from this fiber, the pre-stage fiber of SMF fused silica was first optimized in length. For example, at a peak pump power of ~2.5-3 kW, it was found that approximately 1 m of SMF fiber with a zero dispersion wavelength around 1.3 microns gave the broadest spectrum. In other words, at this power level the pre-stage SMF fiber helps to break the pulses up through the MI mechanism. Then, the pre-stage SMF fiber is butt coupled or mechanically spliced to short lengths of the third fluoride fiber.

Figure 14A:
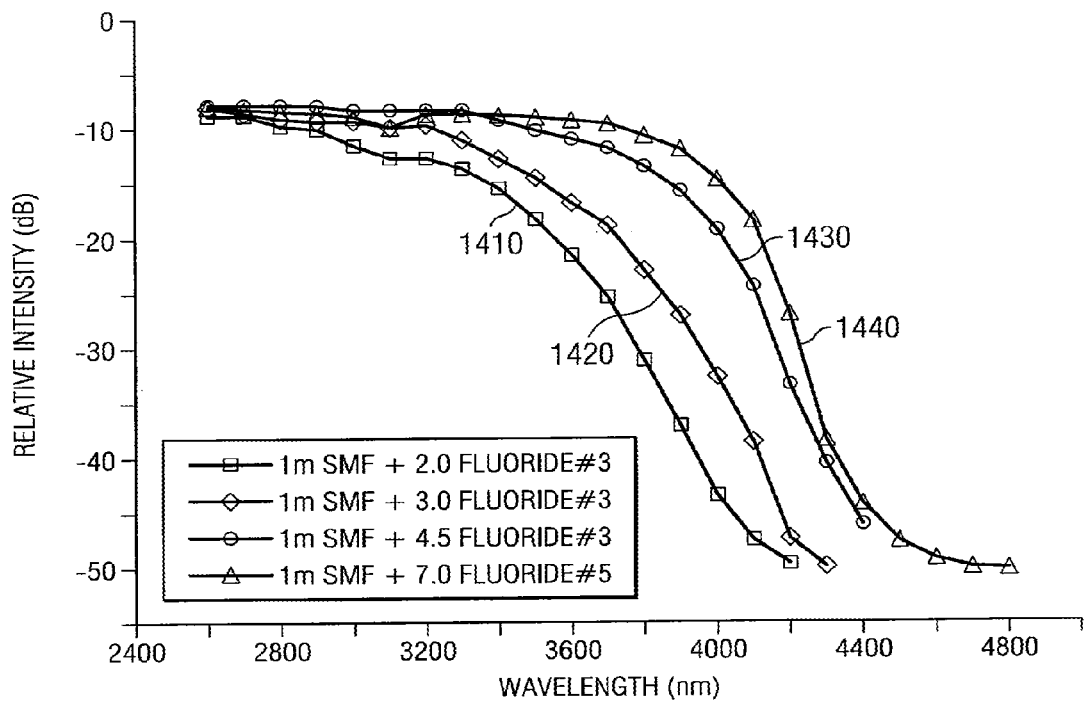
FIG. 14A illustrates the long wavelength side of the super-continuum spectrum from different lengths of the third fluoride fiber (FIG. 12C) following an approximately 1 m length of fused silica SMF fiber. The long wavelength edge reaches to ~4.5-~4.6 microns.

FIG. 14A illustrates the long wavelength side of the SC spectrum from approximately 1 m of SMF fiber pre-stage followed by different lengths between approximately 2 and 7 m of the third fluoride fiber (FIG. 12C). For the 2 meter of fluoride fiber, the spectrum 1410 covers the wavelength range from the near-IR out to ~4.2 microns. However, at the pump power used of ~2.5 kW peak, the spectrum in this short length starts to drop off at around 3 microns, suggesting that the fiber length may be too short for the full spectral generation at this power level. When a ~4.5 meter length of the same fiber is used, the spectrum 1430 reaches out to ~4.4 to ~4.5 microns. When the length is further increased to ~7 m, the edge moves out slightly to approximately ~4.5 to ~4.6 microns, but also the spectrum 1440 becomes more square-like (i.e., higher spectral density further out in wavelength). Thus, for the particular pre-stage SMF fiber and the pump power level, the optimal length for the third fluoride fiber would appear to be 4.5 meters or longer.

Figure 14B:
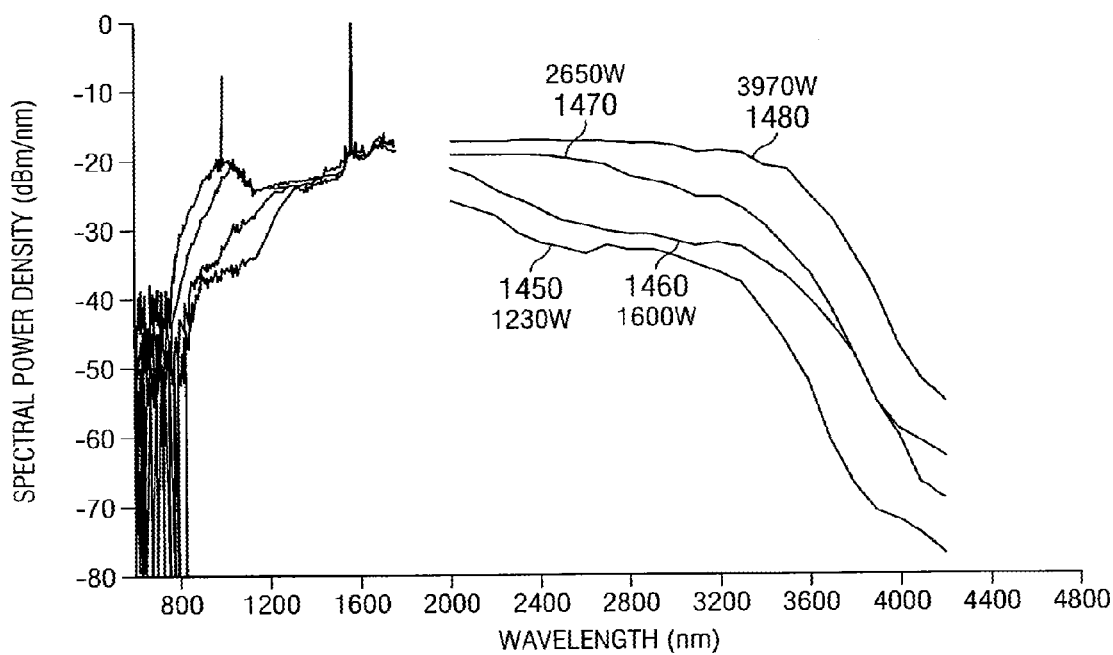
FIG. 14B illustrates power evolution of the spectrum from ~2 m length of the third fluoride fiber (FIG. 12C) following an approximately 1 m length of fused silica SMF fiber.

FIG. 14B illustrates the experimentally obtained power evolution of the spectrum from ~2 m of the third fluoride fiber following an approximately 1 m length of SMF fiber pre-stage. As the power increases, the spectrum 1450, 1460, 1470, 1480 is observed to increase in spectral density and also shift out to slightly longer wavelengths. As the plot shows, the spectrum is fairly well evolved by ~2 kW of peak pump power, in this particular example.

Figure 14C:
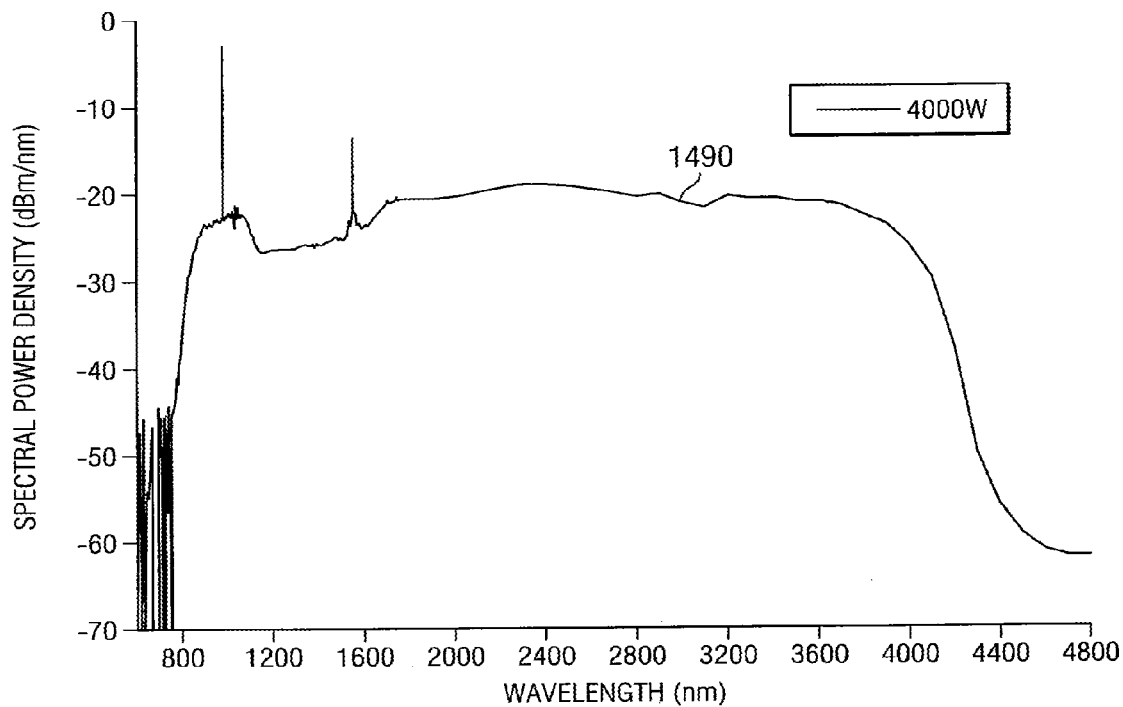
FIG. 14C illustrates overall calibrated spectrum from ~7 m of the third fluoride fiber (FIG. 12C) following an approximately 1 m length of fused silica SMF fiber.

The complete calibrated spectrum 1490 from ~7 m of the third fluoride fiber following ~1 m of SMF pre-stage is shown in FIG. 14C. The long wavelength edge of the spectrum extends out beyond ~4600 nm, and the short wavelength edge of the spectrum extends beyond ~800 nm. The complete spectrum 1490 is obtained by connecting the spectrum from an optical spectrum analyzer below ~1750 nm with the longer wavelength data from the spectrometer followed by a cooled InSb detector. The data from the OSA is calibrated to obtain the spectral density in dBm/nm. The narrow peak near 1553 nm corresponds to the residual pump, and the peak near 980 nm is the residual forward pump from the power EDFA stage. Furthermore, the bump near 980 nm corresponds to the ASE from the EDFA in the vicinity of the pump. The peak power from the pump is approximately ~4 kW, and the overall spectrum is seen to be quite smooth. The fiber output from the SC fiber yields an average power of ~20 mW for this particular experiment. From the spectrum and the measured output power, the conversion efficiency of the pump light to the SC spectrum is approximately 50% or better.

One significant feature of the SC can be a high spectral density over a wide wavelength range. For example, the spectrum 1490 in FIG. 14C shows that over a large part of the spectrum the average spectral density is between −25 and −18 dBm/nm (note that 1 dBm=1 mW). However, this is the average spectral density for a very low duty cycle pulse. For instance, with the ~2 nsec pulses and 5 kHz repetition rate used in these experiments, the duty cycle is 1:100,000. Therefore, during the time that the pulses are on, the actual peak spectral density is more like +25 to +32 dBm/nm. Thus, for a 10 nm bandwidth that might be used in spectral fingerprinting, the peak power is greater than 3 W. For a 100 nm bandwidth that may be seen by one of the detectors in a heat sinking missile (e.g., as in typical in infrared counter measures), the peak power is greater than 30 W. The pulsed mode used in the current experiments can be useful for lock-in or phase locked techniques that use detection systems such as box-car averagers, such as might be used in spectral fingerprinting. In other words, to avoid collecting noise during the off-state of the light, the detection system can advantageously only measure or record data during the on-state of the MIR-FIL. In comparison to a broadband lamp, the average spectral density in the SC is about $3\times10^3$ brighter than a lamp and the peak spectral density in the SC is about $3\times10^8$ brighter than a lamp. Thus, such a broadband mid-IR source can enable white light interferometry measurements with very high sensitivity.

Another feature of the SC 1490 is the remarkably smooth spectrum over a wide spectral range. Because of the relatively stable pump laser input to the SC fiber, it is believed that shot-to-shot the spectrum is the same. In fact, this is a valuable attribute for spectroscopy. However, during the pump pulse, the less than 2 nsec pulse probably has a range of intensities. The different values of the intensity may in turn be responsible for different parts of the spectrum. As a consequence of averaging over all the values of the intensities, the resulting spectrum may be quite smooth. This hypothesis also suggests a method of tailoring or adjusting the spectral shape of the SC. One way would be to use wavelength filters, such as gain equalizers or dynamic gain equalizers. However, another technique could be to modulate the time domain of the pump pulse, and then this temporal modulation could translate on to the spectrum as different parts of the pulse contribute to different parts of the spectrum.

There can be a number of techniques used to expand the long wavelength edge of the SC generation in optical fibers. In one embodiment, the composition of the fluoride glass can be changed to permit transmission out to longer wavelengths. The fibers described thus far are zirconium fluoride glass, with a exemplary composition for the ZBLAN of (mole %): $ZrF_4$ (57), $BaF_2$ (34), $LaF_3$ (5), $AlF_3$ (4). For the ZBLAN or more generally the zirconium fluoride fibers, the transmission edge of 1 dB/m at 4.3 microns is fairly common, and it the IR edge does not shift very easily. On the other hand, fluoride glass fiber that does not contain zirconium fluoride fiber or other short-IR-edged compounds may enable transmission to longer wavelengths. By changing the composition, the long wavelength edge can be found to extend beyond ~5.4 microns. Therefore, if the SC generation were implemented in such a fiber, the edge of the SC might be expected to reach beyond 5 microns. For long wavelength performance, the cut-off wavelength for the fiber should probably be beyond 2 microns, preferably beyond 2.5 or 3 microns, to control the bend induced loss at the longer wavelengths. The core size can also be advantageously relatively small (e.g., less than a core diameter of 12 microns, more preferably less than 10 microns) to reduce the power requirements for the SC generation. However, larger core sizes may also be used to increase the overall output power from the SC spectrum.

Other embodiments of fluoride fiber can also be used to extend the long wavelength edge or to optimize the shape of the SC spectrum. In one embodiment, the pump wavelength could be made closer to the zero dispersion wavelength of the fiber, or a cascaded Raman shifted order of the pump could fall closer to the zero dispersion wavelength of the fiber. In a preferred embodiment, the pump or the shifted pump wavelength would fall slightly to the long wavelength side of the zero dispersion wavelength. This would lead to MI with a broad gain spectral width. In another embodiment, a hybrid configuration of different fluoride fibers could be used to effectively taper the core size of the chain, either downward or upward. In yet another embodiment the wavelength dependence of the core and cladding material can be selected so that the numerical aperture (NA) increases with increasing wavelength. For a step-index fiber, the NA=sqrt $(n_1^2-n_2^2)$, where $n_1$ is the index of the core and $n_2$ is the index of the cladding. Therefore, if the difference between the two indices of refraction increases with increasing wavelength, then the NA will increase. As the NA is increased, the waveguide will be better guiding and the effect of bend induced loss will be lowered.

As an alternative, fibers made from different materials can also be used to increase the wavelength extent of the SC. Another option for mid-IR fibers are tellurite ($TeO_2$) glass fibers. Recently, there has been growing interest in the $TeO_2$-based glasses because of their strong nonlinear properties and capacity for doping with high concentrations of rare-earth elements. Hence, these glasses can be appropriate for a wide range of devices including lasers, amplifiers, and mid-IR wavelength converters. Several preliminary studies have been reported in the literature regarding the glass properties. For example, depending on the doping details, the Raman gain coefficient can range from 30 times larger than fused silica to 45 to 95 times larger than fused silica. In addition, the Raman gain band in the $TeO_2$ glasses can be up to a factor of two wider in bandwidth than fused silica. Moreover, the damage threshold for the $TeO_2$ glasses is measured to be approximately 15-20 $GW/cm^2$, which is about a factor of two or three smaller than fused silica at 50 $GW/cm^2$. For the tellurite fibers the nonlinearity can be strongly dependent on the material composition, and the zero dispersion wavelength can also vary with material composition. In addition, the tellurite fibers may transmit light at least out to 4 microns, and even out to 5 microns in bulk glass. According to some reports, at 4 microns the theoretical background loss (i.e., material loss) can be somewhere above 10 dB/m. The minimum loss in tellurite fiber would be around 3 microns, and the value of the loss should be between 5-10 dB/m in the fiber at 3 microns. In yet other embodiments, materials made in waveguides may be advantageous for mid-IR light generation. For example, if the pulse break-up first occurs in fused silica fiber, then the nonlinear spectral broadening for SC generation can occur in silicon or other semiconductor waveguides.

Figure 15:
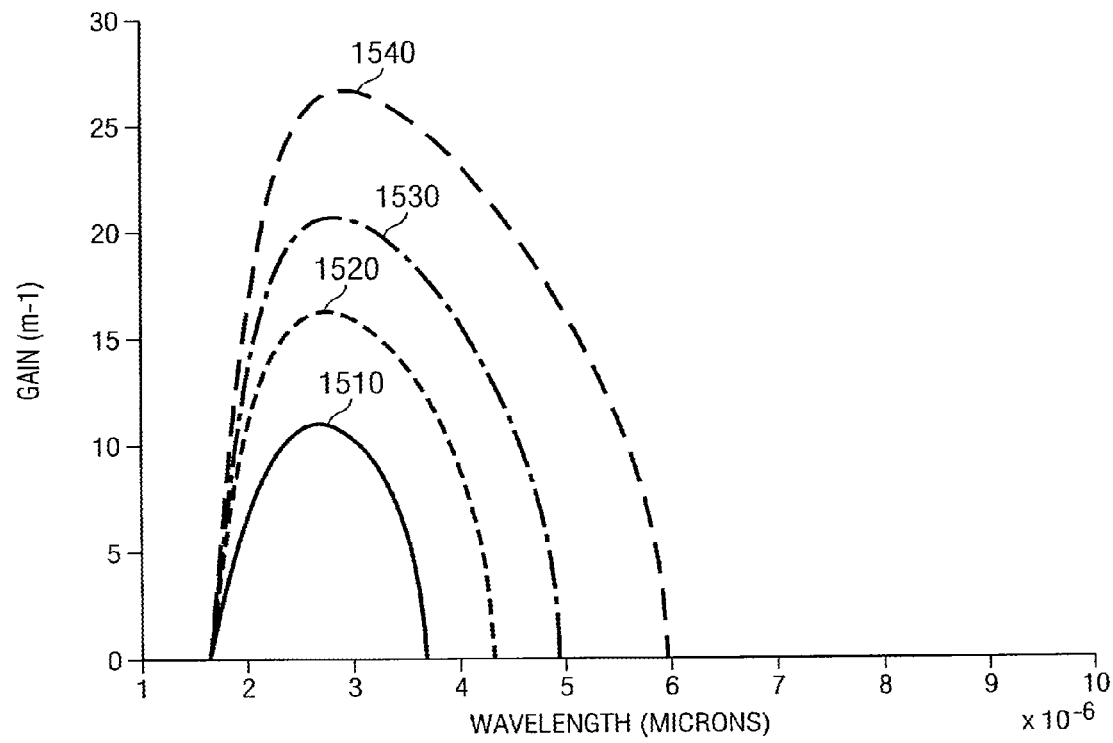
FIG. 15 illustrates the calculated modulational instability gain for 3.5 kW at 1630 nm and 0, 1, 2 and 3.5 kW at 1635 nm.

Given that only certain range of fiber parameters are available in the fluoride fibers and that step-index fiber can only provide limited control over the dispersion profile, an additional degree of freedom for the mid-IR fibers may be helpful. The use of two pump wavelengths may provide this optimization option. With the two pump case, MI can occur with either pump in the anomalous or normal dispersion regime. Thus, whereas for the single pump case MI phase matches when the pump is in the anomalous dispersion regime, the addition of a second pump relaxes this constraint. As an example, FIG. 15 illustrates the use to two pump wavelengths falling in the anomalous dispersion regime in the ZBLAN fluoride fiber. In particular, the zero dispersion wavelength from material dispersion is at 1628 nm, and pumps at 1630 and 1635 nm are assumed. The pump at 1630 nm is assumed to be 3.5 kW peak power, and the pump at 1635 nm is varied at 0 1510, 1 kW 1520, 2 kW 1530 and 3.5 kW 1540. As the second pump is increased, the gain bandwidth stretches from 3.7 microns to 4.2 microns, 4.9 microns and approximately 6 microns. These two pump wavelengths can be implemented directly with EDFA amplification (using co-called L-band amplifiers), or they can be generated near 1530 nm, and then one Raman wavelength shift can be used to transfer the energy closer to 1630 nm. In another embodiment, an additional degree of freedom can be obtained in fluoride fibers by using microstructure fiber geometries, which are also often called photonic crystal fibers.

Another aspect of the MIRFIL is that the average power can be increased to >500 mW from the current ~20 mW average power. For the higher powers, one change could be to use a higher power pump laser. Examples of higher power pump lasers include solid-state lasers, diode-pumped laser systems including solid state lasers, cladding pumped fiber amplifiers and lasers, and optical parametric oscillators or amplifiers. To improve the efficiency and power, longer wavelength (~2 microns) and higher power solid state lasers or cladding pumped fiber amplifiers or lasers can also be used. For instance, holmium or thulium lasers provide light near 2 microns in wavelength. As the powers are increased, another change can be to use larger core size fibers, so that the intensities can remain below the damage threshold while the overall output power can be increased. For example, different core sizes of fluoride fibers are already commercially available. In addition, the HiNL fused silica fibers could possibly be pulled to larger sizes, although care will be needed not to change the zero dispersion wavelength in these fibers.

Although a number of embodiments of using fluoride fibers to generate SC into the mid-IR are described, other configurations and fiber types can also be used to alter the shape of the SC spectrum or to extend the wavelength range of the SC generation.

Figure 16:
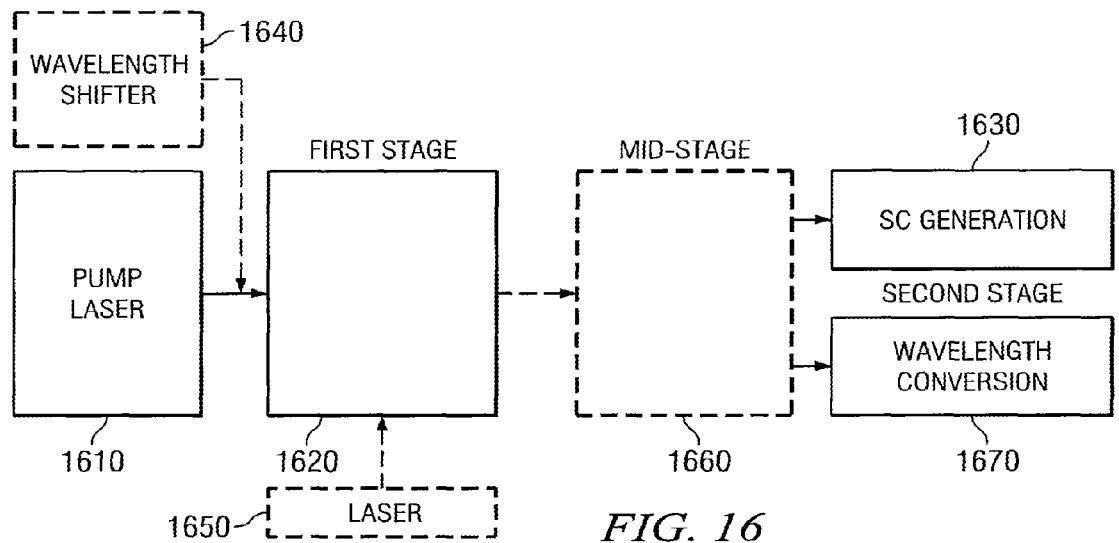
FIG. 16 illustrates a generalized model for super-continuum generation from quasi-CW or CW pumping. Note that some, all, or none of the illustrated boxes may be involved in SC generation. Further, other boxes can also be added within the scope of the disclosure.

Generalization of SC or Wavelength Conversion and Using Semiconductor Waveguides The results in the fused silica and fluoride fibers suggest a more general model of optimizing SC generation or wavelength conversion (further discussed in a few sections below). One example of the generalized model is illustrated in FIG. 16. The light originates from a pump laser 1610, which can a laser diode followed by EDFA's, cladding pumped fiber amplifiers or lasers, diode-pumped solid state lasers, diode-pumped fiber lasers, or any number of light sources in the near-IR wavelength range. It may be desirable to include a wavelength shifter 1640 (dotted line boxes correspond to different optional elements in the optimized set-up). As an illustration, the wavelength shifter 1640 might be a Raman wavelength shifter, a cascaded Raman oscillator, an optical parametric oscillator or an optical parametric amplifier. In addition, it may advantageous to introduce light from a seed laser 1650, which can be a laser diode, a tunable laser diode, a fiber laser, a solid state laser, or another super-continuum source. In the case of the experiments to date, the seed light may be arising from the ASE from the optical amplifiers. However, if the optical amplifier is not used, then it may be advantageous to introduce a seed laser light to lower the threshold or control the wavelength of the modulational instability in the next stage.

The first stage may be used to cause break-up 1620 of the CW or quasi-CW light into pulses or solitons through the MI effect. The first stage 1620 can advantageously be implemented in optical fibers, and for a single pump wavelength the MI phase matches in the anomalous group velocity dispersion regime. If the pulses are nano-second (i.e., longer than approximately 100 psec, or even longer than about 30 psec) or quasi-CW light, there may be enough intensity modulation to cause collisions between different soliton pulses. Otherwise, in a preferred embodiment an intensity modulator can be used to create a distribution of intensities, which in turn can lead to a collision between soliton pulses. The intensity modulation may also help to create a smooth spectrum, due to the distribution of pump intensities.

In some cases, it may be further advantageous to have a mid-stage 1660 after the MI-initiated pulse break-up stage. This mid-stage, for example, can have a pulse sharpener 1660, which helps to compress the soliton pulses and/or create more modulation sidebands in the frequency domain. Examples of the mid-stage include optical fibers, dispersion decreasing fibers, tapered fibers, grating compressors, or other examples of pulse compressors, whether they are implemented in optical fibers or bulk optics. This mid-stage can additionally help by increasing the peak intensity of the pulses. As such, the mid-stage can also include optical amplifiers.

The second stage can then include a nonlinear element for SC generation 1630 or wavelength conversion 1670. The non-linear element can help to generate SC or new wavelengths based on four-wave mixing processes. For SC generation, the nonlinearity in the second stage can give rise to spectral broadening through self-phase or cross-phase modulation. Although the nonlinear properties of this second stage is one of the important parameters, it may also be desirable to have some dispersion to cause pulse walk-off or pulse motion. Such pulse motion may help to smoothen the spectrum or create even higher peak intensities. It may also be advantageous for the second stage to be at least partially transparent over the wavelength of interest. For example, for mid-IR conversion, it may be advantageous for the second stage to be transparent over much of the mid-IR wavelength range. Examples of the second stage include different optical fibers, including HiNL, ZBLAN, fluoride, tellurite, chalcogenide, or even semiconductor doped glasses or waveguides.

Although most of the experiments presented have used mid-IR fibers or fused silica fibers, in the more generalized model other elements such as semiconductor waveguides or nonlinear crystal material could be used in the second stage. As one particular example, a silicon waveguide could be used as the second stage. The nonlinearity in silicon is about four-orders-of-magnitude higher than in silica fiber. The band gap in silicon is around 1.1 microns, so silicon is transparent (at least in a linear sense) for wavelengths longer than 1.1 microns and throughout the mid-IR wavelength range. Therefore, it is advantageous to have a pump wavelength below the band gap of silicon. However, for a pump wavelength between approximately 1.1 and 2.2 microns, the pump will experience two-photon absorption (TPA). In turn, the carriers generated through TPA can induce free-carrier absorption.

One method to overcome the TPA-induced free carrier absorption is to embed the silicon waveguide in a P-I-N diode configuration, particularly with the PIN diode reverse biased. As an illustration, the waveguide may fall in the I (intrinsic) region, and the electric field from the reverse biased diode can help to quickly sweep out the electrons and holes created by the TPA effect. Although this technique reduces the free carrier absorption, it does not prevent the TPA effect. Furthermore, the silicon waveguide in a PIN diode can be enhanced in a number of ways For instance, the length of the waveguide can be extended by using multiple zigzags, such as in a S-configuration. Moreover, the pump light can be multiple passed by placing coatings on the semiconductor wafer or mirrors around the wafer. In a preferred embodiment, one side of the chip may be coated for high reflectivity, while the other side can be anti-reflection coated or dichroic coated. Another advantageous configuration can modulate the applied voltage to the PIN diode to control the loss in the waveguide. As an example, this modulation could control the long wavelength edge of the SC spectrum or could be used to put codes onto the SC spectrum.

The silicon PIN waveguide is just one example of the nonlinear element 1630 or 1670 that could be used for SC generation. There are many other semiconductor or other materials that could alternatively be used. For instance, a waveguide can be made in a wide-gap semiconductor, where the band gap is at shorter wavelength than the TPA edge. This would avoid the TPA problem, thereby removing the necessity of using a PIN for carrier sweep-out. Alternately, a more atomic-like material can be used, such as quantum dots, so the material does not have a conduction band and the associated TPA problems. Moreover, other nonlinear crystals could be used, such as lithium niobate or periodically-poled lithium niobate. Furthermore, different fiber configurations could be used. For example, a hollow core fiber or capillary could be used that is filled with a nonlinear liquid, such as $CS_2$. Other fiber types could also be used, such as tellurites, chalcogenides, or photonic crystal fibers.

Cascaded Raman Wavelength Shifting in Chalcogenide Fibers

Figure 17A:
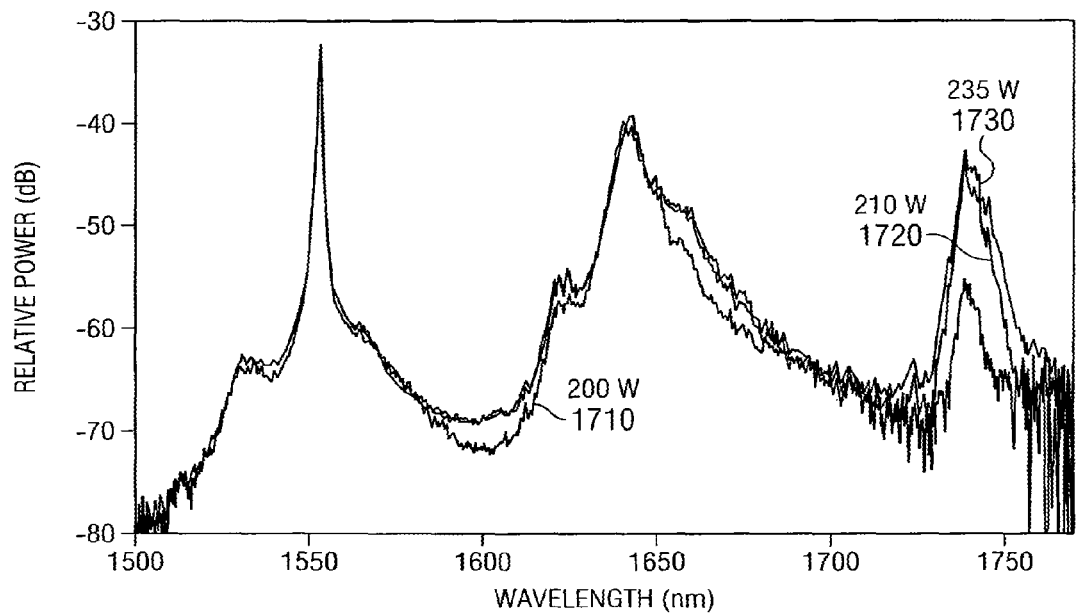
FIG. 17A illustrates cascaded Raman wavelength shifting data from WS #884 Corning fiber measured with an optical spectrum analyzer.
Figure 17B:
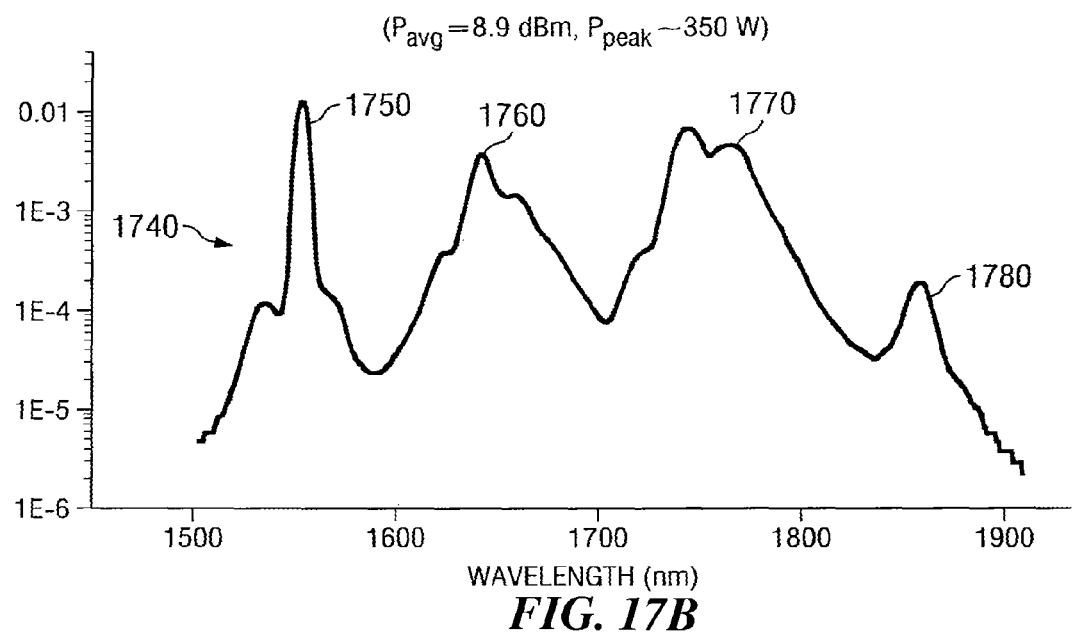
FIG. 17B illustrates cascaded Raman wavelength shifting data from WS #884 Corning fiber at higher power and measured with a spectrometer.

Chalcogenide fibers represent another alternative of fiber types for mid-IR light generation. Examples of chalcogenide fibers include sulfide (typically transmitting out to approximately 6 microns), selenide (typically transmitting out to approximately 9 microns) and telluride (typically transmitting out to 11 microns). Technical feasibility has been demonstrated for cascaded Raman wavelength shifting in chalcogenide fibers. In a particular embodiment, samples of arsenic-tri-sulfide fibers were obtained. The testing started with a 20 m length of fiber number WS-884, which has a slight selenide doping, a core size of approximately 6.5 microns, and a numerical aperture of ~0.22. For example, FIG. 17A and FIG. 17B show the spectral output from about 12 m of the WS #884 fiber for different input peak powers. The second cascaded Raman order can be observed at ~200 W peak power input to the chalcogenide fiber. Also, this second cascade order can be repeatable, and it grows to a noticeable strength by ~235 W peak input power 1710 (this is power incident on the fiber, not necessarily the fiber coupled into the fiber).

To generate and measure the spectrum beyond the second Raman cascade order 1770, the light from the mid-IR fiber can preferably be sent to an optical spectrometer that is optimized for the near to mid-IR. In particular, a 0.3 m spectrometer is used that has a grating with 300 grooves/mm. The numerical aperture for the fiber output is optimized to couple into the spectrometer using lenses that are transmitting in the mid-IR, such as calcium fluoride lenses. The detector used is a modified InGaAs detector, which has high sensitivity out to 2.6 microns. To minimized the effect of the water absorption line around 1.9 microns, a dry nitrogen as is used to purge the interior of the spectrometer.

FIG. 17B illustrates the spectrum 1740 at the output of fiber WS #884 measured using the optical spectrometer. With the extended range of the spectrometer and the nitrogen purge, the third Raman cascade order 1780 can be observed. The pump power incident on the sulfide fiber is now raised to approximately 350 W. As the pump power is raised, the third order 1780 cascaded Raman wavelength shift grows. It should be noted that the actual third order shift is probably higher in magnitude, since the path from the fiber to the spectrometer is not purged and there may still be residual moisture in the spectrometer chamber. Further orders of cascaded Raman wavelength shifting may be limited by damage at the input to the fiber as the pump power is raised.

The results from the chalcogenide fibers could be improved using a number of techniques. Different fiber sizes will be tested to see if the fiber core is more uniform or continuous in the larger core size fibers. Gallium on the two ends of fiber can be used to test for the guiding properties of the lowest order mode in different fiber lengths. The ends of the sulfide fiber may also be encapsulated to remove heat and, thereby, to increase the damage threshold.

As another alternative, selenide fibers could be used, which are interesting because they should have an order of magnitude larger Raman gain coefficient compared to the fibers tested. One question is the value of the damage threshold power for the selenide fibers. If the damage threshold is the same in the selenide fibers as the sulfide fibers that have been tested, then a significant improvement in CRWS might be expected. However, the index-of-refraction variation with temperature $\partial n/\partial T$ can be positive in the chalcogenide fibers, and the value can be an order of magnitude larger in the selenide fibers compared to sulfide fibers. Therefore, one concern may be that catastrophic self-focusing might occur in the selenide fibers due to thermal effects from light absorption. In addition, the selenide fibers have a band gap of ~750 nm, which is closer to the pump wavelength than the sulfide fibers (band gap around ~520 nm). Thus, a second concern arises from photo-darkening effects arising from two-photon absorption. To overcome photo-darkening concerns, it might be worth trying a hybrid approach, where light is first shifted in fused silica out to ~2-2.8 microns, and then the light is coupled into the chalcogenide fibers for further shifting. An alternative approach will be to pump the chalcogenide fibers with thulium lasers (either fiber based or solid state lasers), so the shifting starts from around 2 microns. Although particular schemes are described for CRWS in chalcogenide fibers, a myriad of other techniques and materials can be used for generating light using CRWS into the mid-infrared.

Wavelength Conversion Based on Four-Wave Mixing

There are applications, such as spectral fingerprinting, where SC generation can be very valuable. Also, SC could benefit infrared counter-measures (IRCM), because it becomes virtually undefeatable because the broad spectrum mimics the black body radiation from hot metal objects. However, there are many cases where only a narrow band of frequencies in the mid-IR may be desired. For example, laser ablation typically only uses a band of frequencies, and IRCM traditionally uses three frequency windows in the mid-IR. For these cases where only a few mid-IR wavelengths are required, SC can be inefficient, since the energy may be spread over a wide spectral range. Wavelength conversion of the pump wavelength to a set of frequencies in the mid-IR would be significantly more efficient.

Because of the similarity of the experimental set-up and the same underlying physics at work, one question is when does SC generation occur and when does wavelength conversion occur. The MI process can be used to convert the CW or quasi-CW (e.g., nanosecond pulses) to short pulses required for many of the nonlinear phenomena, thereby reducing or eliminating the need for modelocked lasers. Also, for the single pump wavelength case MI phase matches in the anomalous group-velocity dispersion regime. Therefore, the first step for either SC or wavelength conversion can be to propagate the light in a length of anomalous dispersion fiber (i.e., soliton regime of the fiber). The main difference in outcome may depend on how long the pulses are permitted to propagate in the soliton regime of the fiber.

To distinguish SC generation from the wavelength conversion processes, it is worth first examining the onset of the SC generation process. As an example, FIGS. 5 and 6 show simulations of the break-up of quasi-CW pulses through MI and then the onset of SC generation. FIG. 5 shows the initial break-up of the quasi-CW pulse into solitons, and then the Raman effect shift in energy to the longer wavelength side (left side is time and right side is frequency domain). Thus, the broad quasi-CW input is broken into a train of solitons.

FIG. 6 shows one example of the time-domain collision process further down the fiber, as the onset of SC generation can be seen on the computer. The red-shifted pulses travel through the blue-shifted pulses because of the anomalous dispersion, and then the red-shifted pulses rob energy from the blue-shifted pulses through the Raman effect. This complicated collision process may give rise to narrow, high peak power pulses, which can lead to SC generation. The generation of the large super-pulses in FIG. 6 may be advantageous for achieving the extremely high intensities and the run-away effect that give rise to SC generation. Note that the collision of the pulses occurs because self-phase modulation leads to the initial red-shifting of the leading edge of the pulse (i.e., the part of the pulse that occurs earlier in time). Then in the anomalous dispersion regime the red-shifted pulses travel slower, causing the pulses in the leading edge of the pulses to pass through the pulses in the trailing edge of the pulse (FIG. 6). As the red-shifted pulses travel through the other soliton pulses, through the Raman process the red-shifted pulses grow in energy and further narrow.

In order to observe wavelength conversion through four-wave-mixing (4WM), the MI break-up of the pulses as seen in FIG. 5 can be advantageous, but the super-pulse creation process of FIG. 6 that leads to SC generation should preferably be avoided. As a specific example, the purpose of the ~0.5 m length of standard SMF fiber (fiber that can be in the soliton regime or anomalous dispersion regime) in the experiments is to convert the ~1.8 nsec pulses from the laser into the short soliton pulses. This length may be intentionally kept short to avoid the collision phenomena of FIG. 6.

Depending on the wavelength conversion mechanism, different strategies can be used to avoid the collision and super-pulse creation of FIG. 6 in the second stage of fiber. As an example, to observe wavelength conversion through 4WM, the second stage fiber is selected to operate in the normal dispersion regime. Since the red-shifted pulses travel faster than the blue-shifted pulses in the normal dispersion regime, the collision and super-pulse formation of FIG. 6 are avoided. For single pump wavelength seeded MI, anomalous dispersion is required for phase matching. Therefore, by using normal dispersion in the second stage, the run-away effect of MI can be avoided, and 4WM can phase match to provide the wavelength conversion.

Four-wave mixing is a four-photon process where two pump photons combine to produce a Stokes wavelength (longer wavelength) and an anti-Stokes wavelength. One aspect of 4WM is that phase matching is required between the four waves. For instance, the wave vector mismatch is given by $$\Delta k = 2k_p - k_s - k_a = 2\frac{n_{p(1)p}}{c} - \frac{n_{s(1)s}}{c} - \frac{n_{a(1)a}}{c}$$

and the conversion efficiency is given by $$\eta_{4WM} = (\gamma PL)^2 \frac{\sin^2\left(\frac{\Delta kL}{2}\right)}{\left(\frac{\Delta kL}{2}\right)^2}$$

Figure 18:
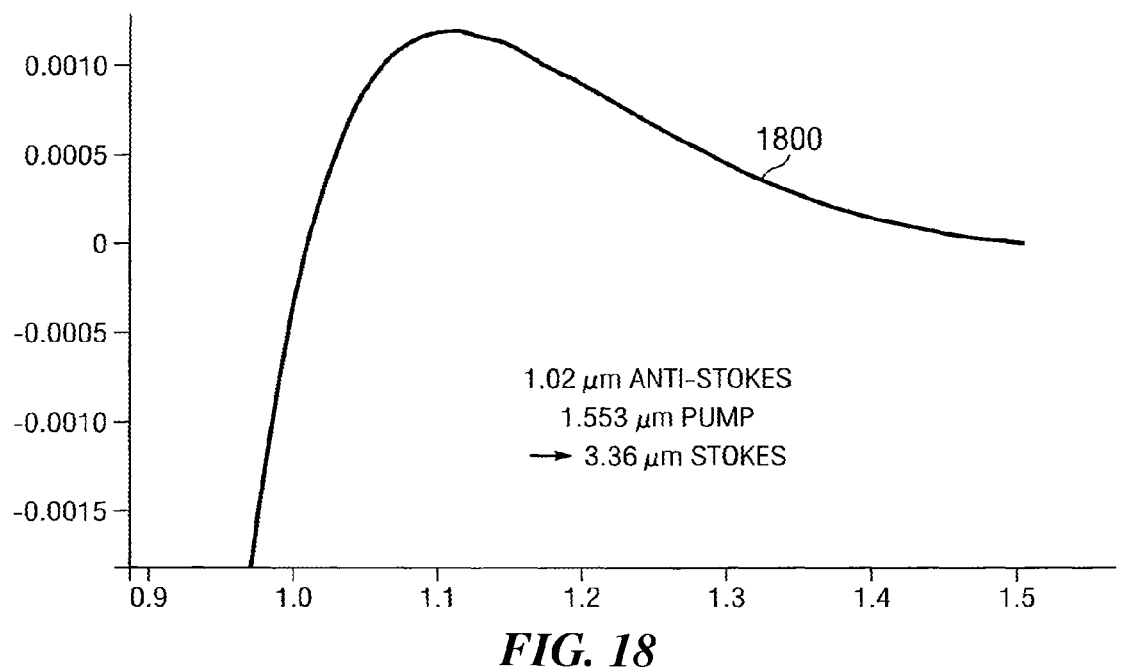
FIG. 18 illustrates the phase mismatch in a fluoride fiber with zero dispersion wavelength near 1.7 microns.

Normally, high efficiency for the 4WM process can be obtained near the zero dispersion wavelength. However, a new regime of phase matching can be advantageously used that enables mid-IR light generation, since this new regime is distant from the zero dispersion wavelength. As one example, the 4WM wave vector mismatch 1800 is calculated and plotted in FIG. 18. Assuming a zero dispersion wavelength near 1.7 microns for the fluoride fiber, the wave vector mismatch can be small close to zero dispersion, such as for wavelengths around 1.6 to 1.8 microns. However, there turns out to be another zero crossing in this case around 1.02 microns. The 4WM efficiency turns out to be large above 1.5 microns, but also large in the vicinity of 1.02 microns. Although this second window generally is found to be narrower bandwidth, it can give rise to wavelength conversion into the mid-IR. For instance, for a pump wavelength of 1553 nm and the anti-Stokes wavelength of 1020 nm, the Stokes light generated would be in the vicinity of 3.36 microns.

As the zero dispersion wavelength and the dispersion profile of the fiber is changed, the position for this mid-IR light wavelength conversion can change. For instance, the following table shows different examples of the calculated and measured 4WM peak for different fibers measured.

| $\gamma_0$ (um) | Theoretical Peak (um) | Experimental Peak (um) |
|---|---|---|
| 1.56 | 1.37 | 1.40 (→ 1.75) |
| 1.57* | 1.25 | 1.23 (→ 2.11) |
| 1.61* | 1.12 | 1.17 (→2.31) |
| 1.70# | 1.01 | 1.02 (→ 3.25) |

Experimental confirmation can also seen of this new regime of phase matching for 4WM in different fused silica and fluoride fibers. As a particular example, the experimental set-up for testing 4WM wavelength conversion is illustrated in FIG. 19. The pump 1910 is similar to that of the SC experiments. However, at the output of the power amplifier is a WDM 1930 or power dividing coupler to inject a seed wavelength 1920, and this is followed exemplary by an approximately 0.5 meter length of SMF fiber 1940 (this fiber, in many cases, can just be the fiber pigtails of the coupler). This pre-stage fiber may serve to break up the pulses through MI, but the length is maintained short enough to attempt to avoid SC generation. Then, the output of the SMF pre-stage fiber is coupled to various fibers 1950, which are preferably in the normal dispersion regime for the pump wavelength. In a preferred embodiment, a seed laser diode would be placed at the anti-Stokes wavelength, and the Stokes wavelength would be generated through the 4WM process.

The data above suggests a procedure for wavelength conversion of light into the mid-IR wavelength range, particularly when there is a target wavelength desired for a particular application. First, the dispersion of the fiber can be tailed to phase match at a target wavelength. The fiber dispersion can be tailored by changing the zero dispersion wavelength, adjusting the dispersion slope, or perhaps by using more exotic fibers such as micro-structure fibers that can have more than one zero dispersion wavelength. Then, if the pump is for example within the telecommunications band, then tune the wavelength of the pump laser to obtain the correct target wavelength. The pump laser could be a tunable laser, or the pump laser could be laser diodes of different wavelengths, for example laser diodes that are on the ITU wavelength grid. With the appropriate adjustment of the phase matching condition, then introduce a seed laser at the anti-Stokes wavelength. Since the anti-Stokes wavelength falls in the near-IR wavelength range, one example of a seed laser would be laser diodes. With the introduction of the anti-Stokes wavelength, mid-IR light on the Stokes side should result, so long as the fiber can transmit light at the particular mid-IR wavelength. Thus, as an example light out to ~2.7 microns might be generated in fused silica fiber, light out to ~4.4 micron might be generated in ZBLAN fluoride fiber, and light out to ~5.5 microns might be generated in the extended band fluoride fiber. In a preferred embodiment, a fused silica fiber pre-stage can be used to generate pulses through MI, and then the wavelength conversion would be in fiber where the pump wavelength falls in the normal dispersion regime. Although one particular method of wavelength converting light into the mid-infrared regime is suggested, numerous other techniques can be used within the scope of the present disclosure.

Applications of MIRFIL Sources

Several differentiators for the MIRFIL fiber-based sources include: Maturity of underlying technology; for SC, emulate black body radiation or attractive source for spectral fingerprinting or last mile solutions in telecommunications; for wavelength conversion, simple tuning over wide wavelength range Excellent beam quality ($M^2<1.4$, as an example); advantages of fibers, such as compact, robust, lightweight, and no moving parts; potential room temperature operation with flexible repetition rate from CW to MHz or higher; and power scalable to ~10 W or more by using larger core size fibers and higher pump powers.

On this last point, the scalability of the power by pumping with a cladding pumped fiber laser can be quite attractive. As an example, in the last several years the CW power from cladding pumped fiber lasers has increased from 10's of Watts to a time-average power of 15 kW in 2005. Moreover, pumping with a cladding pumped fiber laser could enable an all-fiber integrated MIRFIL. The SC generation or wavelength conversion fibers (whether one, two or more stages) could be coupled to this pump unit using either fusion splicing, mechanical splicing, or free space or bulk optical coupling. Then, the resulting unit could be an all-fiber, high power MIRFIL. As mentioned before, cladding pumped fiber lasers can operate at exemplary wavelengths near 1 microns, 1.55 microns or 2 microns, depending on the dopants in the fiber. Although a particular monolithically integrated MIRFIL is illustrated, many other configurations and pumping techniques can be used within the scope of the present disclosure.

The MIRFIL may be used for applications where light in the mid-IR wavelength range (exemplary 2 to 5 microns) is advantageous. For example, the mid-IR is known as the spectral fingerprint region, because many chemicals have their rotational and vibrational resonances at least in part in the mid-IR wavelength range. Also, the mid-IR can be important for heat sensing, since black body radiation from "hot objects," such as plumes or hot metal, falls at least in part in the mid-IR. Moreover, for applications in the life sciences, laser ablation near 3.6 or 6.45 microns could be advantageous, since the protein and amide group absorption can exceed the water absorption. Also, mid-IR light near the peak of the water absorption could lead to high-resolution photo-acoustic imaging, which can be important for applications such as laser keratectomy. These are exemplary applications of mid-infrared light sources, but many other applications fall within the scope of the present disclosure.

The early adaptors of the MIRFIL laser technology may be in military related markets for chemical sensing and infrared counter-measures (IRCM). However, there are also commercial markets for the same kind of MIRFIL laser units. For example, a similar laser that is used for chemical sensing can be used in the commercial sector for industrial chemical plant control, advanced semiconductor processing, combustion monitoring and bio-medical diagnostics. Similarly, a similar laser that is used for IRCM can be used in the commercial sector for bio-medical laser ablation.

The first application to use the MIRFIL may be chemical sensing systems products. In particular, the wavelengths of IR absorption bands are characteristic of specific types of chemical bonds and every molecule has a unique IR spectrum (fingerprint). IR spectroscopy finds its greatest utility for identification of organic and organo-metallic molecules. There are three IR spectroscopy technologies employed in point detectors: Fourier transform IR (FTIR) spectroscopy, photo-acoustic infrared spectroscopy, and filter based IR spectroscopy.

The SC broadband source could be particularly useful for spectral fingerprinting. In several chemical sensing detection systems, a narrow line width, tunable laser may be used to perform spectral fingerprinting. Instead of this approach, the SC based spectral fingerprinting can be much more like white light spectroscopy. In other words, the SC may permit simultaneous monitoring over a wide spectral range. In one embodiment, the spectra at several wavelengths can be used to advantageously identify a chemical species. In another embodiment for absorption or reflection spectroscopy, several wavelengths of the absorption or reflection can be measured either simultaneously or in some time sequential fashion. Then, the relative magnitudes at different wavelengths or a particular spectral pattern of absorption or reflection can be pattern matched to identify the chemical of interest. Such a technique has the potential of having high selectivity, since the monitoring can be accomplished over a wider spectral range and since the spectral pattern matching can compare a number of features.

An exemplary system 2000 for performing spectral fingerprinting or using the light source is illustrated in FIG. 20. The chemical sensing systems can include a light source 2010, such as the MIRFIL light source, filters, and a lens system to transmit through a sample or sample volume 2030. There may be a reference path 2020 for calibrating the system. In another embodiment, the reference path may substantially coincide with the sample path 2030, but the two can be time multiplexed—i.e., the reference signal may be at a different time than the sample signal. The sample path 2030 can collect the light in transmission or reflection, depending on whether the detector is integrated with the light source or in a different location. The light detection system 2040 collects at least a fraction of the light, and data collection and analysis computer software 2050 may be coupled to the detector and receiver (i.e., electronics behind the detector). As an example, the light detection system 2040 can include a grating and a linear array of mid-IR semiconductor detectors or multi-spectral detectors. Alternately, the detection system 2040 can be a moving grating and slit or a MEMS-based grating followed by a detector. In a preferred embodiment, when a particular wavelength range is being detected, narrow-band detectors or filters followed by detectors could be used to select only the wavelength of interest and reject the noise and signals at other wavelengths. One advantage of the system 2000 of FIG. 20 is that it may lead to non-contact, remote detection of chemical species. In such a system, some of the important issues are the sensitivity and selectivity or interference between the signatures of different chemicals.

Systems such as 2000 can be used for chemical sensing for military applications as well as industrial plant monitoring systems. For example, chemical sensing can be used to detect chemical warfare agents, which are chemical substances that are intended for use in warfare or terrorist activities to harm people through their physiological effects. The most common chemical agents include nerve agents, blister agents and arsenical vesicants. Moreover, chemical sensing can be used for weapons detection, since residue from gun power can be sensed using remote or non-contact optical spectroscopy techniques. In addition, toxic industrial materials are chemicals other than chemical warfare agents that have harmful effects on humans. These are used in a variety of settings such as manufacturing facilities, maintenance areas, and general storage areas.

In one embodiment, the spectral fingerprinting system can be used for firearms detection. For example, firearms detection can be implemented by searching for the composition of gun powder. One chief ingredient in smokeless gun powder is nitro-cellulose, which has clear spectral features centered around 2.86 microns and 3.45 microns. Although there are also lines at 6 microns on beyond, many chemicals have a lot of lines in that wavelength range, so it may be difficult to separate one chemical from another. Beyond nitro-cellulose, there are also a number of additives in smokeless gun powder, an example of which is provided in the table below.

| Component | Function | Typical chemicals |
|---|---|---|
| Plasticizer | Organic materials added to aid fabrication of propellants and explosive mixtures | Dibutyl Phthalate |
| Primer | Initiate the propellant in ammunition | Lead azide<br>Lead styphnate<br>Tetracene<br>Barium nitrate<br>Strontium nitrate |
| Stabilizers | Organic materials that retard decomposition of other constituents during storage | Diphenylamine<br>Ethyl Centralite |
| Propellant | Organic materials that undergo rapid combusion | Nitroglycerin |

Diphenyl amine, which is used extensively as a stabilizer, shows clear spectral signatures centered around 2.94, 3.33 and 3.85 microns. Dibutyl phthalate, which is used as a plasticizer, shows an absorption peak around 3.4 to 3.55 microns. Lead azide, which is used as a primer, has a peak absorption around 4.8 microns. Other examples of primers include tetracene (broad absorption between approximately 2.8 and 4 microns), barium nitrate (absorption peaks near 2.94 and 4.2 microns), and strontium nitrate (absorption peaks around 2.94 and 4.15 microns). Thus, many of the components of smokeless gun powder have signatures in the mid-IR between 2 to 5 microns.

In another embodiment, the spectral fingerprinting system can be used for IED (improvised explosives detection) or weapons detection. Many of the explosives have modified benzene rings, and the benzene rings have a resonance around 3.2 microns. Although there are a lot of absorption lines from 6-10 microns and in the terahertz region, it may be difficult to sort out one chemical from another (i.e., there may be too much interference, leading to poor selectivity). Cleaner, more discrete, signatures are seen in the mid-IR, so although the level of absorption may not be as great, the selectivity may be better. Examples of explosives and their approximate mid-IR lines include the following:

| | |
|---|---|
| PETN (pentaerythritol tetranitrate) | 2.67, 3.57, 4.25 microns |
| RDX (cyclotrimethylenetrinitramine) | 2.9, 3.23 microns |
| TNT | 2.9, 3.23 microns |
| Tetryl (2,4,6-Trinitrophenylmethylnitroamine) | 2.9, 3.23 microns |
| HMX | 2.9, 3.3 microns |
| Ammonium nitrate | broad centered 3.23, microns narrow 4.1 |

There are other applications in chemical sensing for the spectral fingerprinting system as well. For example, the system can be used for drug detection or chemical weapons agent detection. As an illustration, drugs such as cocaine, methamphetamine, MDMA (ecstasy) and heroin have distinct optical spectral signatures in the wavelength range from 2-5 microns. In one embodiment, the use of a broadband source covering a large fraction of the mid-IR between 2 to 5 microns can be used to advantageously detect various drugs. Moreover, many of the chemical weapons agents, such as sarin, cyclosarin, soman, tabun, sulfur mustard, nitrogen mustard, VX and lewisite, have absorption features in the 3 to 4 micron window, particularly centered around 3.3 microns. Thus, non-contact, remote detection of drugs, weapons, firearms, and chemical agents could advantageously be implemented with a spectral fingerprinting system utilizing the SC source.

Beyond chemical sensing, another application for the high power version of the MIRFIL in military and homeland security might be in IRCM, particularly for the commercial air fleet. For instance, much of the black body radiation falls in the wavelength range covered by the SC sources described between ~1 microns and ~4.5 microns. In one embodiment, the SC spectrum could be carved or shaped using spectral filters to resemble the spectrum for hot metal or plume.

Other chemical sensing applications for the SC source or wavelength conversion source include semiconductor process control, combustion monitoring and industrial chemical. For example, the chemicals in the semiconductor growth chamber can be monitored to provide a real time feedback signal to an advanced process control engine. By using the SC, a number of chemical species can even be monitored simultaneously. Examples of chemicals that are relevant for semiconductor processing include monitoring HCl and HBr for plasma etching or monitoring CxFy for gate etching. Alternatively, the chemicals in combustion chamber can be monitored using spectral fingerprinting. Most applications relevant to gas dynamic and combustion flows are based on absorption by low-molecular weight molecules with well resolved transitions—such as $O_2$, $H_2O$, $CO$, $CO_2$, $NO$, $NO_2$, $OH$, $NH_3$, $HF$, $H_2S$, $CH_4$, as particular examples. Because of current limitations arising from a lack of convenient mid-infrared sources, the absorption measurements today for chemical sensing may be performed on overtone and combinational vibrational absorption bands, which typically fall in the near IR where laser diodes are available. However, typical line strengths of these transitions are two or three orders-of-magnitude below the fundamental vibrational transitions in the mid-IR. Therefore, by using SC in the mid-IR wavelength range, a much stronger signal can potentially be obtained by operating at the fundamental wavelength of the transitions.

Another application for the MIRFIL based on SC generation or wavelength conversion is in bio-medical ablation or imaging. As an example, the protein absorption dominates over water absorption between ~3.6 microns and ~4 microns and again near 6.1 microns and 6.45 microns. By using laser ablation in one of these windows, the protein can be denatured (for example, by relying on the amino acid absorption) before boiling the water, thereby resulting in less collateral damage. One example of the value of avoiding the collateral damage could be in cosmetic surgery. For instance, cosmetic surgery is often used to remove wrinkles or unwanted skin or tissue, but discoloration or scars from heating might be undesirable. By denaturing the protein with minimum collateral damage, the unwanted skin or tissue or wrinkles could be removed without scaring or skin discoloration. To achieve the wavelength range of interest, SC generation or wavelength conversion could be used based on 4WM. This is one example of a mid-infrared light source for biomedical applications, but many other configurations can be used within the scope of the present disclosure.

The above example uses mid-IR light in applications at wavelengths where the protein absorption exceeds the water absorption. However, there are several instances where the optimal use of the mid-IR light can be at wavelengths where the water absorption dominates. In a particular embodiment, the mid-IR light can be used at a wavelength of strong water absorption, such as close to 2.9-3.1 microns, so that a short ultrasonic or acoustic wave can be launched for high-resolution ultrasound imaging. The wavelength of strong water can be selected to minimize the absorption length of the mid-IR light in the water. In a preferred embodiment, the pulse width of the mid-IR light is under 100 nsec, under 10 nsec or under 2 nsec. These wavelengths and pulse widths are exemplary, but many other ranges of values can be used.

For the short pulses and absorption lengths, the resulting wave then acts as an acoustic impulse. As an example, one particular embodiment where the acoustic impulses can be beneficial is in precise cornea thickness measurements (pachymetry) made during planning for laser keratectomy. Precise thickness measurements can be obtained with high-frequency ultrasound. The use of optical pulses at wavelengths of high water absorption to create the acoustic pulses lends itself to a non-contact procedure for ultrasonic measurements. On benefit of using an all-optical method to generate the acoustic wave can be that it enables simple integration with laser ablation systems. Thus, measurements and laser ablation can be done in one procedure sequentially without need for moving instruments or patients. More generally, laser-induced ultrasonics operating near the water absorption lines can be used to map out many different materials and biological systems. For these types of application, it could be more advantageous to wavelength conversion based on 4WM, so only a narrow band of wavelengths near the water absorption are generated, rather than the entire SC spectrum.

Another potential application for the SC generation can be to use the MIRFIL in Optical Coherence Tomography (OCT) systems used in bio-medical imaging and diagnostics. Over the past two decades, OCT has been established as a diagnostic technique for minimally invasive, high-resolution, cross-sectional imaging in a variety of medical fields. The OCT system comprises a broadband, low-coherence light source, a fiber-based Michelson interferometer, a sample scanning and positioning stage, and a detector followed by electronics. OCT is analogous to conventional ultrasonic pulse-echo imaging, except that it does not require direct contact with the tissue that is being investigated and it measures echo delay and the intensity of the back-reflected infrared light rather than acoustic waves from internal tissue structures. The light source used in OCT helps to determine the instrument properties in terms of the spectral bandwidth (axial resolution), center wavelength (penetration depth), power density (data acquisition time), cost and size. The SC light source that provides broad bandwidth without using a modelocked laser could lead to micron level resolution for OCT systems without using an expensive light source.

OCT is usually used for biological systems. However, the SC light source could also be advantageously be used with OCT for sub-surface defect detection in semiconductors, ceramics, or other solid state materials. As an illustration, OCT could be used to inspect silicon wafers before they are processed. This could permit sorting of the wafers (i.e., charge a premium for better wafers) and avoiding the cost of processing poor quality wafers. Alternately, OCT could be used to inspect multi-layered structures. By using SC light beyond 1.1 microns, which falls below the bandgap of silicon, the light can penetrate into the chip or wafer. Also, by using longer wavelengths, the scattering loss is reduced. Furthermore, because of the broadband spectrum, the depth resolution of OCT can be at the sub-micron level. Thus, sub-micron to several micron sized defects could be inspected using the SC-light source based OCT.

Typical OCT systems operate point-by-point, which may be too slow for some of the wafer or chip inspection applications. The speed is limited both because imaging is done point-by-point, as well as because one arm of the OCT is moved to achieve the depth resolution. As an alternative, methods used in spectral domain OCT can be used to avoid moving one arm of the interferometer, and by using a line scan the point-by-point scanning could be avoided. As an example, the light from the output of the SC source could be stretched onto a line using a cylindrical lens or an appropriate optical lensing system. The resulting line of light could be split using a beam splitter to a reference arm with a reference mirror or sample and the sample arm. The sample can be located in the sample arm, and the sample can be moved below the light to scan line by line. The return beams from the reference arm and sample arm can be recombined at the beam splitter, and an imaging lens can then be used to image it into a spectrometer. In one particular embodiment, the spectrometer could be dispersive optics, such as a grating or a lens, which could take each point of light and spread it into a spectrum to be detected by a detector array. By processing the multi-spectral data from each spatial point, the location of the reflection from the sample can be detected. Thus, instead of using a movement of the reference arm, the Fourier transform of the interference data may be processed to obtain the height of the reflection.

Yet another application of the SC source is in the so-called "last mile solution" in telecommunications. The last mile solution includes the technologies related to fiber-to-the-X (FTTx), where X can exemplary be home, node, neighborhood, curb, or premise. As one example, the SC source can be an enabling technology for wavelength division multiplexed passive optical networks (lambda-PONS). In a lambda-PONS based FTTx system, each location can receive one or more wavelengths. A challenge for lambda-PONS is the multi-wavelength light source, which may reside at the central office or other telecommunications location. The SC source can advantageously provide a potentially low-cost solution for the multi-wavelength light source.

In one particular embodiment, the SC source can be coupled to one or more modulators and a wavelength division multiplexer to implement the FTTx multi-wavelength light source. As an example, the SC source could advantageously emit wavelengths covering the low loss window in optical fibers, advantageously between 1250 nm and 1750 nm. For this example, the entire SC source could be implemented in fused silica fiber. Then, the output from the SC source can be separated into multiple wavelength channels, using, for example, a wavelength division multiplexer. Each wavelength can then be modulated using a modulator. The modulated wavelength signals can then be combined and coupled to the output fiber for propagation over the FTTx system. In addition, in the FTTx system the power splitters may be replaced with wavelength division multiplexers. Examples of wavelength division multiplexers include arrayed waveguide gratings, waveguide grating routers, dielectric coated beam splitters, and bulk optical gratings.

In another embodiment, the FTTx multi-wavelength light source could comprise a SC source coupled to a dispersive pulse stretcher, one or more high-speed modulators, and a wavelength division multiplexer to separate the wavelengths. Advantageously, the SC source could advantageously emit wavelengths covering the low loss window in optical fibers, particularly between 1250 nm and 1750 nm. The dispersive pulse stretcher can then broaden the SC pulse, spreading the wavelengths so the channels occupy different time slots. The one or more high speed modulators can be used to time sequentially encode the different channels, and then the wavelength division multiplexer is used to separate the wavelength channels in the FTTx system.

Although the present invention has been described in several embodiments, a myriad of changes, variations, alterations, transformations, and modifications may be suggested to one skilled in the art, and it is intended that the present invention encompass such changes, variations, alterations, transformations, and modifications as falling within the spirit and scope of the appended claims.

What is claimed is:

1. An optical system for use in material processing, the system comprising:
    a plurality of semiconductor diodes, each of the diodes configured to generate an optical beam;
    a beam combiner configured to receive at least a portion of the optical beams from the plurality of semiconductor diodes and to generate a multiplexed optical beam; and
    a cladding-pumped fiber amplifier or laser configured to receive at least a portion of the multiplexed optical beam and to form an intermediate beam having at least a first wavelength;
    an optical element configured to receive at least a portion of the intermediate beam and to form an output beam with an output beam wavelength, wherein at least a portion of the output beam wavelength is longer than at least a portion of the first wavelength; and
    a subsystem comprising one or more lenses or mirrors configured to receive a received portion of the output beam and to deliver a delivered portion of the output beam to a sample, wherein the delivered portion of the output beam has a temporal duration greater than approximately 30 picoseconds, wherein the delivered portion of the output beam has a repetition rate between continuous wave and Megahertz or higher, wherein a time averaged output power of the output beam is about 20 mW or more, and wherein a time averaged intensity of the delivered portion of the output beam is less than approximately 50 MW/cm$^2$.

2. The optical system of claim 1, wherein at least a portion of the delivered portion of the output beam is scanned across at least a part of the sample.

3. The optical system of claim 1, wherein at least a portion of the optical element comprises a crystal material or a Raman wavelength shifter.

4. The optical system of claim 1, wherein at least a portion of the sample comprises one or more powdered substances.

5. The optical system of claim 1, wherein at least a portion of the sample comprises a multi-layered structure.

6. The optical system of claim 1, wherein at least a portion of the sample is selected from the group consisting of hydro-carbons, amide groups, plasticizer and benzene rings.

7. An optical system for use in material processing, the system comprising:
    one or more semiconductor diodes configured to generate an input beam, wherein at least a portion of the input beam comprises a wavelength shorter than about 2.5 microns;
    one or more optical amplifiers configured to receive at least the portion of the input beam and to communicate an intermediate beam to an output end of the one or more optical amplifiers; and
    one or more optical fibers configured to receive at least a portion of the intermediate beam and to propagate the at least a portion of the intermediate beam to form at a distal end of the one of more optical fibers a first optical beam having at least a first wavelength;
    a nonlinear element configured to receive at least a portion of the first optical beam and to wavelength shift at least a portion of the first wavelength through a nonlinear effect in the nonlinear element to form an output beam with an output beam wavelength, wherein at least a portion of the output beam wavelength is longer than the at least a portion of the first wavelength; and
    a subsystem comprising one or more lenses or mirrors configured to receive a received portion of the output beam and to deliver a delivered portion of the output beam to a sample, wherein the delivered portion of the output beam has a temporal duration greater than approximately 30 picoseconds, wherein the delivered portion of the output beam has a repetition rate between continuous wave and Megahertz or higher, wherein a time averaged output power of the output beam is about 20 mW or more, and wherein a time averaged intensity of the delivered portion of the output beam is less than approximately 50 MW/cm$^2$.

8. The system of claim 7, wherein at least a portion the one or more optical amplifiers form a cladding-pumped fiber amplifier or laser, and wherein at least a portion of the nonlinear element comprises a crystal material or a Raman wavelength shifter.

9. The system of claim 7, wherein at least a portion of the delivered portion of the output beam is scanned across at least a part of the sample.

10. The system of claim 7, wherein at least a portion of the sample comprises one or more powdered substances.

11. The system of claim 7, wherein at least a portion of the sample is selected from the group consisting of hydro-carbons, amide groups, plasticizer and benzene rings.

12. The system of claim 7, wherein at least a portion of the sample comprises a multi-layered structure.

13. An optical system for use in material processing, the system comprising:
    a plurality of semiconductor diodes, each of the diodes configured to generate an optical beam;
    a beam combiner configured to receive at least a portion of the optical beams from the plurality of semiconductor diodes and to generate a multiplexed optical beam; and
    an optical fiber configured to receive at least a portion of the multiplexed optical beam and to communicate the at least a portion of the multiplexed optical beam to form an intermediate beam;
    a light guide configured to receive at least a portion of the intermediate beam and to propagate the at least a portion of the intermediate beam to form an output beam having at least one wavelength; and
    a subsystem comprising one or more lenses or mirrors configured to receive a received portion of the output beam and to deliver a delivered portion of the output beam to a sample comprising one or more powdered substances, wherein the delivered portion of the output beam has a temporal duration greater than approximately 30 picoseconds, wherein the delivered portion of the output beam has a repetition rate between continuous wave and Megahertz or higher, wherein a time averaged output power of the output beam is about 20 mW or more, and wherein a time averaged intensity of the delivered portion of the output beam is less than approximately 50 MW/cm$^2$.

14. The optical system of claim 13, wherein at least a portion of the output beam wavelength is in a wavelength range between approximately 1700 nm and 1750 nm.

15. The optical system of claim 13, wherein at least a portion of the optical fiber comprises a gain fiber doped with erbium, ytterbium or thulium.

16. The optical system of claim 13, wherein at least a portion of the light guide comprises a Raman wavelength shifter.

17. The optical system of claim 13, wherein at least a portion of the sample comprises one or more multi-layered structures.

18. The optical system of claim 13, wherein at least a portion of the delivered portion of the output beam is scanned across at least a part of the sample.

19. The optical system of claim 13, wherein at least a portion of the sample is selected from the group consisting of hydro-carbons, plasticizers and benzene rings.

20. The optical system of claim 13, wherein at least a portion of the sample comprises one or more amide groups.

\* \* \* \* \*